(12) United States Patent
Adest et al.

(10) Patent No.: US 11,183,969 B2
(45) Date of Patent: Nov. 23, 2021

(54) TESTING OF A PHOTOVOLTAIC PANEL

(71) Applicant: Solaredge Technologies Ltd, Herzeliya (IL)

(72) Inventors: Meir Adest, Modiin (IL); Guy Sella, Bitan Aharon (IL); Lior Handelsman, Givatayim (IL); Yoav Galin, Ra'anana (IL); Amir Fishelov, Tel Aviv (IL); Meir Gazit, Ashkelon (IL); Tzachi Glovinsky, Petah Tikva (IL); Yaron Binder, Shoham (IL)

(73) Assignee: Solaredge Technologies Ltd., Herzeliya (IL)

( * ) Notice: Subject to any disclaimer, the term of this patent is extended or adjusted under 35 U.S.C. 154(b) by 20 days.

(21) Appl. No.: 16/269,403

(22) Filed: Feb. 6, 2019

(65) Prior Publication Data

US 2019/0173424 A1    Jun. 6, 2019

Related U.S. Application Data

(60) Division of application No. 13/015,219, filed on Jan. 27, 2011, which is a continuation-in-part of
(Continued)

(51) Int. Cl.
*H02S 50/10* (2014.01)
*G01R 27/02* (2006.01)
(Continued)

(52) U.S. Cl.
CPC ............ *H02S 50/10* (2014.12); *G01R 27/02* (2013.01); *G01R 31/40* (2013.01);
(Continued)

(58) Field of Classification Search
None
See application file for complete search history.

(56) References Cited

U.S. PATENT DOCUMENTS

| 2,367,925 A | 1/1945 | Brown |
| 2,586,804 A | 2/1952 | Fluke |

(Continued)

FOREIGN PATENT DOCUMENTS

| AU | 2073800 A | 9/2000 |
| AU | 2005262278 A1 | 1/2006 |

(Continued)

OTHER PUBLICATIONS

Mar. 4-8, 2001—Andersen Gert, et al.,—Aalborg University, Institute of Energy Technology, Denmark—"Currect Programmed Control of a Single Phase Two-Switch Buck-Boost Power Factor Correction Circut"—Applied Power Electronics Conference and Exposition, 2001. APEC 2001. Sixteenth Annual IEEE.
(Continued)

*Primary Examiner* — Jermele M Hollington
(74) *Attorney, Agent, or Firm* — Banner & Witcoff, Ltd.

(57) ABSTRACT

A method for testing a photovoltaic panel connected to an electronic module. The electronic module includes an input attached to the photovoltaic panel and a power output. The method activates a bypass to the electronic module. The bypass provides a low impedance path between the input and the output of the electronic module. A current is injected into the electronic module thereby compensating for the presence of the electronic module during the testing. The current may be previously determined by measuring a circuit parameter of the electronic module. The circuit parameter may be impedance, inductance, resistance or capacitance.

20 Claims, 14 Drawing Sheets

Related U.S. Application Data application No. 12/314,115, filed on Dec. 4, 2008, now Pat. No. 8,324,921.

(60) Provisional application No. 61/039,050, filed on Mar. 24, 2008, provisional application No. 60/992,589, filed on Dec. 5, 2007.

(51) Int. Cl.
  *G01R 31/40* (2020.01)
  *H01L 31/02* (2006.01)
  *H02M 3/10* (2006.01)
  *H02M 7/48* (2007.01)

(52) U.S. Cl.
  CPC ........ *H01L 31/02021* (2013.01); *H02M 3/10* (2013.01); *H02M 7/48* (2013.01); *Y02E 10/50* (2013.01)

(56) References Cited

U.S. PATENT DOCUMENTS

| | | |
|---|---|---|
| 2,758,219 A | 8/1956 | Miller |
| 2,852,721 A | 9/1958 | Harders et al. |
| 2,958,171 A | 11/1960 | Deckers |
| 3,369,210 A | 2/1968 | Manickella |
| 3,392,326 A | 7/1968 | Lamberton |
| 3,496,029 A | 2/1970 | King et al. |
| 3,566,143 A | 2/1971 | Paine et al. |
| 3,643,564 A | 2/1972 | Uchiyama |
| 3,696,286 A | 10/1972 | Ule |
| 3,740,652 A | 6/1973 | Burgener |
| 3,958,136 A | 5/1976 | Schroeder |
| 4,060,757 A | 11/1977 | McMurray |
| 4,101,816 A | 7/1978 | Shepter |
| 4,104,687 A | 8/1978 | Zulaski |
| 4,127,797 A | 11/1978 | Perper |
| 4,129,788 A | 12/1978 | Chavannes |
| 4,129,823 A | 12/1978 | van der Pool et al. |
| 4,146,785 A | 3/1979 | Neale |
| 4,161,771 A | 7/1979 | Bates |
| 4,171,861 A | 10/1979 | Hohorst |
| 4,183,079 A | 1/1980 | Wachi |
| 4,257,087 A | 3/1981 | Cuk |
| 4,296,461 A | 10/1981 | Mallory et al. |
| 4,321,581 A | 3/1982 | Tappeiner et al. |
| 4,324,225 A | 4/1982 | Trihey |
| 4,327,318 A | 4/1982 | Kwon et al. |
| 4,346,341 A | 8/1982 | Blackburn et al. |
| 4,363,040 A | 12/1982 | Inose |
| 4,367,557 A | 1/1983 | Stern et al. |
| 4,375,662 A | 3/1983 | Baker |
| 4,384,321 A | 5/1983 | Rippel |
| 4,404,472 A | 9/1983 | Steigerwald |
| 4,412,142 A | 10/1983 | Ragonese et al. |
| 4,452,867 A | 6/1984 | Conforti |
| 4,453,207 A | 6/1984 | Paul |
| 4,460,232 A | 7/1984 | Sotolongo |
| 4,470,213 A | 9/1984 | Thompson |
| 4,479,175 A | 10/1984 | Gille et al. |
| 4,481,654 A | 11/1984 | Daniels et al. |
| 4,488,136 A | 12/1984 | Hansen et al. |
| 4,526,553 A | 7/1985 | Guerrero |
| 4,533,986 A | 8/1985 | Jones |
| 4,545,997 A | 10/1985 | Wong et al. |
| 4,549,254 A | 10/1985 | Kissel |
| 4,554,502 A | 11/1985 | Rohatyn |
| 4,554,515 A | 11/1985 | Burson et al. |
| 4,580,090 A | 4/1986 | Bailey et al. |
| 4,591,965 A | 5/1986 | Dickerson |
| 4,598,330 A | 7/1986 | Woodworth |
| 4,602,322 A | 7/1986 | Merrick |
| 4,604,567 A | 8/1986 | Chetty |
| 4,611,090 A | 9/1986 | Catella et al. |
| 4,623,753 A | 11/1986 | Feldman et al. |
| 4,626,983 A | 12/1986 | Harada et al. |
| 4,631,565 A | 12/1986 | Tihanyi |
| 4,637,677 A | 1/1987 | Barkus |
| 4,639,844 A | 1/1987 | Gallios et al. |
| 4,641,042 A | 2/1987 | Miyazawa |
| 4,641,079 A | 2/1987 | Kato et al. |
| 4,644,458 A | 2/1987 | Harafuji et al. |
| 4,649,334 A | 3/1987 | Nakajima |
| 4,652,770 A | 3/1987 | Kumano |
| 4,683,529 A | 7/1987 | Bucher, II |
| 4,685,040 A | 8/1987 | Steigerwald et al. |
| 4,686,617 A | 8/1987 | Colton |
| 4,706,181 A | 11/1987 | Mercer |
| 4,719,553 A | 1/1988 | Hinckley |
| 4,720,667 A | 1/1988 | Lee et al. |
| 4,720,668 A | 1/1988 | Lee et al. |
| 4,736,151 A | 4/1988 | Dishner |
| 4,746,879 A | 5/1988 | Ma et al. |
| 4,772,994 A | 9/1988 | Harada et al. |
| 4,783,728 A | 11/1988 | Hoffman |
| 4,797,803 A | 1/1989 | Carroll |
| 4,819,121 A | 4/1989 | Saito et al. |
| RE33,057 E | 9/1989 | Clegg et al. |
| 4,864,213 A | 9/1989 | Kido |
| 4,868,379 A | 9/1989 | West |
| 4,873,480 A | 10/1989 | Lafferty |
| 4,888,063 A | 12/1989 | Powell |
| 4,888,702 A | 12/1989 | Gerken et al. |
| 4,899,246 A | 2/1990 | Tripodi |
| 4,899,269 A | 2/1990 | Rouzies |
| 4,903,851 A | 2/1990 | Slough |
| 4,906,859 A | 3/1990 | Kobayashi et al. |
| 4,910,518 A | 3/1990 | Kim et al. |
| 4,951,117 A | 8/1990 | Kasai |
| 4,978,870 A | 12/1990 | Chen et al. |
| 4,987,360 A | 1/1991 | Thompson |
| 5,001,415 A | 3/1991 | Watkinson |
| 5,027,051 A | 6/1991 | Lafferty |
| 5,027,059 A | 6/1991 | de Montgolfier et al. |
| 5,045,988 A | 9/1991 | Gritter et al. |
| 5,081,558 A | 1/1992 | Mahler |
| 5,097,196 A | 3/1992 | Schoneman |
| 5,138,422 A | 8/1992 | Fujii et al. |
| 5,143,556 A | 9/1992 | Matlin |
| 5,144,222 A | 9/1992 | Herbert |
| 5,155,670 A | 10/1992 | Brian |
| 5,191,519 A | 3/1993 | Kawakami |
| 5,196,781 A | 3/1993 | Jamieson et al. |
| 5,210,519 A | 5/1993 | Moore |
| 5,235,266 A | 8/1993 | Schaffrin |
| 5,237,194 A | 8/1993 | Takahashi |
| 5,268,832 A | 12/1993 | Kandatsu |
| 5,280,133 A | 1/1994 | Nath |
| 5,280,232 A | 1/1994 | Kohl et al. |
| 5,287,261 A | 2/1994 | Ehsani |
| 5,289,361 A | 2/1994 | Vinciarelli |
| 5,289,998 A | 3/1994 | Bingley et al. |
| 5,327,071 A | 7/1994 | Frederick et al. |
| 5,329,222 A | 7/1994 | Gyugyi et al. |
| 5,345,375 A | 9/1994 | Mohan |
| 5,379,209 A | 1/1995 | Goff |
| 5,381,327 A | 1/1995 | Yan |
| 5,391,235 A | 2/1995 | Inoue |
| 5,402,060 A | 3/1995 | Erisman |
| 5,404,059 A | 4/1995 | Loffler |
| 5,412,558 A | 5/1995 | Sakurai et al. |
| 5,413,313 A | 5/1995 | Mutterlein et al. |
| 5,428,286 A | 6/1995 | Kha |
| 5,446,645 A | 8/1995 | Shirahama et al. |
| 5,460,546 A | 10/1995 | Kunishi et al. |
| 5,472,614 A | 12/1995 | Rossi |
| 5,493,154 A | 2/1996 | Smith et al. |
| 5,497,289 A | 3/1996 | Sugishima et al. |
| 5,501,083 A | 3/1996 | Kim |
| 5,504,415 A | 4/1996 | Podrazhansky et al. |
| 5,504,418 A | 4/1996 | Ashley |
| 5,504,449 A | 4/1996 | Prentice |
| 5,513,075 A | 4/1996 | Capper et al. |
| 5,517,378 A | 5/1996 | Asplund et al. |

(56) References Cited

U.S. PATENT DOCUMENTS

| | | |
|---|---|---|
| 5,530,335 A | 6/1996 | Decker et al. |
| 5,539,238 A | 7/1996 | Malhi |
| 5,548,504 A | 8/1996 | Takehara |
| 5,563,780 A | 10/1996 | Goad |
| 5,565,855 A | 10/1996 | Knibbe |
| 5,566,022 A | 10/1996 | Segev |
| 5,576,941 A | 11/1996 | Nguyen et al. |
| 5,580,395 A | 12/1996 | Yoshioka et al. |
| 5,585,749 A | 12/1996 | Pace et al. |
| 5,604,430 A | 2/1997 | Decker et al. |
| 5,616,913 A | 4/1997 | Litterst |
| 5,631,534 A | 5/1997 | Lewis |
| 5,636,107 A | 6/1997 | Lu et al. |
| 5,644,212 A | 7/1997 | Takahashi |
| 5,644,219 A | 7/1997 | Kurokawa |
| 5,646,501 A | 7/1997 | Fishman et al. |
| 5,648,731 A | 7/1997 | Decker et al. |
| 5,654,740 A | 8/1997 | Schulha |
| 5,659,465 A | 8/1997 | Flack et al. |
| 5,677,833 A | 10/1997 | Bingley |
| 5,684,385 A | 11/1997 | Guyonneau et al. |
| 5,686,766 A | 11/1997 | Tamechika |
| 5,696,439 A | 12/1997 | Presti et al. |
| 5,703,390 A | 12/1997 | Itoh |
| 5,708,576 A | 1/1998 | Jones et al. |
| 5,719,758 A | 2/1998 | Nakata et al. |
| 5,722,057 A | 2/1998 | Wu |
| 5,726,505 A | 3/1998 | Yamada et al. |
| 5,726,615 A | 3/1998 | Bloom |
| 5,731,603 A | 3/1998 | Nakagawa et al. |
| 5,734,258 A | 3/1998 | Esser |
| 5,734,259 A | 3/1998 | Sisson et al. |
| 5,734,565 A | 3/1998 | Mueller et al. |
| 5,747,967 A | 5/1998 | Muljadi et al. |
| 5,751,120 A | 5/1998 | Zeitler et al. |
| 5,773,963 A | 6/1998 | Blanc et al. |
| 5,777,515 A | 7/1998 | Kimura |
| 5,777,858 A | 7/1998 | Rodulfo |
| 5,780,092 A | 7/1998 | Agbo et al. |
| 5,793,184 A | 8/1998 | O'Connor |
| 5,798,631 A | 8/1998 | Spee et al. |
| 5,801,519 A | 9/1998 | Midya et al. |
| 5,804,894 A | 9/1998 | Leeson et al. |
| 5,812,045 A | 9/1998 | Ishikawa et al. |
| 5,814,970 A | 9/1998 | Schmidt |
| 5,821,734 A | 10/1998 | Faulk |
| 5,822,186 A | 10/1998 | Bull et al. |
| 5,838,148 A | 11/1998 | Kurokami et al. |
| 5,847,549 A | 12/1998 | Dodson, III |
| 5,859,772 A | 1/1999 | Hilpert |
| 5,869,956 A | 2/1999 | Nagao et al. |
| 5,873,738 A | 2/1999 | Shimada et al. |
| 5,886,882 A | 3/1999 | Rodulfo |
| 5,886,890 A | 3/1999 | Ishida et al. |
| 5,892,354 A | 4/1999 | Nagao et al. |
| 5,898,585 A | 4/1999 | Sirichote et al. |
| 5,903,138 A | 5/1999 | Hwang et al. |
| 5,905,645 A | 5/1999 | Cross |
| 5,917,722 A | 6/1999 | Singh |
| 5,919,314 A | 7/1999 | Kim |
| 5,923,100 A | 7/1999 | Lukens et al. |
| 5,923,158 A | 7/1999 | Kurokami et al. |
| 5,929,614 A | 7/1999 | Copple |
| 5,930,128 A | 7/1999 | Dent |
| 5,930,131 A | 7/1999 | Feng |
| 5,932,994 A | 8/1999 | Jo et al. |
| 5,933,327 A | 8/1999 | Leighton et al. |
| 5,945,806 A | 8/1999 | Faulk |
| 5,946,206 A | 8/1999 | Shimizu et al. |
| 5,949,668 A | 9/1999 | Schweighofer |
| 5,955,885 A | 9/1999 | Kurokami et al. |
| 5,959,438 A | 9/1999 | Jovanovic et al. |
| 5,961,739 A | 10/1999 | Osborne |
| 5,963,010 A | 10/1999 | Hayashi et al. |
| 5,963,078 A | 10/1999 | Wallace |
| 5,982,253 A | 11/1999 | Perrin et al. |
| 5,986,909 A | 11/1999 | Hammond et al. |
| 5,990,659 A | 11/1999 | Frannhagen |
| 6,002,290 A | 12/1999 | Avery et al. |
| 6,002,603 A | 12/1999 | Carver |
| 6,008,971 A | 12/1999 | Duba et al. |
| 6,021,052 A | 2/2000 | Unger et al. |
| 6,031,736 A | 2/2000 | Takehara et al. |
| 6,037,720 A | 3/2000 | Wong et al. |
| 6,038,148 A | 3/2000 | Farrington et al. |
| 6,046,470 A | 4/2000 | Williams et al. |
| 6,046,919 A | 4/2000 | Madenokouji et al. |
| 6,050,779 A | 4/2000 | Nagao et al. |
| 6,058,035 A | 5/2000 | Madenokouji et al. |
| 6,064,086 A | 5/2000 | Nakagawa et al. |
| 6,078,511 A | 6/2000 | Fasullo et al. |
| 6,081,104 A | 6/2000 | Kern |
| 6,082,122 A | 7/2000 | Madenokouji et al. |
| 6,087,738 A | 7/2000 | Hammond |
| 6,091,329 A | 7/2000 | Newman |
| 6,093,885 A | 7/2000 | Takehara et al. |
| 6,094,129 A | 7/2000 | Baiatu |
| 6,101,073 A | 8/2000 | Takehara |
| 6,105,317 A | 8/2000 | Tomiuchi et al. |
| 6,111,188 A | 8/2000 | Kurokami et al. |
| 6,111,391 A | 8/2000 | Cullen |
| 6,111,767 A | 8/2000 | Handleman |
| 6,130,458 A | 10/2000 | Takagi et al. |
| 6,150,739 A | 11/2000 | Baumgartl et al. |
| 6,151,234 A | 11/2000 | Oldenkamp |
| 6,163,086 A | 12/2000 | Choo |
| 6,166,455 A | 12/2000 | Li |
| 6,166,527 A | 12/2000 | Dwelley et al. |
| 6,169,678 B1 | 1/2001 | Kondo et al. |
| 6,175,219 B1 | 1/2001 | Imamura et al. |
| 6,175,512 B1 | 1/2001 | Hagihara et al. |
| 6,191,456 B1 | 2/2001 | Stoisiek et al. |
| 6,215,286 B1 | 4/2001 | Scoones et al. |
| 6,219,623 B1 | 4/2001 | Wills |
| 6,225,793 B1 | 5/2001 | Dickmann |
| 6,255,360 B1 | 7/2001 | Domschke et al. |
| 6,255,804 B1 | 7/2001 | Herniter et al. |
| 6,256,234 B1 | 7/2001 | Keeth et al. |
| 6,259,234 B1 | 7/2001 | Perol |
| 6,262,558 B1 | 7/2001 | Weinberg |
| 6,268,559 B1 | 7/2001 | Yamawaki |
| 6,274,804 B1 | 8/2001 | Psyk et al. |
| 6,275,016 B1 | 8/2001 | Ivanov |
| 6,281,485 B1 | 8/2001 | Siri |
| 6,285,572 B1 | 9/2001 | Onizuka et al. |
| 6,292,379 B1 | 9/2001 | Edevold et al. |
| 6,297,621 B1 | 10/2001 | Hui et al. |
| 6,301,128 B1 | 10/2001 | Jang et al. |
| 6,304,065 B1 | 10/2001 | Wittenbreder |
| 6,307,749 B1 | 10/2001 | Daanen et al. |
| 6,311,137 B1 | 10/2001 | Kurokami et al. |
| 6,316,716 B1 | 11/2001 | Hilgrath |
| 6,320,769 B2 | 11/2001 | Kurokami et al. |
| 6,329,808 B1 | 12/2001 | Enguent |
| 6,331,670 B2 | 12/2001 | Takehara et al. |
| 6,339,538 B1 | 1/2002 | Handleman |
| 6,344,612 B1 | 2/2002 | Kuwahara et al. |
| 6,346,451 B1 | 2/2002 | Simpson et al. |
| 6,348,781 B1 | 2/2002 | Midya et al. |
| 6,350,944 B1 | 2/2002 | Sherif et al. |
| 6,351,130 B1 | 2/2002 | Preiser et al. |
| 6,369,461 B1 | 4/2002 | Jungreis et al. |
| 6,369,462 B1 | 4/2002 | Siri |
| 6,380,719 B2 | 4/2002 | Underwood et al. |
| 6,396,170 B1 | 5/2002 | Lautenberg et al. |
| 6,396,239 B1 | 5/2002 | Benn et al. |
| 6,400,579 B2 | 6/2002 | Cuk |
| 6,425,248 B1 | 7/2002 | Tonomura et al. |
| 6,429,546 B1 | 8/2002 | Ropp et al. |
| 6,429,621 B1 | 8/2002 | Arai |
| 6,433,522 B1 | 8/2002 | Siri |
| 6,433,978 B1 | 8/2002 | Neiger et al. |
| 6,441,597 B1 | 8/2002 | Lethellier |
| 6,445,599 B1 | 9/2002 | Nguyen |

(56) References Cited

U.S. PATENT DOCUMENTS

| | | |
|---|---|---|
| 6,448,489 B2 | 9/2002 | Kimura et al. |
| 6,452,814 B1 | 9/2002 | Wittenbreder |
| 6,465,910 B2 | 10/2002 | Young et al. |
| 6,465,931 B2 | 10/2002 | Knowles et al. |
| 6,469,919 B1 | 10/2002 | Bennett |
| 6,472,254 B2 | 10/2002 | Cantarini et al. |
| 6,483,203 B1 | 11/2002 | McCormack |
| 6,493,246 B2 | 12/2002 | Suzui et al. |
| 6,501,362 B1 | 12/2002 | Hoffman et al. |
| 6,507,176 B2 | 1/2003 | Wittenbreder, Jr. |
| 6,509,712 B1 | 1/2003 | Landis |
| 6,512,444 B1 | 1/2003 | Morris, Jr. et al. |
| 6,515,215 B1 | 2/2003 | Mimura |
| 6,519,165 B2 | 2/2003 | Koike |
| 6,528,977 B2 | 3/2003 | Arakawa |
| 6,531,848 B1 | 3/2003 | Chitsazan et al. |
| 6,545,211 B1 | 4/2003 | Mimura |
| 6,548,205 B2 | 4/2003 | Leung et al. |
| 6,560,131 B1 | 5/2003 | vonBrethorst |
| 6,587,051 B2 | 7/2003 | Takehara et al. |
| 6,590,793 B1 | 7/2003 | Nagao et al. |
| 6,590,794 B1 | 7/2003 | Carter |
| 6,593,520 B2 | 7/2003 | Kondo et al. |
| 6,593,521 B2 | 7/2003 | Kobayashi |
| 6,600,100 B2 | 7/2003 | Ho et al. |
| 6,603,672 B1 | 8/2003 | Deng et al. |
| 6,608,468 B2 | 8/2003 | Nagase |
| 6,611,130 B2 | 8/2003 | Chang |
| 6,611,441 B2 | 8/2003 | Kurokami et al. |
| 6,628,011 B2 | 9/2003 | Droppo et al. |
| 6,633,824 B2 | 10/2003 | Dollar, II |
| 6,636,431 B2 | 10/2003 | Seki et al. |
| 6,650,031 B1 | 11/2003 | Goldack |
| 6,650,560 B2 | 11/2003 | MacDonald et al. |
| 6,653,549 B2 | 11/2003 | Matsushita et al. |
| 6,655,987 B2 | 12/2003 | Higashikozono et al. |
| 6,657,419 B2 | 12/2003 | Renyolds |
| 6,664,762 B2 | 12/2003 | Kutkut |
| 6,672,018 B2 | 1/2004 | Shingleton |
| 6,678,174 B2 | 1/2004 | Suzui et al. |
| 6,690,590 B2 | 2/2004 | Stamenic et al. |
| 6,693,327 B2 | 2/2004 | Priefert et al. |
| 6,693,781 B1 | 2/2004 | Kroker |
| 6,709,291 B1 | 3/2004 | Wallace et al. |
| 6,724,593 B1 | 4/2004 | Smith |
| 6,731,136 B2 | 5/2004 | Knee |
| 6,738,692 B2 | 5/2004 | Schienbein et al. |
| 6,744,643 B2 | 6/2004 | Luo et al. |
| 6,750,391 B2 | 6/2004 | Bower et al. |
| 6,765,315 B2 | 7/2004 | Hammerstrom et al. |
| 6,768,047 B2 | 7/2004 | Chang et al. |
| 6,768,180 B2 | 7/2004 | Salama et al. |
| 6,788,033 B2 | 9/2004 | Vinciarelli |
| 6,788,146 B2 | 9/2004 | Forejt et al. |
| 6,795,318 B2 | 9/2004 | Haas et al. |
| 6,800,964 B2 | 10/2004 | Beck |
| 6,801,442 B2 | 10/2004 | Suzui et al. |
| 6,807,069 B2 | 10/2004 | Nieminen et al. |
| 6,809,942 B2 | 10/2004 | Madenokouji et al. |
| 6,810,339 B2 | 10/2004 | Wills |
| 6,812,396 B2 | 11/2004 | Makita et al. |
| 6,828,503 B2 | 12/2004 | Yoshikawa et al. |
| 6,828,901 B2 | 12/2004 | Birchfield et al. |
| 6,837,739 B2 | 1/2005 | Gorringe et al. |
| 6,838,611 B2 | 1/2005 | Kondo et al. |
| 6,838,856 B2 | 1/2005 | Raichle |
| 6,842,354 B1 | 1/2005 | Tallam et al. |
| 6,844,739 B2 | 1/2005 | Kasai et al. |
| 6,850,074 B2 | 2/2005 | Adams et al. |
| 6,856,102 B1 | 2/2005 | Lin et al. |
| 6,882,131 B1 | 4/2005 | Takada et al. |
| 6,888,728 B2 | 5/2005 | Takagi et al. |
| 6,894,911 B2 | 5/2005 | Telefus et al. |
| 6,897,370 B2 | 5/2005 | Kondo et al. |
| 6,914,418 B2 | 7/2005 | Sung |
| 6,919,714 B2 | 7/2005 | Delepaut |
| 6,927,955 B2 | 8/2005 | Suzui et al. |
| 6,933,627 B2 | 8/2005 | Wilhelm |
| 6,933,714 B2 | 8/2005 | Fasshauer et al. |
| 6,936,995 B2 | 8/2005 | Kapsokavathis et al. |
| 6,940,735 B2 | 9/2005 | Deng et al. |
| 6,949,843 B2 | 9/2005 | Dubovsky |
| 6,950,323 B2 | 9/2005 | Achleitner et al. |
| 6,963,147 B2 | 11/2005 | Kurokami et al. |
| 6,966,184 B2 | 11/2005 | Toyomura et al. |
| 6,970,365 B2 | 11/2005 | Turchi |
| 6,980,783 B2 | 12/2005 | Liu et al. |
| 6,984,967 B2 | 1/2006 | Notman |
| 6,984,970 B2 | 1/2006 | Capel |
| 6,987,444 B2 | 1/2006 | Bub et al. |
| 6,996,741 B1 | 2/2006 | Pittelkow et al. |
| 7,030,597 B2 | 4/2006 | Bruno et al. |
| 7,031,176 B2 | 4/2006 | Kotsopoulos et al. |
| 7,038,430 B2 | 5/2006 | Itabashi et al. |
| 7,042,195 B2 | 5/2006 | Tsunetsugu et al. |
| 7,045,991 B2 | 5/2006 | Nakamura et al. |
| 7,046,531 B2 | 5/2006 | Zocchi et al. |
| 7,053,506 B2 | 5/2006 | Alonso et al. |
| 7,061,211 B2 | 6/2006 | Satoh et al. |
| 7,061,214 B2 | 6/2006 | Mayega et al. |
| 7,064,967 B2 | 6/2006 | Ichinose et al. |
| 7,068,017 B2 | 6/2006 | Willner et al. |
| 7,072,194 B2 | 7/2006 | Nayar et al. |
| 7,078,883 B2 | 7/2006 | Chapman et al. |
| 7,079,406 B2 | 7/2006 | Kurokami et al. |
| 7,087,332 B2 | 8/2006 | Harris |
| 7,088,595 B2 | 8/2006 | Nino |
| 7,090,509 B1 | 8/2006 | Gilliland et al. |
| 7,091,707 B2 | 8/2006 | Cutler |
| 7,097,516 B2 | 8/2006 | Werner et al. |
| 7,099,169 B2 | 8/2006 | West et al. |
| 7,126,053 B2 | 10/2006 | Kurokami et al. |
| 7,126,294 B2 | 10/2006 | Minami et al. |
| 7,138,786 B2 | 11/2006 | Ishigaki et al. |
| 7,142,997 B1 | 11/2006 | Widner |
| 7,148,669 B2 | 12/2006 | Maksimovic et al. |
| 7,150,938 B2 | 12/2006 | Munshi et al. |
| 7,157,888 B2 | 1/2007 | Chen et al. |
| 7,158,359 B2 | 1/2007 | Bertele et al. |
| 7,158,395 B2 | 1/2007 | Deng et al. |
| 7,161,082 B2 | 1/2007 | Matsushita et al. |
| 7,174,973 B1 | 2/2007 | Lysaght |
| 7,176,667 B2 | 2/2007 | Chen et al. |
| 7,183,667 B2 | 2/2007 | Colby et al. |
| 7,193,872 B2 | 3/2007 | Siri |
| 7,202,653 B2 | 4/2007 | Pai |
| 7,208,674 B2 | 4/2007 | Aylaian |
| 7,218,541 B2 | 5/2007 | Price et al. |
| 7,248,946 B2 | 7/2007 | Bashaw et al. |
| 7,256,566 B2 | 8/2007 | Bhavaraju et al. |
| 7,259,474 B2 | 8/2007 | Blanc |
| 7,262,979 B2 | 8/2007 | Wai et al. |
| 7,276,886 B2 | 10/2007 | Kinder et al. |
| 7,277,304 B2 | 10/2007 | Stancu et al. |
| 7,281,141 B2 | 10/2007 | Elkayam et al. |
| 7,282,814 B2 | 10/2007 | Jacobs |
| 7,282,924 B1 | 10/2007 | Wittner |
| 7,291,036 B1 | 11/2007 | Daily et al. |
| RE39,976 E | 1/2008 | Schiff et al. |
| 7,315,052 B2 | 1/2008 | Alter |
| 7,319,313 B2 | 1/2008 | Dickerson et al. |
| 7,324,361 B2 | 1/2008 | Siri |
| 7,336,004 B2 | 2/2008 | Lai |
| 7,336,056 B1 | 2/2008 | Dening |
| 7,339,287 B2 | 3/2008 | Jepsen et al. |
| 7,348,802 B2 | 3/2008 | Kasanyal et al. |
| 7,352,154 B2 | 4/2008 | Cook |
| 7,361,952 B2 | 4/2008 | Miura et al. |
| 7,371,963 B2 | 5/2008 | Suenaga et al. |
| 7,372,712 B2 | 5/2008 | Stancu et al. |
| 7,385,380 B2 | 6/2008 | Ishigaki et al. |
| 7,385,833 B2 | 6/2008 | Keung |
| 7,388,348 B2 | 6/2008 | Mattichak |
| 7,391,190 B1 | 6/2008 | Rajagopalan |

(56) References Cited

U.S. PATENT DOCUMENTS

| | | |
|---|---|---|
| 7,394,237 B2 | 7/2008 | Chou et al. |
| 7,405,117 B2 | 7/2008 | Zuniga et al. |
| 7,414,870 B2 | 8/2008 | Rottger et al. |
| 7,420,354 B2 | 9/2008 | Cutler |
| 7,420,815 B2 | 9/2008 | Love |
| 7,432,691 B2 | 10/2008 | Cutler |
| 7,435,134 B2 | 10/2008 | Lenox |
| 7,435,897 B2 | 10/2008 | Russell |
| 7,443,052 B2 | 10/2008 | Wendt et al. |
| 7,443,152 B2 | 10/2008 | Utsunomiya |
| 7,450,401 B2 | 11/2008 | Iida |
| 7,456,510 B2 | 11/2008 | Ito et al. |
| 7,456,523 B2 | 11/2008 | Kobayashi |
| 7,463,500 B2 | 12/2008 | West |
| 7,466,566 B2 | 12/2008 | Fukumoto |
| 7,471,014 B2 | 12/2008 | Lum et al. |
| 7,471,524 B1 | 12/2008 | Batarseh et al. |
| 7,479,774 B2 | 1/2009 | Wai et al. |
| 7,482,238 B2 | 1/2009 | Sung |
| 7,485,987 B2 | 2/2009 | Mori et al. |
| 7,495,419 B1 | 2/2009 | Ju |
| 7,504,811 B2 | 3/2009 | Watanabe et al. |
| 7,518,346 B2 | 4/2009 | Prexl et al. |
| 7,538,451 B2 | 5/2009 | Nomoto |
| 7,560,915 B2 | 7/2009 | Ito et al. |
| 7,589,437 B2 | 9/2009 | Henne et al. |
| 7,595,616 B2 | 9/2009 | Prexl et al. |
| 7,596,008 B2 | 9/2009 | Iwata et al. |
| 7,599,200 B2 | 10/2009 | Tomonaga |
| 7,600,349 B2 | 10/2009 | Liebendorfer |
| 7,602,080 B1 | 10/2009 | Hadar et al. |
| 7,602,626 B2 | 10/2009 | Iwata et al. |
| 7,605,498 B2 | 10/2009 | Ledenev et al. |
| 7,612,283 B2 | 11/2009 | Toyomura et al. |
| 7,615,981 B2 | 11/2009 | Wong et al. |
| 7,626,834 B2 | 12/2009 | Chisenga et al. |
| 7,646,116 B2 | 1/2010 | Batarseh et al. |
| 7,649,434 B2 | 1/2010 | Xu et al. |
| 7,701,083 B2 | 4/2010 | Savage |
| 7,709,727 B2 | 5/2010 | Roehrig et al. |
| 7,719,140 B2 | 5/2010 | Ledenev et al. |
| 7,723,865 B2 | 5/2010 | Kitanaka |
| 7,733,069 B2 | 6/2010 | Toyomura et al. |
| 7,748,175 B2 | 7/2010 | Liebendorfer |
| 7,759,575 B2 | 7/2010 | Jones et al. |
| 7,763,807 B2 | 7/2010 | Richter |
| 7,772,716 B2 | 8/2010 | Shaver, II et al. |
| 7,780,472 B2 | 8/2010 | Lenox |
| 7,782,031 B2 | 8/2010 | Qiu et al. |
| 7,783,389 B2 | 8/2010 | Yamada et al. |
| 7,787,273 B2 | 8/2010 | Lu et al. |
| 7,804,282 B2 | 9/2010 | Bertele |
| 7,807,919 B2 | 10/2010 | Powell et al. |
| 7,808,125 B1 | 10/2010 | Sachdeva et al. |
| 7,812,592 B2 | 10/2010 | Prior et al. |
| 7,812,701 B2 | 10/2010 | Lee et al. |
| 7,821,225 B2 | 10/2010 | Chou et al. |
| 7,824,189 B1 | 11/2010 | Lauermann et al. |
| 7,839,022 B2 | 11/2010 | Wolfs |
| 7,843,085 B2 | 11/2010 | Ledenev et al. |
| 7,864,497 B2 | 1/2011 | Quardt et al. |
| 7,868,599 B2 | 1/2011 | Rahman et al. |
| 7,880,334 B2 | 2/2011 | Evans et al. |
| 7,883,808 B2 | 2/2011 | Norimatsu et al. |
| 7,884,278 B2 | 2/2011 | Powell et al. |
| 7,893,346 B2 | 2/2011 | Nachamkin et al. |
| 7,898,112 B2 | 3/2011 | Powell et al. |
| 7,900,361 B2 | 3/2011 | Adest et al. |
| 7,906,007 B2 | 3/2011 | Gibson et al. |
| 7,906,870 B2 | 3/2011 | Ohm |
| 7,919,952 B1 | 4/2011 | Fahrenbruch |
| 7,919,953 B2 | 4/2011 | Porter et al. |
| 7,925,552 B2 | 4/2011 | Tarbell et al. |
| 7,944,191 B2 | 5/2011 | Xu |
| 7,945,413 B2 | 5/2011 | Krein |
| 7,948,221 B2 | 5/2011 | Watanabe et al. |
| 7,952,897 B2 | 5/2011 | Nocentini et al. |
| 7,960,650 B2 | 6/2011 | Richter et al. |
| 7,960,950 B2 | 6/2011 | Glovinsky |
| 7,969,133 B2 | 6/2011 | Zhang et al. |
| 7,977,810 B2 | 7/2011 | Choi et al. |
| 8,003,885 B2 | 8/2011 | Richter et al. |
| 8,004,113 B2 | 8/2011 | Sander et al. |
| 8,004,116 B2 | 8/2011 | Ledenev et al. |
| 8,004,117 B2 | 8/2011 | Adest et al. |
| 8,004,866 B2 | 8/2011 | Bucella et al. |
| 8,013,472 B2 | 9/2011 | Adest et al. |
| 8,018,748 B2 | 9/2011 | Leonard |
| 8,035,249 B2 | 10/2011 | Shaver, II et al. |
| 8,039,730 B2 | 10/2011 | Hadar et al. |
| 8,049,363 B2 | 11/2011 | McLean et al. |
| 8,050,804 B2 | 11/2011 | Kernahan |
| 8,058,747 B2 | 11/2011 | Avrutsky et al. |
| 8,058,752 B2 | 11/2011 | Erickson, Jr. et al. |
| 8,067,855 B2 | 11/2011 | Mumtaz et al. |
| 8,077,437 B2 | 12/2011 | Mumtaz et al. |
| 8,080,986 B2 | 12/2011 | Lai et al. |
| 8,089,780 B2 | 1/2012 | Mochikawa et al. |
| 8,089,785 B2 | 1/2012 | Rodriguez |
| 8,090,548 B2 | 1/2012 | Abdennadher et al. |
| 8,093,756 B2 | 1/2012 | Porter et al. |
| 8,093,757 B2 | 1/2012 | Wolfs |
| 8,097,818 B2 | 1/2012 | Gerull et al. |
| 8,098,055 B2 | 1/2012 | Avrutsky et al. |
| 8,102,074 B2 | 1/2012 | Hadar et al. |
| 8,102,144 B2 | 1/2012 | Capp et al. |
| 8,111,052 B2 | 2/2012 | Glovinsky |
| 8,116,103 B2 | 2/2012 | Zacharias et al. |
| 8,138,631 B2 | 3/2012 | Allen et al. |
| 8,138,914 B2 | 3/2012 | Wong et al. |
| 8,139,335 B2 | 3/2012 | Quardt et al. |
| 8,139,382 B2 | 3/2012 | Zhang et al. |
| 8,148,849 B2 | 4/2012 | Zanarini et al. |
| 8,158,877 B2 | 4/2012 | Klein et al. |
| 8,169,252 B2 | 5/2012 | Fahrenbruch et al. |
| 8,179,147 B2 | 5/2012 | Dargatz et al. |
| 8,184,460 B2 | 5/2012 | O'Brien et al. |
| 8,188,610 B2 | 5/2012 | Scholte-Wassink |
| 8,204,709 B2 | 6/2012 | Presher, Jr. et al. |
| 8,212,408 B2 | 7/2012 | Fishman |
| 8,212,409 B2 | 7/2012 | Bettenwort et al. |
| 8,248,804 B2 | 8/2012 | Han et al. |
| 8,271,599 B2 | 9/2012 | Eizips et al. |
| 8,274,172 B2 | 9/2012 | Hadar et al. |
| 8,279,644 B2 | 10/2012 | Zhang et al. |
| 8,284,574 B2 | 10/2012 | Chapman et al. |
| 8,289,183 B1 | 10/2012 | Foss |
| 8,289,742 B2 | 10/2012 | Adest et al. |
| 8,294,451 B2 | 10/2012 | Hasenfus |
| 8,299,773 B2 | 10/2012 | Jang et al. |
| 8,304,932 B2 | 11/2012 | Ledenev et al. |
| 8,310,101 B2 | 11/2012 | Amaratunga et al. |
| 8,310,102 B2 | 11/2012 | Raju |
| 8,314,375 B2 | 11/2012 | Arditi et al. |
| 8,324,921 B2 | 12/2012 | Adest et al. |
| 8,325,059 B2 | 12/2012 | Rozenboim |
| 8,344,548 B2 | 1/2013 | Stern |
| 8,369,113 B2 | 2/2013 | Rodriguez |
| 8,378,656 B2 | 2/2013 | de Rooij et al. |
| 8,379,418 B2 | 2/2013 | Falk |
| 8,391,031 B2 | 3/2013 | Garrity |
| 8,391,032 B2 | 3/2013 | Garrity et al. |
| 8,395,366 B2 | 3/2013 | Uno |
| 8,405,248 B2 | 3/2013 | Mumtaz et al. |
| 8,405,349 B2 | 3/2013 | Kikinis et al. |
| 8,405,367 B2 | 3/2013 | Chisenga et al. |
| 8,410,359 B2 | 4/2013 | Richter |
| 8,410,889 B2 | 4/2013 | Garrity et al. |
| 8,410,950 B2 | 4/2013 | Takehara et al. |
| 8,415,552 B2 | 4/2013 | Hadar et al. |
| 8,415,937 B2 | 4/2013 | Hester |
| 8,427,009 B2 | 4/2013 | Shaver, II et al. |
| 8,436,592 B2 | 5/2013 | Saitoh |
| 8,461,809 B2 | 6/2013 | Rodriguez |

(56) References Cited

U.S. PATENT DOCUMENTS

| | | |
|---|---|---|
| 8,466,789 B2 | 6/2013 | Muhlberger et al. |
| 8,472,220 B2 | 6/2013 | Garrity et al. |
| 8,473,250 B2 | 6/2013 | Adest et al. |
| 8,509,032 B2 | 8/2013 | Rakib |
| 8,526,205 B2 | 9/2013 | Garrity |
| 8,531,055 B2 | 9/2013 | Adest et al. |
| 8,542,512 B2 | 9/2013 | Garrity |
| 8,570,017 B2 | 10/2013 | Perichon et al. |
| 8,581,441 B2 | 11/2013 | Rotzoll et al. |
| 8,587,151 B2 | 11/2013 | Adest et al. |
| 8,618,692 B2 | 12/2013 | Adest et al. |
| 8,624,443 B2 | 1/2014 | Mumtaz |
| 8,653,689 B2 | 2/2014 | Rozenboim |
| 8,669,675 B2 | 3/2014 | Capp et al. |
| 8,670,255 B2 | 3/2014 | Gong et al. |
| 8,674,548 B2 | 3/2014 | Mumtaz |
| 8,674,668 B2 | 3/2014 | Chisenga et al. |
| 8,686,333 B2 | 4/2014 | Arditi et al. |
| 8,710,351 B2 | 4/2014 | Robbins |
| 8,751,053 B2 | 6/2014 | Hadar et al. |
| 8,773,236 B2 | 7/2014 | Makhota et al. |
| 8,791,598 B2 | 7/2014 | Jain |
| 8,809,699 B2 | 8/2014 | Funk |
| 8,811,047 B2 | 8/2014 | Rodriguez |
| 8,816,535 B2 | 8/2014 | Adest et al. |
| 8,823,212 B2 | 9/2014 | Garrity et al. |
| 8,823,218 B2 | 9/2014 | Hadar et al. |
| 8,823,342 B2 | 9/2014 | Williams |
| 8,835,748 B2 | 9/2014 | Frolov et al. |
| 8,841,916 B2 | 9/2014 | Avrutsky |
| 8,853,886 B2 | 10/2014 | Avrutsky et al. |
| 8,854,193 B2 | 10/2014 | Makhota et al. |
| 8,859,884 B2 | 10/2014 | Dunton et al. |
| 8,860,241 B2 | 10/2014 | Hadar et al. |
| 8,860,246 B2 | 10/2014 | Hadar et al. |
| 8,878,563 B2 | 11/2014 | Robbins |
| 8,917,156 B2 | 12/2014 | Garrity et al. |
| 8,922,061 B2 | 12/2014 | Arditi |
| 8,933,321 B2 | 1/2015 | Hadar et al. |
| 8,934,269 B2 | 1/2015 | Garrity |
| 8,963,375 B2 | 2/2015 | DeGraaff |
| 8,963,378 B1 | 2/2015 | Fornage et al. |
| 8,972,765 B1 | 3/2015 | Krolak et al. |
| 9,130,401 B2 | 9/2015 | Adest et al. |
| 9,257,848 B2 | 2/2016 | Coccia et al. |
| 9,291,696 B2 | 3/2016 | Adest et al. |
| 9,362,743 B2 | 6/2016 | Gazit et al. |
| 9,397,497 B2 | 7/2016 | Ledenev |
| 9,401,664 B2 | 7/2016 | Perreault et al. |
| 9,407,161 B2 | 8/2016 | Adest et al. |
| 9,466,737 B2 | 10/2016 | Ledenev |
| 9,647,442 B2 | 5/2017 | Yoscovich et al. |
| 9,660,527 B2 | 5/2017 | Glovinski |
| 9,673,630 B2 | 6/2017 | Ledenev et al. |
| 9,819,178 B2 | 11/2017 | Gazit et al. |
| 9,831,916 B2 | 11/2017 | Behrends |
| 9,843,193 B2 | 12/2017 | Getsla |
| 9,923,516 B2 | 3/2018 | Har-Shai et al. |
| 9,991,717 B1 | 6/2018 | Rowe et al. |
| 10,032,939 B2 | 7/2018 | Ledenev et al. |
| 10,608,553 B2* | 3/2020 | Yoscovich ............. H02J 3/385 |
| 10,673,229 B2* | 6/2020 | Yoscovich ............. H02J 3/38 |
| 10,931,119 B2* | 2/2021 | Har-Shai ........... H01L 31/02021 |
| 11,031,861 B2* | 6/2021 | Adest ................. H02J 3/38 |
| 2001/0000957 A1 | 5/2001 | Birchfield et al. |
| 2001/0023703 A1 | 9/2001 | Kondo et al. |
| 2001/0032664 A1 | 10/2001 | Takehara et al. |
| 2001/0034982 A1 | 11/2001 | Nagao et al. |
| 2001/0035180 A1 | 11/2001 | Kimura et al. |
| 2001/0048605 A1 | 12/2001 | Kurokami et al. |
| 2001/0050102 A1 | 12/2001 | Matsumi et al. |
| 2001/0054881 A1 | 12/2001 | Watanabe |
| 2002/0002040 A1 | 1/2002 | Kline et al. |
| 2002/0014262 A1 | 2/2002 | Matsushita et al. |
| 2002/0017900 A1 | 2/2002 | Takeda et al. |
| 2002/0034083 A1 | 3/2002 | Ayyanar et al. |
| 2002/0038667 A1 | 4/2002 | Kondo et al. |
| 2002/0041505 A1 | 4/2002 | Suzui et al. |
| 2002/0044473 A1 | 4/2002 | Toyomura et al. |
| 2002/0047309 A1 | 4/2002 | Droppo et al. |
| 2002/0047693 A1 | 4/2002 | Chang |
| 2002/0056089 A1 | 5/2002 | Houston |
| 2002/0063552 A1 | 5/2002 | Arakawa |
| 2002/0063625 A1 | 5/2002 | Takehara et al. |
| 2002/0078991 A1 | 6/2002 | Nagao et al. |
| 2002/0080027 A1 | 6/2002 | Conley |
| 2002/0085397 A1 | 7/2002 | Suzui et al. |
| 2002/0105765 A1 | 8/2002 | Kondo et al. |
| 2002/0113689 A1 | 8/2002 | Gehlot et al. |
| 2002/0118559 A1 | 8/2002 | Kurokami et al. |
| 2002/0134567 A1 | 9/2002 | Rasmussen et al. |
| 2002/0148497 A1 | 10/2002 | Sasaoka et al. |
| 2002/0149950 A1 | 10/2002 | Takebayashi |
| 2002/0162585 A1 | 11/2002 | Sugawara et al. |
| 2002/0165458 A1 | 11/2002 | Carter et al. |
| 2002/0177401 A1 | 11/2002 | Judd et al. |
| 2002/0179140 A1 | 12/2002 | Toyomura |
| 2002/0180408 A1 | 12/2002 | McDaniel et al. |
| 2002/0190696 A1 | 12/2002 | Darshan |
| 2003/0002303 A1 | 1/2003 | Riggio et al. |
| 2003/0025594 A1 | 2/2003 | Akiyama et al. |
| 2003/0038615 A1 | 2/2003 | Elbanhawy |
| 2003/0047207 A1 | 3/2003 | Aylaian |
| 2003/0058593 A1 | 3/2003 | Bertele et al. |
| 2003/0058662 A1 | 3/2003 | Baudelot et al. |
| 2003/0066076 A1 | 4/2003 | Minahan |
| 2003/0066555 A1 | 4/2003 | Hui et al. |
| 2003/0075211 A1 | 4/2003 | Makita et al. |
| 2003/0080741 A1 | 5/2003 | LeRow et al. |
| 2003/0085621 A1 | 5/2003 | Potega |
| 2003/0090233 A1 | 5/2003 | Browe |
| 2003/0090246 A1 | 5/2003 | Shenai et al. |
| 2003/0094931 A1 | 5/2003 | Renyolds |
| 2003/0107352 A1 | 6/2003 | Downer et al. |
| 2003/0111103 A1 | 6/2003 | Bower et al. |
| 2003/0116154 A1 | 6/2003 | Butler et al. |
| 2003/0121514 A1 | 7/2003 | Davenport et al. |
| 2003/0140960 A1 | 7/2003 | Baum et al. |
| 2003/0156439 A1 | 8/2003 | Ohmichi et al. |
| 2003/0164695 A1 | 9/2003 | Fasshauer et al. |
| 2003/0185026 A1 | 10/2003 | Matsuda et al. |
| 2003/0193821 A1 | 10/2003 | Krieger et al. |
| 2003/0201674 A1 | 10/2003 | Droppo et al. |
| 2003/0214274 A1 | 11/2003 | Lethellier |
| 2003/0223257 A1 | 12/2003 | Onoe |
| 2004/0004402 A1 | 1/2004 | Kippley |
| 2004/0027112 A1 | 2/2004 | Kondo et al. |
| 2004/0041548 A1 | 3/2004 | Perry |
| 2004/0056642 A1 | 3/2004 | Nebrigic et al. |
| 2004/0056768 A1 | 3/2004 | Matsushita et al. |
| 2004/0061527 A1 | 4/2004 | Knee |
| 2004/0076028 A1 | 4/2004 | Achleitner et al. |
| 2004/0117676 A1 | 6/2004 | Kobayashi et al. |
| 2004/0118446 A1 | 6/2004 | Toyomura |
| 2004/0123894 A1 | 7/2004 | Erban |
| 2004/0124816 A1 | 7/2004 | DeLepaut |
| 2004/0125618 A1 | 7/2004 | De Rooij et al. |
| 2004/0140719 A1 | 7/2004 | Vulih et al. |
| 2004/0141345 A1 | 7/2004 | Cheng et al. |
| 2004/0144043 A1 | 7/2004 | Stevenson et al. |
| 2004/0150410 A1 | 8/2004 | Schoepf et al. |
| 2004/0164718 A1 | 8/2004 | McDaniel et al. |
| 2004/0165408 A1 | 8/2004 | West et al. |
| 2004/0167676 A1 | 8/2004 | Mizumaki |
| 2004/0169499 A1 | 9/2004 | Huang et al. |
| 2004/0170038 A1 | 9/2004 | Ichinose et al. |
| 2004/0189090 A1 | 9/2004 | Yanagida et al. |
| 2004/0189432 A1 | 9/2004 | Yan et al. |
| 2004/0201279 A1 | 10/2004 | Templeton |
| 2004/0201933 A1 | 10/2004 | Blanc |
| 2004/0207366 A1 | 10/2004 | Sung |
| 2004/0211458 A1 | 10/2004 | Gui et al. |
| 2004/0213169 A1 | 10/2004 | Allard et al. |
| 2004/0223351 A1 | 11/2004 | Kurokami et al. |

(56) References Cited

U.S. PATENT DOCUMENTS

| | | |
|---|---|---|
| 2004/0230343 A1 | 11/2004 | Zalesski |
| 2004/0233685 A1 | 11/2004 | Matsuo et al. |
| 2004/0246226 A1 | 12/2004 | Moon |
| 2004/0255999 A1 | 12/2004 | Matsushita et al. |
| 2004/0258141 A1 | 12/2004 | Tustison et al. |
| 2004/0262998 A1 | 12/2004 | Kunow et al. |
| 2004/0263119 A1 | 12/2004 | Meyer et al. |
| 2004/0263183 A1 | 12/2004 | Naidu et al. |
| 2004/0264225 A1 | 12/2004 | Bhavaraju et al. |
| 2005/0002214 A1 | 1/2005 | Deng et al. |
| 2005/0005785 A1 | 1/2005 | Poss et al. |
| 2005/0006958 A1 | 1/2005 | Dubovsky |
| 2005/0017697 A1 | 1/2005 | Capel |
| 2005/0017701 A1 | 1/2005 | Hsu |
| 2005/0030772 A1 | 2/2005 | Phadke |
| 2005/0040800 A1 | 2/2005 | Sutardja |
| 2005/0041442 A1 | 2/2005 | Balakrishnan |
| 2005/0057214 A1 | 3/2005 | Matan |
| 2005/0057215 A1 | 3/2005 | Matan |
| 2005/0068012 A1 | 3/2005 | Cutler |
| 2005/0068820 A1 | 3/2005 | Radosevich et al. |
| 2005/0077879 A1 | 4/2005 | Near |
| 2005/0099138 A1 | 5/2005 | Wilhelm |
| 2005/0103376 A1 | 5/2005 | Matsushita et al. |
| 2005/0105224 A1 | 5/2005 | Nishi |
| 2005/0105306 A1 | 5/2005 | Deng et al. |
| 2005/0109386 A1 | 5/2005 | Marshall |
| 2005/0110454 A1 | 5/2005 | Tsai et al. |
| 2005/0121067 A1 | 6/2005 | Toyomura et al. |
| 2005/0135031 A1 | 6/2005 | Colby et al. |
| 2005/0139258 A1 | 6/2005 | Liu et al. |
| 2005/0140335 A1 | 6/2005 | Lee et al. |
| 2005/0162018 A1 | 7/2005 | Realmuto et al. |
| 2005/0163063 A1 | 7/2005 | Kuchler et al. |
| 2005/0172995 A1 | 8/2005 | Rohrig et al. |
| 2005/0179420 A1 | 8/2005 | Satoh et al. |
| 2005/0194937 A1 | 9/2005 | Jacobs |
| 2005/0201397 A1 | 9/2005 | Petite |
| 2005/0213272 A1 | 9/2005 | Kobayashi |
| 2005/0218876 A1 | 10/2005 | Nino |
| 2005/0225090 A1 | 10/2005 | Wobben |
| 2005/0226017 A1 | 10/2005 | Kotsopoulos et al. |
| 2005/0242795 A1 | 11/2005 | Al-Kuran et al. |
| 2005/0257827 A1 | 11/2005 | Gaudiana et al. |
| 2005/0269988 A1 | 12/2005 | Thrap |
| 2005/0275386 A1 | 12/2005 | Jepsen et al. |
| 2005/0275527 A1 | 12/2005 | Kates |
| 2005/0275979 A1 | 12/2005 | Xu |
| 2005/0281064 A1 | 12/2005 | Olsen et al. |
| 2005/0287402 A1 | 12/2005 | Maly et al. |
| 2006/0001406 A1 | 1/2006 | Matan |
| 2006/0017327 A1 | 1/2006 | Siri et al. |
| 2006/0034106 A1 | 2/2006 | Johnson |
| 2006/0038692 A1 | 2/2006 | Schnetker |
| 2006/0043792 A1 | 3/2006 | Hjort et al. |
| 2006/0043942 A1 | 3/2006 | Cohen |
| 2006/0053447 A1 | 3/2006 | Krzyzanowski et al. |
| 2006/0066349 A1 | 3/2006 | Murakami |
| 2006/0068239 A1 | 3/2006 | Norimatsu et al. |
| 2006/0077046 A1 | 4/2006 | Endo |
| 2006/0103360 A9 | 5/2006 | Cutler |
| 2006/0108979 A1 | 5/2006 | Daniel et al. |
| 2006/0109009 A1 | 5/2006 | Banke et al. |
| 2006/0113843 A1 | 6/2006 | Beveridge |
| 2006/0113979 A1 | 6/2006 | Ishigaki et al. |
| 2006/0116968 A1 | 6/2006 | Arisawa |
| 2006/0118162 A1 | 6/2006 | Saelzer et al. |
| 2006/0125449 A1 | 6/2006 | Unger |
| 2006/0132102 A1 | 6/2006 | Harvey |
| 2006/0149396 A1 | 7/2006 | Templeton |
| 2006/0152085 A1 | 7/2006 | Flett et al. |
| 2006/0162772 A1 | 7/2006 | Presher et al. |
| 2006/0163946 A1 | 7/2006 | Henne et al. |
| 2006/0164065 A1 | 7/2006 | Hoouk et al. |
| 2006/0171182 A1 | 8/2006 | Siri et al. |
| 2006/0174939 A1 | 8/2006 | Matan |
| 2006/0176029 A1 | 8/2006 | McGinty et al. |
| 2006/0176031 A1 | 8/2006 | Forman et al. |
| 2006/0176036 A1 | 8/2006 | Flatness et al. |
| 2006/0176716 A1 | 8/2006 | Balakrishnan et al. |
| 2006/0185727 A1 | 8/2006 | Matan |
| 2006/0192540 A1 | 8/2006 | Balakrishnan et al. |
| 2006/0208660 A1 | 9/2006 | Shinmura et al. |
| 2006/0222916 A1 | 10/2006 | Norimatsu et al. |
| 2006/0225781 A1 | 10/2006 | Locher |
| 2006/0227577 A1 | 10/2006 | Horiuchi et al. |
| 2006/0227578 A1 | 10/2006 | Datta et al. |
| 2006/0231132 A1 | 10/2006 | Neussner |
| 2006/0232220 A1 | 10/2006 | Melis |
| 2006/0235717 A1 | 10/2006 | Sharma et al. |
| 2006/0237058 A1 | 10/2006 | McClintock et al. |
| 2006/0261751 A1 | 11/2006 | Okabe et al. |
| 2006/0266408 A1 | 11/2006 | Horne et al. |
| 2006/0267515 A1 | 11/2006 | Burke et al. |
| 2006/0290317 A1 | 12/2006 | McNulty et al. |
| 2007/0001653 A1 | 1/2007 | Xu |
| 2007/0013349 A1 | 1/2007 | Bassett |
| 2007/0019613 A1 | 1/2007 | Frezzolini |
| 2007/0024257 A1 | 2/2007 | Boldo |
| 2007/0027644 A1 | 2/2007 | Bettenwort et al. |
| 2007/0029636 A1 | 2/2007 | Kanemaru et al. |
| 2007/0030068 A1 | 2/2007 | Motonobu et al. |
| 2007/0035975 A1 | 2/2007 | Dickerson et al. |
| 2007/0040540 A1 | 2/2007 | Cutler |
| 2007/0044837 A1 | 3/2007 | Simburger et al. |
| 2007/0075689 A1 | 4/2007 | Kinder et al. |
| 2007/0075711 A1 | 4/2007 | Blanc et al. |
| 2007/0081364 A1 | 4/2007 | Andreycak |
| 2007/0085523 A1 | 4/2007 | Scoones et al. |
| 2007/0089778 A1 | 4/2007 | Horne et al. |
| 2007/0103108 A1 | 5/2007 | Capp et al. |
| 2007/0107767 A1 | 5/2007 | Hayden et al. |
| 2007/0115635 A1 | 5/2007 | Low et al. |
| 2007/0119718 A1 | 5/2007 | Gibson et al. |
| 2007/0121648 A1 | 5/2007 | Hahn |
| 2007/0133241 A1 | 6/2007 | Mumtaz et al. |
| 2007/0133421 A1 | 6/2007 | Young |
| 2007/0147075 A1 | 6/2007 | Bang |
| 2007/0158185 A1 | 7/2007 | Andelman et al. |
| 2007/0159866 A1 | 7/2007 | Siri |
| 2007/0164612 A1 | 7/2007 | Wendt et al. |
| 2007/0164750 A1 | 7/2007 | Chen et al. |
| 2007/0165347 A1 | 7/2007 | Wendt et al. |
| 2007/0205778 A1 | 9/2007 | Fabbro et al. |
| 2007/0209656 A1 | 9/2007 | Lee |
| 2007/0211888 A1 | 9/2007 | Corcoran et al. |
| 2007/0223165 A1 | 9/2007 | Itri et al. |
| 2007/0227574 A1 | 10/2007 | Cart |
| 2007/0235071 A1 | 10/2007 | Work et al. |
| 2007/0236187 A1 | 10/2007 | Wai et al. |
| 2007/0241720 A1 | 10/2007 | Sakamoto et al. |
| 2007/0246546 A1 | 10/2007 | Yoshida |
| 2007/0247135 A1 | 10/2007 | Koga |
| 2007/0247877 A1 | 10/2007 | Kwon et al. |
| 2007/0271006 A1 | 11/2007 | Golden et al. |
| 2007/0273339 A1 | 11/2007 | Haines |
| 2007/0273342 A1 | 11/2007 | Kataoka et al. |
| 2007/0273351 A1 | 11/2007 | Matan |
| 2007/0284451 A1 | 12/2007 | Uramoto |
| 2007/0290636 A1 | 12/2007 | Beck et al. |
| 2007/0290656 A1 | 12/2007 | Lee Tai Keung |
| 2008/0021707 A1 | 1/2008 | Bou-Ghazale et al. |
| 2008/0023061 A1 | 1/2008 | Clemens et al. |
| 2008/0024098 A1 | 1/2008 | Hojo |
| 2008/0036440 A1 | 2/2008 | Garmer |
| 2008/0055941 A1 | 3/2008 | Victor et al. |
| 2008/0080177 A1 | 4/2008 | Chang |
| 2008/0088184 A1 | 4/2008 | Tung et al. |
| 2008/0089277 A1 | 4/2008 | Alexander et al. |
| 2008/0097655 A1 | 4/2008 | Hadar et al. |
| 2008/0106250 A1 | 5/2008 | Prior et al. |
| 2008/0111529 A1 | 5/2008 | Shah et al. |
| 2008/0115823 A1 | 5/2008 | Kinsey |
| 2008/0121272 A1 | 5/2008 | Besser et al. |

(56) References Cited

U.S. PATENT DOCUMENTS

| | | |
|---|---|---|
| 2008/0122449 A1 | 5/2008 | Besser et al. |
| 2008/0122518 A1 | 5/2008 | Besser et al. |
| 2008/0136367 A1 | 6/2008 | Adest et al. |
| 2008/0142071 A1 | 6/2008 | Dorn et al. |
| 2008/0143188 A1* | 6/2008 | Adest ............... H02J 3/383 307/82 |
| 2008/0143462 A1 | 6/2008 | Belisle et al. |
| 2008/0144294 A1 | 6/2008 | Adest et al. |
| 2008/0147335 A1 | 6/2008 | Adest et al. |
| 2008/0149167 A1 | 6/2008 | Liu |
| 2008/0150366 A1 | 6/2008 | Adest et al. |
| 2008/0150484 A1 | 6/2008 | Kimball et al. |
| 2008/0164766 A1* | 7/2008 | Adest ............... H02J 1/12 307/80 |
| 2008/0179949 A1 | 7/2008 | Besser et al. |
| 2008/0186004 A1 | 8/2008 | Williams |
| 2008/0191560 A1 | 8/2008 | Besser et al. |
| 2008/0191675 A1 | 8/2008 | Besser et al. |
| 2008/0192510 A1 | 8/2008 | Falk |
| 2008/0192519 A1 | 8/2008 | Iwata et al. |
| 2008/0198523 A1 | 8/2008 | Schmidt et al. |
| 2008/0205096 A1 | 8/2008 | Lai et al. |
| 2008/0218152 A1 | 9/2008 | Bo |
| 2008/0224652 A1 | 9/2008 | Zhu et al. |
| 2008/0236647 A1 | 10/2008 | Gibson et al. |
| 2008/0236648 A1 | 10/2008 | Klein et al. |
| 2008/0238195 A1 | 10/2008 | Shaver et al. |
| 2008/0238372 A1 | 10/2008 | Cintra et al. |
| 2008/0246460 A1 | 10/2008 | Smith |
| 2008/0246463 A1 | 10/2008 | Sinton et al. |
| 2008/0252273 A1 | 10/2008 | Woo et al. |
| 2008/0264470 A1 | 10/2008 | Masuda et al. |
| 2008/0266913 A1 | 10/2008 | Brotto et al. |
| 2008/0266919 A1 | 10/2008 | Mallwitz |
| 2008/0291707 A1 | 11/2008 | Fang |
| 2008/0294472 A1 | 11/2008 | Yamada |
| 2008/0297963 A1 | 12/2008 | Lee et al. |
| 2008/0298608 A1 | 12/2008 | Wilcox |
| 2008/0303503 A1 | 12/2008 | Wolfs |
| 2008/0304296 A1 | 12/2008 | NadimpalliRaju et al. |
| 2008/0304298 A1 | 12/2008 | Toba et al. |
| 2009/0012917 A1 | 1/2009 | Thompson et al. |
| 2009/0014050 A1 | 1/2009 | Haaf |
| 2009/0014057 A1 | 1/2009 | Croft et al. |
| 2009/0014058 A1 | 1/2009 | Croft et al. |
| 2009/0015071 A1 | 1/2009 | Iwata et al. |
| 2009/0020151 A1 | 1/2009 | Fornage |
| 2009/0021877 A1 | 1/2009 | Fornage et al. |
| 2009/0039852 A1 | 2/2009 | Fishelov et al. |
| 2009/0064252 A1 | 3/2009 | Howarter et al. |
| 2009/0066357 A1 | 3/2009 | Fornage |
| 2009/0066399 A1 | 3/2009 | Chen et al. |
| 2009/0069950 A1 | 3/2009 | Kurokami et al. |
| 2009/0073726 A1 | 3/2009 | Babcock |
| 2009/0078300 A1 | 3/2009 | Ang et al. |
| 2009/0080226 A1 | 3/2009 | Fornage |
| 2009/0084570 A1 | 4/2009 | Gherardini et al. |
| 2009/0097172 A1 | 4/2009 | Bremicker et al. |
| 2009/0101191 A1 | 4/2009 | Beck et al. |
| 2009/0102440 A1 | 4/2009 | Coles |
| 2009/0114263 A1 | 5/2009 | Powell et al. |
| 2009/0120485 A1 | 5/2009 | Kikinis |
| 2009/0121549 A1 | 5/2009 | Leonard |
| 2009/0133736 A1 | 5/2009 | Powell et al. |
| 2009/0140715 A1 | 6/2009 | Adest et al. |
| 2009/0141522 A1 | 6/2009 | Adest et al. |
| 2009/0145480 A1 | 6/2009 | Adest et al. |
| 2009/0146667 A1 | 6/2009 | Adest et al. |
| 2009/0146671 A1 | 6/2009 | Gazit |
| 2009/0147554 A1 | 6/2009 | Adest et al. |
| 2009/0150005 A1 | 6/2009 | Hadar et al. |
| 2009/0160258 A1 | 6/2009 | Allen et al. |
| 2009/0179500 A1 | 7/2009 | Ragonese et al. |
| 2009/0179662 A1 | 7/2009 | Moulton et al. |
| 2009/0182532 A1 | 7/2009 | Stoeber et al. |
| 2009/0184746 A1 | 7/2009 | Fahrenbruch |
| 2009/0189456 A1 | 7/2009 | Skutt |
| 2009/0190275 A1 | 7/2009 | Gilmore et al. |
| 2009/0195081 A1 | 8/2009 | Quardt et al. |
| 2009/0206666 A1* | 8/2009 | Sella ............... H02J 1/102 307/43 |
| 2009/0207543 A1 | 8/2009 | Boniface et al. |
| 2009/0217965 A1 | 9/2009 | Dougal et al. |
| 2009/0224817 A1 | 9/2009 | Nakamura et al. |
| 2009/0234692 A1 | 9/2009 | Powell et al. |
| 2009/0237042 A1 | 9/2009 | Glovinski |
| 2009/0237043 A1 | 9/2009 | Glovinsky |
| 2009/0242011 A1 | 10/2009 | Proisy et al. |
| 2009/0243547 A1 | 10/2009 | Andelfinger |
| 2009/0273241 A1 | 11/2009 | Gazit et al. |
| 2009/0278496 A1 | 11/2009 | Nakao et al. |
| 2009/0282755 A1 | 11/2009 | Abbott et al. |
| 2009/0283129 A1 | 11/2009 | Foss |
| 2009/0283130 A1 | 11/2009 | Gilmore et al. |
| 2009/0284232 A1 | 11/2009 | Zhang et al. |
| 2009/0284998 A1 | 11/2009 | Zhang et al. |
| 2009/0295225 A1 | 12/2009 | Asplund et al. |
| 2009/0322494 A1 | 12/2009 | Lee |
| 2009/0325003 A1 | 12/2009 | Aberle et al. |
| 2010/0001587 A1 | 1/2010 | Casey et al. |
| 2010/0002349 A1 | 1/2010 | La Scala et al. |
| 2010/0013452 A1 | 1/2010 | Tang et al. |
| 2010/0020576 A1 | 1/2010 | Falk |
| 2010/0026097 A1 | 2/2010 | Avrutsky et al. |
| 2010/0026736 A1 | 2/2010 | Plut |
| 2010/0038907 A1 | 2/2010 | Hunt et al. |
| 2010/0052735 A1 | 3/2010 | Burkland et al. |
| 2010/0057267 A1 | 3/2010 | Liu et al. |
| 2010/0060000 A1 | 3/2010 | Scholte-Wassink |
| 2010/0071742 A1 | 3/2010 | de Rooij et al. |
| 2010/0085670 A1 | 4/2010 | Palaniswami et al. |
| 2010/0115093 A1 | 5/2010 | Rice |
| 2010/0124027 A1 | 5/2010 | Handelsman et al. |
| 2010/0124087 A1 | 5/2010 | Falk |
| 2010/0126550 A1 | 5/2010 | Foss |
| 2010/0127570 A1 | 5/2010 | Hadar et al. |
| 2010/0127571 A1 | 5/2010 | Hadar et al. |
| 2010/0132757 A1 | 6/2010 | He et al. |
| 2010/0132758 A1 | 6/2010 | Gilmore |
| 2010/0132761 A1 | 6/2010 | Echizenya et al. |
| 2010/0133911 A1 | 6/2010 | Williams et al. |
| 2010/0139734 A1 | 6/2010 | Hadar et al. |
| 2010/0139743 A1 | 6/2010 | Hadar et al. |
| 2010/0141041 A1 | 6/2010 | Bose et al. |
| 2010/0141153 A1 | 6/2010 | Recker et al. |
| 2010/0147362 A1 | 6/2010 | King et al. |
| 2010/0154858 A1 | 6/2010 | Jain |
| 2010/0176773 A1 | 7/2010 | Capel |
| 2010/0181957 A1 | 7/2010 | Goeltner |
| 2010/0191383 A1 | 7/2010 | Gaul |
| 2010/0195357 A1 | 8/2010 | Fornage et al. |
| 2010/0195361 A1 | 8/2010 | Stem |
| 2010/0206378 A1 | 8/2010 | Erickson, Jr. et al. |
| 2010/0207764 A1 | 8/2010 | Muhlberger et al. |
| 2010/0207770 A1 | 8/2010 | Thiemann |
| 2010/0208501 A1 | 8/2010 | Matan et al. |
| 2010/0213897 A1 | 8/2010 | Tse |
| 2010/0214808 A1 | 8/2010 | Rodriguez |
| 2010/0217551 A1 | 8/2010 | Goff et al. |
| 2010/0229915 A1 | 9/2010 | Ledenev et al. |
| 2010/0241375 A1 | 9/2010 | Kumar et al. |
| 2010/0244575 A1 | 9/2010 | Coccia et al. |
| 2010/0246223 A1 | 9/2010 | Xuan |
| 2010/0264736 A1 | 10/2010 | Mumtaz et al. |
| 2010/0269430 A1 | 10/2010 | Haddock |
| 2010/0277001 A1 | 11/2010 | Wagoner |
| 2010/0282290 A1 | 11/2010 | Schwarze et al. |
| 2010/0286836 A1 | 11/2010 | Shaver, II et al. |
| 2010/0288327 A1* | 11/2010 | Lisi ............... H01L 31/02021 136/244 |
| 2010/0289337 A1 | 11/2010 | Stauth et al. |
| 2010/0294528 A1 | 11/2010 | Sella et al. |
| 2010/0294903 A1 | 11/2010 | Shmukler et al. |
| 2010/0295680 A1 | 11/2010 | Dumps |

(56) References Cited

U.S. PATENT DOCUMENTS

| | | |
|---|---|---|
| 2010/0297860 A1 | 11/2010 | Shmukler et al. |
| 2010/0301991 A1 | 12/2010 | Sella et al. |
| 2010/0308662 A1 | 12/2010 | Schatz et al. |
| 2010/0309692 A1 | 12/2010 | Chisenga et al. |
| 2010/0321148 A1 | 12/2010 | Gevorkian |
| 2010/0326809 A1 | 12/2010 | Lang et al. |
| 2010/0327657 A1 | 12/2010 | Kuran |
| 2010/0327659 A1 | 12/2010 | Lisi et al. |
| 2010/0332047 A1 | 12/2010 | Arditi et al. |
| 2011/0006743 A1 | 1/2011 | Fabbro |
| 2011/0012430 A1 | 1/2011 | Cheng et al. |
| 2011/0019444 A1 | 1/2011 | Dargatz et al. |
| 2011/0025130 A1 | 2/2011 | Hadar et al. |
| 2011/0031816 A1 | 2/2011 | Buthker et al. |
| 2011/0031946 A1 | 2/2011 | Egan et al. |
| 2011/0037600 A1 | 2/2011 | Takehara et al. |
| 2011/0043172 A1 | 2/2011 | Dearn |
| 2011/0045802 A1 | 2/2011 | Bland et al. |
| 2011/0049990 A1 | 3/2011 | Amaratunga et al. |
| 2011/0050002 A1 | 3/2011 | De Luca |
| 2011/0050190 A1 | 3/2011 | Avrutsky |
| 2011/0056533 A1 | 3/2011 | Kuan |
| 2011/0061705 A1 | 3/2011 | Croft et al. |
| 2011/0061713 A1 | 3/2011 | Powell et al. |
| 2011/0062784 A1 | 3/2011 | Wolfs |
| 2011/0068633 A1 | 3/2011 | Quardt et al. |
| 2011/0079263 A1 | 4/2011 | Avrutsky |
| 2011/0080147 A1 | 4/2011 | Schoenlinner et al. |
| 2011/0083733 A1 | 4/2011 | Marroquin et al. |
| 2011/0084553 A1 | 4/2011 | Adest et al. |
| 2011/0108087 A1 | 5/2011 | Croft et al. |
| 2011/0114154 A1 | 5/2011 | Lichy et al. |
| 2011/0115295 A1 | 5/2011 | Moon et al. |
| 2011/0121652 A1 | 5/2011 | Sella et al. |
| 2011/0125431 A1 | 5/2011 | Adest et al. |
| 2011/0132424 A1 | 6/2011 | Rakib |
| 2011/0133552 A1 | 6/2011 | Binder et al. |
| 2011/0139213 A1 | 6/2011 | Lee |
| 2011/0140536 A1 | 6/2011 | Adest et al. |
| 2011/0141644 A1 | 6/2011 | Hastings et al. |
| 2011/0161722 A1 | 6/2011 | Makhota et al. |
| 2011/0172842 A1 | 7/2011 | Makhota et al. |
| 2011/0173276 A1 | 7/2011 | Eizips et al. |
| 2011/0181251 A1 | 7/2011 | Porter et al. |
| 2011/0181340 A1 | 7/2011 | Gazit |
| 2011/0198935 A1 | 8/2011 | Hinman et al. |
| 2011/0210610 A1 | 9/2011 | Mitsuoka et al. |
| 2011/0210611 A1 | 9/2011 | Ledenev et al. |
| 2011/0210612 A1 | 9/2011 | Leutwein |
| 2011/0218687 A1 | 9/2011 | Hadar et al. |
| 2011/0227411 A1 | 9/2011 | Arditi |
| 2011/0232714 A1 | 9/2011 | Bhavaraju et al. |
| 2011/0240100 A1 | 10/2011 | Lu et al. |
| 2011/0245989 A1 | 10/2011 | Makhota et al. |
| 2011/0246338 A1 | 10/2011 | Eich |
| 2011/0254372 A1 | 10/2011 | Haines et al. |
| 2011/0260866 A1 | 10/2011 | Avrutsky et al. |
| 2011/0267859 A1 | 11/2011 | Chapman |
| 2011/0271611 A1 | 11/2011 | Maracci et al. |
| 2011/0273015 A1 | 11/2011 | Adest et al. |
| 2011/0273016 A1 | 11/2011 | Adest et al. |
| 2011/0273017 A1 | 11/2011 | Borup et al. |
| 2011/0273302 A1 | 11/2011 | Fornage et al. |
| 2011/0278955 A1 | 11/2011 | Signorelli et al. |
| 2011/0285205 A1 | 11/2011 | Ledenev et al. |
| 2011/0290317 A1 | 12/2011 | Naumovitz et al. |
| 2011/0291486 A1 | 12/2011 | Adest et al. |
| 2011/0298288 A1 | 12/2011 | Cho et al. |
| 2011/0301772 A1 | 12/2011 | Zuercher et al. |
| 2011/0304204 A1 | 12/2011 | Avrutsky et al. |
| 2011/0304213 A1 | 12/2011 | Avrutsky et al. |
| 2011/0304215 A1 | 12/2011 | Avrutsky et al. |
| 2011/0316346 A1 | 12/2011 | Porter et al. |
| 2012/0007613 A1 | 1/2012 | Gazit |
| 2012/0019966 A1 | 1/2012 | DeBoer |
| 2012/0026763 A1 | 2/2012 | Humphrey et al. |
| 2012/0026769 A1 | 2/2012 | Schroeder et al. |
| 2012/0032515 A1 | 2/2012 | Ledenev et al. |
| 2012/0033392 A1 | 2/2012 | Golubovic et al. |
| 2012/0033463 A1 | 2/2012 | Rodriguez |
| 2012/0039099 A1 | 2/2012 | Rodriguez |
| 2012/0042588 A1 | 2/2012 | Erickson, Jr. |
| 2012/0043818 A1 | 2/2012 | Stratakos et al. |
| 2012/0043823 A1 | 2/2012 | Stratakos et al. |
| 2012/0044014 A1 | 2/2012 | Stratakos et al. |
| 2012/0044717 A1 | 2/2012 | Suntio et al. |
| 2012/0048325 A1 | 3/2012 | Matsuo et al. |
| 2012/0049627 A1 | 3/2012 | Matsuo et al. |
| 2012/0049801 A1 | 3/2012 | Chang |
| 2012/0056483 A1 | 3/2012 | Capp et al. |
| 2012/0063177 A1 | 3/2012 | Garrity |
| 2012/0080943 A1 | 4/2012 | Phadke |
| 2012/0081009 A1 | 4/2012 | Shteynberg et al. |
| 2012/0081933 A1 | 4/2012 | Garrity |
| 2012/0081934 A1 | 4/2012 | Garrity et al. |
| 2012/0081937 A1 | 4/2012 | Phadke |
| 2012/0087159 A1 | 4/2012 | Chapman et al. |
| 2012/0091810 A1 | 4/2012 | Aiello et al. |
| 2012/0091817 A1 | 4/2012 | Seymour et al. |
| 2012/0098344 A1 | 4/2012 | Bergveld et al. |
| 2012/0104861 A1 | 5/2012 | Kojori et al. |
| 2012/0104863 A1 | 5/2012 | Yuan |
| 2012/0113554 A1 | 5/2012 | Paoletti et al. |
| 2012/0119584 A1 | 5/2012 | Hadar et al. |
| 2012/0127764 A1 | 5/2012 | Phadke et al. |
| 2012/0133372 A1 | 5/2012 | Tsai et al. |
| 2012/0134058 A1 | 5/2012 | Pamer et al. |
| 2012/0138123 A1 | 6/2012 | Newdoll et al. |
| 2012/0139343 A1 | 6/2012 | Adest et al. |
| 2012/0146420 A1 | 6/2012 | Wolfs |
| 2012/0146583 A1 | 6/2012 | Gaul et al. |
| 2012/0161526 A1 | 6/2012 | Huang et al. |
| 2012/0161528 A1 | 6/2012 | Mumtaz et al. |
| 2012/0169124 A1 | 7/2012 | Nakashima et al. |
| 2012/0174961 A1 | 7/2012 | Larson et al. |
| 2012/0175961 A1 | 7/2012 | Har-Shai et al. |
| 2012/0175963 A1 | 7/2012 | Adest et al. |
| 2012/0187769 A1 | 7/2012 | Spannhake et al. |
| 2012/0194003 A1 | 8/2012 | Schmidt et al. |
| 2012/0199172 A1 | 8/2012 | Avrutsky |
| 2012/0200311 A1 | 8/2012 | Chaintreuil |
| 2012/0212066 A1 | 8/2012 | Adest et al. |
| 2012/0215367 A1 | 8/2012 | Eizips et al. |
| 2012/0217973 A1 | 8/2012 | Avrutsky |
| 2012/0240490 A1 | 9/2012 | Gangemi |
| 2012/0253533 A1 | 10/2012 | Eizips et al. |
| 2012/0253541 A1 | 10/2012 | Arditi et al. |
| 2012/0255591 A1 | 10/2012 | Arditi et al. |
| 2012/0268969 A1 | 10/2012 | Cuk |
| 2012/0271576 A1 | 10/2012 | Kamel et al. |
| 2012/0274145 A1 | 11/2012 | Taddeo |
| 2012/0274264 A1 | 11/2012 | Mun et al. |
| 2012/0280571 A1 | 11/2012 | Hargis |
| 2012/0299380 A1 | 11/2012 | Haupt |
| 2013/0002335 A1 | 1/2013 | DeGraaff |
| 2013/0026839 A1 | 1/2013 | Grana |
| 2013/0026840 A1 | 1/2013 | Arditi et al. |
| 2013/0026842 A1 | 1/2013 | Arditi et al. |
| 2013/0026843 A1 | 1/2013 | Arditi et al. |
| 2013/0038124 A1 | 2/2013 | Newdoll et al. |
| 2013/0039028 A1 | 2/2013 | Korman et al. |
| 2013/0049710 A1 | 2/2013 | Kraft et al. |
| 2013/0062958 A1 | 3/2013 | Erickson, Jr. et al. |
| 2013/0063119 A1 | 3/2013 | Lubomirsky |
| 2013/0082724 A1 | 4/2013 | Noda et al. |
| 2013/0094112 A1 | 4/2013 | Burghardt et al. |
| 2013/0094262 A1 | 4/2013 | Avrutsky |
| 2013/0134790 A1 | 5/2013 | Amaratunga et al. |
| 2013/0181533 A1 | 7/2013 | Capp et al. |
| 2013/0192657 A1 | 8/2013 | Hadar et al. |
| 2013/0193765 A1 | 8/2013 | Yoscovich |
| 2013/0194706 A1 | 8/2013 | Har-Shai et al. |
| 2013/0214607 A1 | 8/2013 | Harrison |
| 2013/0222144 A1 | 8/2013 | Hadar et al. |

(56) References Cited

U.S. PATENT DOCUMENTS

| | | |
|---|---|---|
| 2013/0229834 A1 | 9/2013 | Garrity et al. |
| 2013/0229842 A1 | 9/2013 | Garrity |
| 2013/0234518 A1 | 9/2013 | Mumtaz et al. |
| 2013/0235637 A1 | 9/2013 | Rodriguez |
| 2013/0269181 A1 | 10/2013 | McBride et al. |
| 2013/0279210 A1 | 10/2013 | Chisenga et al. |
| 2013/0285459 A1 | 10/2013 | Jaoui et al. |
| 2013/0294126 A1 | 11/2013 | Garrity et al. |
| 2013/0307556 A1 | 11/2013 | Ledenev et al. |
| 2013/0313909 A1 | 11/2013 | Storbeck et al. |
| 2013/0320778 A1 | 12/2013 | Hopf et al. |
| 2013/0321013 A1 | 12/2013 | Pisklak et al. |
| 2013/0332093 A1 | 12/2013 | Adest et al. |
| 2013/0335861 A1 | 12/2013 | Laschinski et al. |
| 2014/0062206 A1 | 3/2014 | Bryson |
| 2014/0077756 A1 | 3/2014 | Kataoka et al. |
| 2014/0097808 A1 | 4/2014 | Clark et al. |
| 2014/0119076 A1 | 5/2014 | Chang et al. |
| 2014/0167715 A1 | 6/2014 | Wu et al. |
| 2014/0191583 A1 | 7/2014 | Chisenga et al. |
| 2014/0233136 A1 | 8/2014 | Heerdt |
| 2014/0246915 A1 | 9/2014 | Mumtaz |
| 2014/0246927 A1 | 9/2014 | Mumtaz |
| 2014/0252859 A1 | 9/2014 | Chisenga et al. |
| 2014/0265551 A1 | 9/2014 | Willis |
| 2014/0265579 A1 | 9/2014 | Mumtaz |
| 2014/0265629 A1 | 9/2014 | Gazit et al. |
| 2014/0265638 A1 | 9/2014 | Orr et al. |
| 2014/0293491 A1 | 10/2014 | Robbins |
| 2014/0306543 A1 | 10/2014 | Garrity et al. |
| 2014/0327313 A1 | 11/2014 | Arditi et al. |
| 2014/0327995 A1 | 11/2014 | Panjwani et al. |
| 2014/0354245 A1 | 12/2014 | Batikoff et al. |
| 2015/0022006 A1 | 1/2015 | Garrity et al. |
| 2015/0028683 A1 | 1/2015 | Hadar et al. |
| 2015/0028692 A1 | 1/2015 | Makhota et al. |
| 2015/0061409 A1 | 3/2015 | Dunton et al. |
| 2015/0131187 A1 | 5/2015 | Krein et al. |
| 2015/0188415 A1 | 7/2015 | Abido et al. |
| 2015/0263609 A1 | 9/2015 | Weida et al. |
| 2015/0318410 A1 | 11/2015 | Higuma |
| 2015/0364918 A1 | 12/2015 | Singh et al. |
| 2015/0372490 A1 | 12/2015 | Bakas et al. |
| 2015/0381108 A1 | 12/2015 | Hoft et al. |
| 2015/0381111 A1 | 12/2015 | Nicolescu et al. |
| 2016/0006392 A1 | 1/2016 | Hoft |
| 2016/0036235 A1 | 2/2016 | Getsla |
| 2016/0126367 A1 | 5/2016 | Dunton et al. |
| 2016/0172900 A1 | 6/2016 | Welch, Jr. |
| 2016/0211841 A1 | 7/2016 | Harrison |
| 2016/0226252 A1 | 8/2016 | Kravtiz et al. |
| 2016/0226257 A1 | 8/2016 | Porter et al. |
| 2016/0241039 A1 | 8/2016 | Cheng et al. |
| 2016/0254672 A1* | 9/2016 | Yoscovich ............... H02J 3/385 307/77 |
| 2016/0268809 A1 | 9/2016 | Ledenev et al. |
| 2016/0276820 A1 | 9/2016 | Olivas et al. |
| 2016/0329715 A1 | 11/2016 | Orr et al. |
| 2016/0336899 A1 | 11/2016 | Ledenev et al. |
| 2016/0380436 A1 | 12/2016 | Porter et al. |
| 2017/0184343 A1 | 6/2017 | Freer et al. |
| 2017/0207746 A1 | 7/2017 | Yoscovich et al. |
| 2017/0271879 A1 | 9/2017 | Ledenev et al. |
| 2017/0278375 A1 | 9/2017 | Galin et al. |
| 2017/0331325 A1 | 11/2017 | Ristau |
| 2018/0145593 A1 | 5/2018 | Xi et al. |
| 2018/0191292 A1 | 7/2018 | Ehlmann |
| 2019/0326854 A1* | 10/2019 | Adest .................... G01R 31/40 |
| 2019/0379279 A1 | 12/2019 | Adest et al. |

FOREIGN PATENT DOCUMENTS

| | | | |
|---|---|---|---|
| AU | 2012225199 | A1 | 10/2013 |
| CA | 1183574 | A | 3/1985 |
| CA | 2063243 | A1 | 12/1991 |
| CA | 2301657 | A1 | 3/1999 |
| CA | 2394761 | A1 | 6/2001 |
| CA | 2658087 | A1 | 6/2001 |
| CA | 2443450 | A1 | 3/2005 |
| CA | 2572452 | A1 | 1/2006 |
| CA | 2613038 | A1 | 1/2007 |
| CA | 2704605 | A1 | 5/2009 |
| CA | 2702392 | C | 9/2015 |
| CN | 2071396 | U | 2/1991 |
| CN | 1106523 | A | 8/1995 |
| CN | 2284479 | Y | 6/1998 |
| CN | 1188453 | A | 7/1998 |
| CN | 2305016 | Y | 1/1999 |
| CN | 1236213 | A | 11/1999 |
| CN | 1244745 | A | 2/2000 |
| CN | 1262552 | A | 8/2000 |
| CN | 1064487 | C | 4/2001 |
| CN | 1309451 | A | 8/2001 |
| CN | 1362655 | A | 8/2002 |
| CN | 2514538 | Y | 10/2002 |
| CN | 1122905 | C | 10/2003 |
| CN | 2579063 | Y | 10/2003 |
| CN | 1474492 | A | 2/2004 |
| CN | 1523726 | A | 8/2004 |
| CN | 1551377 | A | 12/2004 |
| CN | 1185782 | C | 1/2005 |
| CN | 2672938 | Y | 1/2005 |
| CN | 1588773 | A | 3/2005 |
| CN | 1201157 | C | 5/2005 |
| CN | 1614854 | A | 5/2005 |
| CN | 2706955 | Y | 6/2005 |
| CN | 1245795 | C | 3/2006 |
| CN | 1787717 | A | 6/2006 |
| CN | 1794537 | A | 6/2006 |
| CN | 1838191 | A | 9/2006 |
| CN | 1841254 | A | 10/2006 |
| CN | 1841823 | A | 10/2006 |
| CN | 1892239 | A | 1/2007 |
| CN | 1902809 | A | 1/2007 |
| CN | 1929276 | A | 3/2007 |
| CN | 1930925 | A | 3/2007 |
| CN | 1933315 | A | 3/2007 |
| CN | 2891438 | Y | 4/2007 |
| CN | 101030752 | A | 9/2007 |
| CN | 101050770 | A | 10/2007 |
| CN | 101107712 | A | 1/2008 |
| CN | 100371843 | C | 2/2008 |
| CN | 101128974 | A | 2/2008 |
| CN | 101136129 | A | 3/2008 |
| CN | 101180781 | A | 5/2008 |
| CN | 101257221 | A | 9/2008 |
| CN | 100426175 | C | 10/2008 |
| CN | 201167381 | Y | 12/2008 |
| CN | 201203438 | Y | 3/2009 |
| CN | 101488271 | A | 7/2009 |
| CN | 101521459 | A | 9/2009 |
| CN | 101523230 | A | 9/2009 |
| CN | 101647172 | A | 2/2010 |
| CN | 101672252 | A | 3/2010 |
| CN | 101697462 | A | 4/2010 |
| CN | 101779291 | A | 7/2010 |
| CN | 101847939 | A | 9/2010 |
| CN | 201601477 | U | 10/2010 |
| CN | 201623478 | U | 11/2010 |
| CN | 101902051 | A | 12/2010 |
| CN | 101904015 | A | 12/2010 |
| CN | 201663167 | U | 12/2010 |
| CN | 101939660 | A | 1/2011 |
| CN | 101951011 | A | 1/2011 |
| CN | 101951190 | A | 1/2011 |
| CN | 101953051 | A | 1/2011 |
| CN | 101953060 | A | 1/2011 |
| CN | 101976855 | A | 2/2011 |
| CN | 101976952 | A | 2/2011 |
| CN | 101980409 | A | 2/2011 |
| CN | 102084584 | A | 6/2011 |
| CN | 102089883 | A | 6/2011 |
| CN | 102148584 | A | 8/2011 |

(56) References Cited

FOREIGN PATENT DOCUMENTS

| | | |
|---|---|---|
| CN | 201926948 U | 8/2011 |
| CN | 201956938 U | 8/2011 |
| CN | 202034903 U | 11/2011 |
| CN | 102273039 A | 12/2011 |
| CN | 202103601 U | 1/2012 |
| CN | 102362550 A | 2/2012 |
| CN | 202178274 U | 3/2012 |
| CN | 102474112 A | 5/2012 |
| CN | 102771017 A | 11/2012 |
| CN | 202871823 U | 4/2013 |
| CN | 203367304 U | 12/2013 |
| DE | 1161639 B | 1/1964 |
| DE | 3236071 A1 | 1/1984 |
| DE | 3525630 A1 | 1/1987 |
| DE | 3729000 A1 | 3/1989 |
| DE | 4019710 A1 | 1/1992 |
| DE | 4032569 A1 | 4/1992 |
| DE | 4041672 A1 | 6/1992 |
| DE | 9312710 U1 | 10/1993 |
| DE | 4232356 A1 | 3/1994 |
| DE | 4325436 A1 | 2/1995 |
| DE | 4328511 A1 | 3/1995 |
| DE | 19515786 A1 | 11/1995 |
| DE | 19502762 A1 | 8/1996 |
| DE | 19614861 A1 | 7/1997 |
| DE | 19609189 A1 | 9/1997 |
| DE | 19618882 A1 | 11/1997 |
| DE | 19701897 A1 | 7/1998 |
| DE | 19718046 A1 | 11/1998 |
| DE | 19732218 C1 | 3/1999 |
| DE | 19737286 A1 | 3/1999 |
| DE | 19838230 A1 | 2/2000 |
| DE | 19846818 A1 | 4/2000 |
| DE | 19859732 A1 | 6/2000 |
| DE | 19904561 C1 | 8/2000 |
| DE | 19928809 A1 | 1/2001 |
| DE | 019937410 A1 | 2/2001 |
| DE | 19961705 A1 | 7/2001 |
| DE | 10064039 A1 | 12/2001 |
| DE | 10060108 A1 | 6/2002 |
| DE | 10103431 A1 | 8/2002 |
| DE | 10136147 A1 | 2/2003 |
| DE | 10219956 A1 | 4/2003 |
| DE | 10222621 A1 | 11/2003 |
| DE | 202004001246 U1 | 4/2004 |
| DE | 10345302 A1 | 4/2005 |
| DE | 102004043478 A1 | 4/2005 |
| DE | 102004053942 A1 | 5/2006 |
| DE | 102004037446 A1 | 6/2006 |
| DE | 69734495 T2 | 7/2006 |
| DE | 69735169 T2 | 8/2006 |
| DE | 102005012213 A1 | 8/2006 |
| DE | 102005018173 A1 | 10/2006 |
| DE | 20 2005 020161 U1 | 11/2006 |
| DE | 102005036153 A1 | 12/2006 |
| DE | 102005030907 A1 | 1/2007 |
| DE | 102005032864 A1 | 1/2007 |
| DE | 102006023563 A1 | 11/2007 |
| DE | 102006026073 A1 | 12/2007 |
| DE | 202007002077 U1 | 4/2008 |
| DE | 102006060815 A1 | 6/2008 |
| DE | 602004011201 T2 | 12/2008 |
| DE | 102007051134 A1 | 3/2009 |
| DE | 202008012345 U1 | 3/2009 |
| DE | 102007037130 B3 | 4/2009 |
| DE | 102007050031 B3 | 4/2009 |
| DE | 202009007318 U1 | 8/2009 |
| DE | 102008042199 A1 | 4/2010 |
| DE | 102008057874 A1 | 5/2010 |
| DE | 102009051186 A1 | 5/2010 |
| DE | 102009022569 A1 | 12/2010 |
| DE | 102010023549 A1 | 12/2011 |
| DE | 102013101314 A1 | 8/2014 |
| DE | 102013106255 A1 | 12/2014 |
| DE | 102013106808 A1 | 12/2014 |
| EP | 0027405 A1 | 4/1981 |
| EP | 169673 A1 | 1/1986 |
| EP | 0178757 A2 | 4/1986 |
| EP | 0206253 A1 | 12/1986 |
| EP | 0231211 A1 | 8/1987 |
| EP | 0293219 A2 | 11/1988 |
| EP | 0340006 A2 | 11/1989 |
| EP | 0418612 A1 | 3/1991 |
| EP | 419093 A2 | 3/1991 |
| EP | 420295 A1 | 4/1991 |
| EP | 0521467 A2 | 1/1993 |
| EP | 0576271 A2 | 12/1993 |
| EP | 0577334 A2 | 1/1994 |
| EP | 604777 A1 | 7/1994 |
| EP | 0628901 A2 | 12/1994 |
| EP | 0642199 A1 | 3/1995 |
| EP | 653692 A2 | 5/1995 |
| EP | 0670915 A1 | 9/1995 |
| EP | 677749 A2 | 10/1995 |
| EP | 0677749 A3 | 1/1996 |
| EP | 756178 A2 | 1/1997 |
| EP | 0756372 A1 | 1/1997 |
| EP | 0780750 A2 | 6/1997 |
| EP | 0809293 A1 | 11/1997 |
| EP | 824273 A2 | 2/1998 |
| EP | 827254 A2 | 3/1998 |
| EP | 0895146 A1 | 2/1999 |
| EP | 0906660 A1 | 4/1999 |
| EP | 0947905 A2 | 10/1999 |
| EP | 964415 A1 | 12/1999 |
| EP | 964457 A2 | 12/1999 |
| EP | 0978884 A3 | 3/2000 |
| EP | 1012886 A1 | 6/2000 |
| EP | 1024575 A2 | 8/2000 |
| EP | 1034465 A1 | 9/2000 |
| EP | 1035640 A1 | 9/2000 |
| EP | 1039361 A1 | 9/2000 |
| EP | 1039620 A2 | 9/2000 |
| EP | 1039621 A2 | 9/2000 |
| EP | 1047179 A1 | 10/2000 |
| EP | 1130770 A2 | 9/2001 |
| EP | 1143594 A2 | 10/2001 |
| EP | 1187291 A2 | 3/2002 |
| EP | 1235339 A2 | 8/2002 |
| EP | 1239573 A1 | 9/2002 |
| EP | 1239576 A2 | 9/2002 |
| EP | 1254505 A2 | 11/2002 |
| EP | 1271742 A2 | 1/2003 |
| EP | 1291997 A2 | 3/2003 |
| EP | 1330009 A2 | 7/2003 |
| EP | 1339153 A2 | 8/2003 |
| EP | 1369983 A1 | 12/2003 |
| EP | 1376706 A2 | 1/2004 |
| EP | 1388774 A1 | 2/2004 |
| EP | 1400988 A2 | 3/2004 |
| EP | 1407534 A2 | 4/2004 |
| EP | 1120895 A3 | 5/2004 |
| EP | 1418482 A1 | 5/2004 |
| EP | 1429393 A2 | 6/2004 |
| EP | 1442473 A2 | 8/2004 |
| EP | 1447561 A1 | 8/2004 |
| EP | 1457857 A2 | 9/2004 |
| EP | 1463188 A2 | 9/2004 |
| EP | 1475882 A2 | 11/2004 |
| EP | 1503490 A1 | 2/2005 |
| EP | 1521345 A1 | 4/2005 |
| EP | 1526633 A2 | 4/2005 |
| EP | 1531542 A2 | 5/2005 |
| EP | 1531545 A2 | 5/2005 |
| EP | 1532727 A2 | 5/2005 |
| EP | 1552563 A2 | 7/2005 |
| EP | 1562281 A1 | 8/2005 |
| EP | 1580862 A1 | 9/2005 |
| EP | 1603212 A2 | 12/2005 |
| EP | 1610571 A2 | 12/2005 |
| EP | 1623495 A1 | 2/2006 |
| EP | 1642355 A2 | 4/2006 |
| EP | 0964457 A3 | 5/2006 |
| EP | 1657557 A1 | 5/2006 |

(56) References Cited

FOREIGN PATENT DOCUMENTS

| | | | |
|---|---|---|---|
| EP | 1657797 A1 | 5/2006 |
| EP | 1691246 A2 | 8/2006 |
| EP | 1706937 A1 | 10/2006 |
| EP | 1708070 A1 | 10/2006 |
| EP | 1716272 A1 | 11/2006 |
| EP | 1728413 A1 | 12/2006 |
| EP | 1734373 A2 | 12/2006 |
| EP | 1750193 A1 | 2/2007 |
| EP | 1766490 A1 | 3/2007 |
| EP | 1782146 A2 | 5/2007 |
| EP | 1785800 A1 | 5/2007 |
| EP | 1837985 A2 | 9/2007 |
| EP | 1842121 A2 | 10/2007 |
| EP | 1609250 B1 | 1/2008 |
| EP | 1887675 A2 | 2/2008 |
| EP | 1901419 A2 | 3/2008 |
| EP | 1902349 A2 | 3/2008 |
| EP | 1911101 A1 | 4/2008 |
| EP | 1914857 A1 | 4/2008 |
| EP | 2048679 A1 | 4/2009 |
| EP | 2061088 A2 | 5/2009 |
| EP | 2092625 A2 | 8/2009 |
| EP | 2092631 A2 | 8/2009 |
| EP | 2130286 A1 | 12/2009 |
| EP | 2135296 A2 | 12/2009 |
| EP | 2135348 A2 | 12/2009 |
| EP | 2144133 A1 | 1/2010 |
| EP | 2179451 A1 | 4/2010 |
| EP | 2206159 A2 | 7/2010 |
| EP | 2232690 A1 | 9/2010 |
| EP | 2234237 A1 | 9/2010 |
| EP | 2249457 A1 | 11/2010 |
| EP | 2256819 A1 | 12/2010 |
| EP | 2315328 A2 | 4/2011 |
| EP | 2355268 A1 | 8/2011 |
| EP | 2374190 A1 | 10/2011 |
| EP | 2386122 A2 | 11/2011 |
| EP | 2393178 A2 | 12/2011 |
| EP | 2395648 A2 | 12/2011 |
| EP | 2495766 A1 | 9/2012 |
| EP | 2515424 A2 | 10/2012 |
| EP | 2533299 A1 | 12/2012 |
| EP | 2549635 A1 | 1/2013 |
| EP | 2561596 A2 | 2/2013 |
| EP | 2615644 A2 | 7/2013 |
| EP | 2621045 A2 | 7/2013 |
| EP | 2666222 A1 | 11/2013 |
| EP | 2722979 A1 | 4/2014 |
| EP | 2779251 A1 | 9/2014 |
| EP | 3176933 A1 | 6/2017 |
| EP | 2139104 B1 | 10/2017 |
| ES | 2249147 A1 | 3/2006 |
| ES | 2249149 A1 | 3/2006 |
| FR | 2796216 A1 | 1/2001 |
| FR | 2819653 A1 | 7/2002 |
| FR | 2894401 A1 | 6/2007 |
| GB | 310362 A | 9/1929 |
| GB | 612859 A | 11/1948 |
| GB | 1211885 A | 11/1970 |
| GB | 1231961 A | 5/1971 |
| GB | 1261838 A | 1/1972 |
| GB | 1571681 A | 7/1980 |
| GB | 1597508 A | 9/1981 |
| GB | 2128017 A | 4/1984 |
| GB | 2327208 A | 1/1999 |
| GB | 2339465 A | 1/2000 |
| GB | 2376801 A | 12/2002 |
| GB | 2399463 A | 9/2004 |
| GB | 2399465 A | 9/2004 |
| GB | 2415841 A | 1/2006 |
| GB | 2419968 A | 5/2006 |
| GB | 2421847 A | 7/2006 |
| GB | 2434490 A | 7/2007 |
| GB | 2476508 A | 6/2011 |
| GB | 2480015 A | 11/2011 |
| GB | 2480015 B | 12/2011 |
| GB | 2482653 A | 2/2012 |
| GB | 2483317 A | 3/2012 |
| GB | 2485527 A | 5/2012 |
| GB | 2486408 A | 6/2012 |
| GB | 2487368 A | 7/2012 |
| GB | 2497275 A | 6/2013 |
| GB | 2498365 A | 7/2013 |
| GB | 2498790 A | 7/2013 |
| GB | 2498791 A | 7/2013 |
| GB | 2499991 A | 9/2013 |
| JP | S56042365 A | 4/1981 |
| JP | S60027964 A | 2/1985 |
| JP | S60148172 A | 8/1985 |
| JP | 61065320 A | 4/1986 |
| JP | S62154121 A | 7/1987 |
| JP | S62154122 A | 7/1987 |
| JP | H01311874 A | 12/1989 |
| JP | H04219982 A | 8/1992 |
| JP | H04364378 A | 12/1992 |
| JP | H05003678 A | 1/1993 |
| JP | H06035555 A | 2/1994 |
| JP | H06141261 A | 5/1994 |
| JP | H07026849 A | 1/1995 |
| JP | H07058843 A | 3/1995 |
| JP | H07-222436 A | 8/1995 |
| JP | 8009557 A | 1/1996 |
| JP | H08033347 A | 2/1996 |
| JP | H08066050 A | 3/1996 |
| JP | H0897460 A | 4/1996 |
| JP | H08116628 A | 5/1996 |
| JP | H08181343 A | 7/1996 |
| JP | H08185235 A | 7/1996 |
| JP | H08204220 A | 8/1996 |
| JP | H08227324 A | 9/1996 |
| JP | H08316517 A | 11/1996 |
| JP | H08317664 A | 11/1996 |
| JP | H094692 A | 1/1997 |
| JP | H09097918 A | 4/1997 |
| JP | H09148611 A | 6/1997 |
| JP | H09148613 A | 6/1997 |
| JP | H09275644 A | 10/1997 |
| JP | 2676789 B2 | 11/1997 |
| JP | H1017445 A | 1/1998 |
| JP | H1075580 A | 3/1998 |
| JP | H10201086 A | 7/1998 |
| JP | H10201105 A | 7/1998 |
| JP | H10308523 A | 11/1998 |
| JP | 11041832 A | 2/1999 |
| JP | H1146457 A | 2/1999 |
| JP | 11103538 A | 4/1999 |
| JP | 2892183 B2 | 5/1999 |
| JP | 11206038 A | 7/1999 |
| JP | H11266545 A | 9/1999 |
| JP | 11289891 A | 10/1999 |
| JP | 11318042 A | 11/1999 |
| JP | 2000020150 A | 1/2000 |
| JP | 3015512 B2 | 3/2000 |
| JP | 2000-112545 A | 4/2000 |
| JP | 2000-116010 A | 4/2000 |
| JP | 2000160789 A | 6/2000 |
| JP | 2000166097 A | 6/2000 |
| JP | 2000174307 A | 6/2000 |
| JP | 2000232791 A | 8/2000 |
| JP | 2000232793 A | 8/2000 |
| JP | 2000316282 A | 11/2000 |
| JP | 2000324852 A | 11/2000 |
| JP | 2000339044 A | 12/2000 |
| JP | 2000341974 A | 12/2000 |
| JP | 2000347753 A | 12/2000 |
| JP | 2000358330 A | 12/2000 |
| JP | 2001060120 A | 3/2001 |
| JP | 2001075662 A | 3/2001 |
| JP | 2001086765 A | 3/2001 |
| JP | 2001178145 A | 6/2001 |
| JP | 2001189476 A | 7/2001 |
| JP | 2001224142 A | 8/2001 |
| JP | 2001238466 A | 8/2001 |
| JP | 2001250964 A | 9/2001 |

(56) References Cited

FOREIGN PATENT DOCUMENTS

| | | |
|---|---|---|
| JP | 2002073184 A | 3/2002 |
| JP | 2002231578 A | 8/2002 |
| JP | 2002238246 A | 8/2002 |
| JP | 2002-262461 A | 9/2002 |
| JP | 2002270876 A | 9/2002 |
| JP | 2002300735 A | 10/2002 |
| JP | 2002339591 A | 11/2002 |
| JP | 2002354677 A | 12/2002 |
| JP | 2003102134 A | 4/2003 |
| JP | 2003124492 A | 4/2003 |
| JP | 2003134661 A | 5/2003 |
| JP | 2003134667 A | 5/2003 |
| JP | 2003282916 A | 10/2003 |
| JP | 2003289674 A | 10/2003 |
| JP | 3499941 B2 | 2/2004 |
| JP | 2004055603 A | 2/2004 |
| JP | 2004-096090 A | 3/2004 |
| JP | 2004111754 A | 4/2004 |
| JP | 2004-147465 A | 5/2004 |
| JP | 2004194500 A | 7/2004 |
| JP | 2004260944 A | 9/2004 |
| JP | 2004312994 A | 11/2004 |
| JP | 2004334704 A | 11/2004 |
| JP | 2005-151662 A | 6/2005 |
| JP | 3656531 B2 | 6/2005 |
| JP | 2005192314 A | 7/2005 |
| JP | 2005-235082 A | 9/2005 |
| JP | 2005251039 A | 9/2005 |
| JP | 2005-276942 A | 10/2005 |
| JP | 2005-312287 A | 11/2005 |
| JP | 2006041440 A | 2/2006 |
| JP | 2006262619 A | 9/2006 |
| JP | 2006278755 A | 10/2006 |
| JP | 2007058845 A | 3/2007 |
| JP | 2007104872 A | 4/2007 |
| JP | 2007225625 A | 9/2007 |
| JP | 4174227 B2 | 10/2008 |
| JP | 2010-146047 A | 7/2010 |
| JP | 2010245532 A | 10/2010 |
| JP | 2011-249790 A | 12/2011 |
| JP | 2012-60714 A | 3/2012 |
| JP | 2012511299 A | 5/2012 |
| JP | 2012178535 A | 9/2012 |
| KR | 20010044490 A | 6/2001 |
| KR | 20040086088 A | 10/2004 |
| KR | 100468127 B1 | 1/2005 |
| KR | 200402282 Y1 | 11/2005 |
| KR | 20060060825 A | 6/2006 |
| KR | 20070036528 A | 4/2007 |
| KR | 100725755 B1 | 5/2007 |
| KR | 20080092747 A | 10/2008 |
| KR | 100912892 B1 | 8/2009 |
| KR | 101073143 B1 | 10/2011 |
| NL | 1011483 C2 | 9/2000 |
| TW | 497326 B | 8/2002 |
| TW | 200913291 A | 3/2009 |
| WO | 8202134 A1 | 6/1982 |
| WO | 1982002134 A1 | 6/1982 |
| WO | 1984003402 A1 | 8/1984 |
| WO | 1988004801 A1 | 6/1988 |
| WO | 9003680 A1 | 4/1990 |
| WO | 1992007418 A1 | 4/1992 |
| WO | 1993013587 A1 | 7/1993 |
| WO | 95/25374 A1 | 9/1995 |
| WO | 95/34121 A1 | 12/1995 |
| WO | 1996007130 A1 | 3/1996 |
| WO | 1996013093 A1 | 5/1996 |
| WO | 1998023021 A2 | 5/1998 |
| WO | 1999028801 A1 | 6/1999 |
| WO | 00/00839 A1 | 1/2000 |
| WO | 00/21178 A1 | 4/2000 |
| WO | 0042689 A1 | 7/2000 |
| WO | 0075947 A1 | 12/2000 |
| WO | 0077522 A1 | 12/2000 |
| WO | 01/13502 A1 | 2/2001 |
| WO | 01047095 A2 | 6/2001 |
| WO | 02/17469 A1 | 2/2002 |
| WO | 0231517 | 4/2002 |
| WO | 02056126 A1 | 7/2002 |
| WO | 2002073785 A1 | 9/2002 |
| WO | 0278164 A1 | 10/2002 |
| WO | 02078164 A1 | 10/2002 |
| WO | 02093655 A1 | 11/2002 |
| WO | 03012569 A1 | 2/2003 |
| WO | 2003012569 A1 | 2/2003 |
| WO | 03/026114 A2 | 3/2003 |
| WO | 2003036688 A2 | 5/2003 |
| WO | 2003050938 A2 | 6/2003 |
| WO | 2003071655 A1 | 8/2003 |
| WO | 03084041 A1 | 10/2003 |
| WO | 2003098703 | 11/2003 |
| WO | 2004001942 A1 | 12/2003 |
| WO | 2004006342 A1 | 1/2004 |
| WO | 2004008619 A2 | 1/2004 |
| WO | 2004023278 A2 | 3/2004 |
| WO | 2004053993 A1 | 6/2004 |
| WO | 2004090993 A2 | 10/2004 |
| WO | 2004098261 A2 | 11/2004 |
| WO | 2004100344 A2 | 11/2004 |
| WO | 2004100348 A1 | 11/2004 |
| WO | 2004107543 A2 | 12/2004 |
| WO | 2005015584 A2 | 2/2005 |
| WO | 2005027300 A1 | 3/2005 |
| WO | 2005036725 A1 | 4/2005 |
| WO | 2005053189 A1 | 6/2005 |
| WO | 2005069096 A1 | 7/2005 |
| WO | 2005076444 A1 | 8/2005 |
| WO | 2005076445 A1 | 8/2005 |
| WO | 2005089030 A1 | 9/2005 |
| WO | 2005112551 A2 | 12/2005 |
| WO | 2005119278 A1 | 12/2005 |
| WO | 2005119609 A2 | 12/2005 |
| WO | 2005124498 A1 | 12/2005 |
| WO | 2006002380 A2 | 1/2006 |
| WO | 2006005125 A1 | 1/2006 |
| WO | 2006007198 A1 | 1/2006 |
| WO | 2006011071 A2 | 2/2006 |
| WO | 2006011359 A1 | 2/2006 |
| WO | 2006013600 A2 | 2/2006 |
| WO | 2006033143 A1 | 3/2006 |
| WO | 2006/013600 A3 | 5/2006 |
| WO | 2006048688 A1 | 5/2006 |
| WO | 2006048689 A2 | 5/2006 |
| WO | 2006/074561 A1 | 7/2006 |
| WO | 2006071436 A2 | 7/2006 |
| WO | 2006078685 A2 | 7/2006 |
| WO | 2006079503 A2 | 8/2006 |
| WO | 2006089778 A2 | 8/2006 |
| WO | 2006110613 A2 | 10/2006 |
| WO | 2006/125664 A1 | 11/2006 |
| WO | 2006117551 A2 | 11/2006 |
| WO | 2006130520 A2 | 12/2006 |
| WO | 2006137948 A2 | 12/2006 |
| WO | 2007006564 A2 | 1/2007 |
| WO | 2007007360 A2 | 1/2007 |
| WO | 2007010326 A1 | 1/2007 |
| WO | 2007/020419 A2 | 2/2007 |
| WO | 2007048421 A2 | 5/2007 |
| WO | 2007072517 A1 | 6/2007 |
| WO | 2007073951 A1 | 7/2007 |
| WO | 2007080429 A2 | 7/2007 |
| WO | 2007084196 A2 | 7/2007 |
| WO | 2007090476 A2 | 8/2007 |
| WO | 2007113358 A1 | 10/2007 |
| WO | 2007124518 A1 | 11/2007 |
| WO | 2007129808 A1 | 11/2007 |
| WO | 2007142693 A2 | 12/2007 |
| WO | 2008008528 A2 | 1/2008 |
| WO | 2008026207 A2 | 3/2008 |
| WO | 2008/046370 A1 | 4/2008 |
| WO | 2008077473 A2 | 7/2008 |
| WO | 2008069926 A3 | 8/2008 |
| WO | 2008097591 A2 | 8/2008 |
| WO | 2008119034 A1 | 10/2008 |

(56) References Cited

FOREIGN PATENT DOCUMENTS

| | | |
|---|---|---|
| WO | 2008121266 A2 | 10/2008 |
| WO | 2008125915 A2 | 10/2008 |
| WO | 2008132551 A2 | 11/2008 |
| WO | 2008132553 A2 | 11/2008 |
| WO | 2008142480 A2 | 11/2008 |
| WO | 2009003680 A1 | 1/2009 |
| WO | 2009006879 A2 | 1/2009 |
| WO | 2009007782 A2 | 1/2009 |
| WO | 2009011780 A2 | 1/2009 |
| WO | 2009020917 A2 | 2/2009 |
| WO | 2009/026602 A1 | 3/2009 |
| WO | 2009007782 A3 | 3/2009 |
| WO | 2009046533 A1 | 4/2009 |
| WO | 2009051221 A1 | 4/2009 |
| WO | 2009051222 A1 | 4/2009 |
| WO | 2009051853 A1 | 4/2009 |
| WO | 2009051854 A1 | 4/2009 |
| WO | 2009051870 A1 | 4/2009 |
| WO | 2009055474 A1 | 4/2009 |
| WO | 2009/059877 A1 | 5/2009 |
| WO | 2009056957 A2 | 5/2009 |
| WO | 2009059028 A2 | 5/2009 |
| WO | 2009064683 A2 | 5/2009 |
| WO | 2009/072075 A2 | 6/2009 |
| WO | 2009/073867 A1 | 6/2009 |
| WO | 2009072076 A2 | 6/2009 |
| WO | 2009072077 A1 | 6/2009 |
| WO | 2009073868 A1 | 6/2009 |
| WO | 2009073995 A1 | 6/2009 |
| WO | 2009075985 A2 | 6/2009 |
| WO | 2009/075985 A3 | 7/2009 |
| WO | 2009114341 A2 | 9/2009 |
| WO | 2009118682 A2 | 10/2009 |
| WO | 2009118683 A2 | 10/2009 |
| WO | 2009118683 A3 | 11/2009 |
| WO | 2009136358 A1 | 11/2009 |
| WO | 2009140536 A2 | 11/2009 |
| WO | 2009140539 A2 | 11/2009 |
| WO | 2009140543 A2 | 11/2009 |
| WO | 2009140551 A2 | 11/2009 |
| WO | 2009118682 A3 | 12/2009 |
| WO | 2009155392 A1 | 12/2009 |
| WO | 2010/002960 A1 | 1/2010 |
| WO | 2010/003941 A2 | 1/2010 |
| WO | 2009136358 A4 | 1/2010 |
| WO | 2009/140536 A3 | 2/2010 |
| WO | 2009/140543 A3 | 2/2010 |
| WO | 2009/140551 A3 | 2/2010 |
| WO | 2010014116 A1 | 2/2010 |
| WO | 2010020385 A2 | 2/2010 |
| WO | 2010/042124 A1 | 4/2010 |
| WO | 2010037393 A1 | 4/2010 |
| WO | 2010056777 A1 | 5/2010 |
| WO | 2010/071855 A2 | 6/2010 |
| WO | 2010062410 A1 | 6/2010 |
| WO | 2010062662 A2 | 6/2010 |
| WO | 2010065043 A1 | 6/2010 |
| WO | 2010065388 A1 | 6/2010 |
| WO | 2010/072071 A1 | 7/2010 |
| WO | 2010078303 A2 | 7/2010 |
| WO | 2010080672 A2 | 7/2010 |
| WO | 2010091025 A2 | 8/2010 |
| WO | 2010094012 A1 | 8/2010 |
| WO | 2010118503 A1 | 10/2010 |
| WO | 2010120315 A1 | 10/2010 |
| WO | 2010/132369 A1 | 11/2010 |
| WO | 2010134057 A1 | 11/2010 |
| WO | 20100134057 A1 | 11/2010 |
| WO | 2011005339 A1 | 1/2011 |
| WO | 2011011711 A2 | 1/2011 |
| WO | 2011014275 A1 | 2/2011 |
| WO | 2011017721 A1 | 2/2011 |
| WO | 2011019936 A1 | 2/2011 |
| WO | 2011023732 A2 | 3/2011 |
| WO | 2011028456 A2 | 3/2011 |
| WO | 2011028457 A2 | 3/2011 |
| WO | 2011044641 A1 | 4/2011 |
| WO | 2011049985 A1 | 4/2011 |
| WO | 2011059067 A1 | 5/2011 |
| WO | 2011074025 A1 | 6/2011 |
| WO | 2011076707 A2 | 6/2011 |
| WO | 2011085259 A2 | 7/2011 |
| WO | 2011089607 A1 | 7/2011 |
| WO | 2011119587 A2 | 9/2011 |
| WO | 2011133843 A2 | 10/2011 |
| WO | 2011133928 A2 | 10/2011 |
| WO | 2011151672 A1 | 12/2011 |
| WO | 2012024538 A3 | 5/2012 |
| WO | 2012100263 A2 | 7/2012 |
| WO | 2013015921 A1 | 1/2013 |
| WO | 2013019899 A2 | 2/2013 |
| WO | 2013130563 A1 | 9/2013 |
| WO | 2014143021 A1 | 9/2014 |
| WO | 2017/125375 A1 | 7/2017 |
| WO | 2018122835 A1 | 7/2018 |

OTHER PUBLICATIONS

Feb. 22-26, 2004—Andersen, Gert et al.,—"Utilizing the free running Current Programmed Control as a Power Factor Correction Technique for the two switch Buck-Boost converter"—Applied Power Electronic Conference and Exposition, 2004. APEC '04. Nineteenth Annual IEEE.

Mar. 3-7, 1996—Caricchi F et al.,—"Prototype of Innovative Wheel Direct Drive With Water-Cooled Exial-Flux Motor for Electric Vehicle Applications"—Applied Power Electronics Conference and Expositions, 1996. APEC '96. Conference Proceedings 1996., Eleventh Annual IEEE.

Feb. 15-19, 1998—Caricchi, F. et al.,—"Study of Bi-Directional Buck-Boost Converter Topologies for Application in Electrical Vehicle Motor Drives"—Applied Power Electronics Conference and Exposition, 1998, APEC '98. Conference Proeedings 1998., Thirteenth Annual IEEE.

Nov. 27-30, 1990—Ensling, JHR—"Maximum Power Point Tracking: A Cost Saving Necessity in Solar Energy Systems"—Industrial Electornics Society, 1990. IECON '90., 16th Annual Conference of IEEE.

Feb. 22-26, 2004—Gaboriault, Mark et al.,—"A High Efficiency, Non-Inverting, Buck-Boost DC-DC Converter"—Applied Power Electronics Conference and Exposition, 2004. APEC '04. Nineteenth Annual IEEE.

Feb. 15-19, 1998—Hua, et al.,—"Comparative Study of Peak Power Tracking Techniques for Solar Storage System"—Applied POwer Electronics Conference and Exposition, 1998. APEC'98. Conferenced Proceedings 1998., Thirteenth Annual IEEE.

Jun. 20-24, 1993—Sullivan, et al., "A High-Efficiency Maximum Power Point Tracker for Photovoltaic Arrays in a Solar-Powered Race Vehicle"—University of California, Berkeley, Department of Electrical Engineering and OCmputer Sciences—Power Electronics Specialists Conference, 1993. PESC '93 Record., 24th Annual IEEE.

May 19-24, 2002—Bower et at.,—"Certification of Photovoltaic Inverters: The Initial Step Toward PV System Certification"—Photovoltaic Specialists Conferences, 2002 Conference Record of the Twenty-Ninth IEEE.

Jun. 17-21, 2001—Tse et al., "A Novel Maximum Power Point Tracking Technique for PV Panels"—Power Electronics Specialists Conferences, 2001. PESC. 2001 IEEE 32nd Annual.

May 12-18, 2008—Cuadras et al., "Smart Interfaces for Low Power Energy Harvesting Systems"—Instrumentation and Measurement Technology Conferences Proceedings, 2008 IMTC 2008. IEEE.

Dec. 5-9, 1994—Haan, et al., "Test Results of a 130 W AC Module; a modular solar as power station"—Photovoltaic Energy Conversion 1994 Conference Record of the Twenty Fourth IEEE Phtovoltaic Specialists Conference—1994.

Sep. 1-3, 2008—Jung, et al., "Soft Switching Boost Converter for Photovoltaic Power Generation System"—Power Electronics and Motion Control Conference, 2008. EPE-PEMC 2008.

(56) References Cited

OTHER PUBLICATIONS

Jun. 3-5, 2008—Duan, et al., "A Novel High-Efficiency Inverter for Stand Alone and Grid-Connected Systems"—Industrial Electronics and Applications, 2008. ICIEA 2008.
Nov. 7, 2002—Ertl, et al., "A Novel Multicell DC-AC Converter for Applicaiton in Renewable Energy Systems"—IEEE Transactions on Industrial Electronics (vol. 49, Issue 5, Oct. 2002).
Oct. 8-12, 2000 Hashimoto, et al., "A Novel High Peforamance Utility Interactive Photovoltain Inverter System"—Industry Applications Conference, 2000. Conference Record of the 2000 IEEE.
Feb. 22-26, 2004—Ho, et al., "An Integrated Inverter with Maximum Power Tracking for Grid-Connected PV Systems"—Applied Power Electronics Conference and Exposition, 2004. APEC '04. Nineteenth Annual IEEE.
Nov. 14, 1997, Hua et al., "Control of DC/DC Converters for Solar Energy System with Maximum Power Tracking"—Industrial Electronics, Control and Instrumentation, 1997. IECON 97. 23rd International Conference on Industrial Electronics, Control and Instrumentation vol. 4 of 4.
Sep. 1-3, 2008, Lee et al., "Soft Switching Mutli-Phase Boost Converter for Photovoltaic System"—Power Electronics and Motnion Control Conference, 2008. EPE-PEMC 2008.
Jul. 5, 2005, Yao et al., "Tapped-Inductor Buck Converter for High-Step-Down DC-DC Conversion" IEEE Transactions on Power Electronics (vol. 20, Issue 4, Jul. 2005).
Sep. 21-23, 1998, Kretschmar, et al., "An AC Converter with a Small DC Link Capacitor for a 15KW Permanent Magnet Synchronous Integral Motor"—Power Electronics and Variable Speed Drives, 1998. Sevent International Converterest (Conf. Publ. No. 456).
May 25, 2000—Hong Lim, et al., "Simple Maximum Power Point Tracker for Photovoltaic Arrays"—Electronics Letters (vol. 36, Issue 11, May 25, 2000).
Aug. 14-16, 2004, Nishida et al., "A Novel Type of Utility-Interactive Inverter for Phtovoltaic System"—Power Electronics and Mtion Control Conference, 2004. IPEMC 2004.
May 30-Jun. 3, 2011, Jung, et al., "DC-Link Ripple Reduction of Series-connected Module Integrated Converter for Photovoltaic Systems"—Power Electronics and ECCE Asia (ICPE & ECCE).
Jan. 8, 2007, Li et al., "An Analysis of ZVS Two-Inductor Boost Converter under Variable Frequency Operation"—IEEE Transactions on Power Electronics (vol. 22, Issue 1, Jan. 2007).
Sep. 17, 2007, Rodriguez et al., "Analytic Solution to the Photovoltaic Maximum Power Point Problem"—IEEE Transactions on Circuits and Systems I: Regular Papers (vol. 54, Issue 9, Sep. 2007).
Jun. 27, 1997, Reimann et al., "A Novel Control Principle of Bi-Directional DC-DC Power Conversion"—Powre Electronics Specialists Conference 1997. PESC '97 Record.
Sep. 15-22, 2000, Russell et al., "The Massachusetts Electric Solar Project a Pilot Project to Commercialize Residential PV Systems"—Photovoltaic Specialists Conference, 2000, Conference Record of the Twenty-Eighth IEEE Photovoltaic Specialists Conference—2000.
May 2001, Shimizu et al., "Generation Control Circuit for Photvoltaic Modules"—IEEE Transactions of Power Electronics (vol. 16, Issue 3, May 2001).
Feb. 6-10, 2000, Siri, Kasemsan "Study of System Instability in Current-Mode Converter Power Systems Operating in Solar Array Voltage Regulation Mode"—Applied Power Electronics Conference and Exposition, 2000. APEC 2000. Fiftheenth Annual IEEE.
Aug. 13-16, 1990—Rajan, Anita "A Maximum Power Point Tracker Optimized for Solar Powered Cars"—Future Transportation Technology Conference and Expostion.
Jul. 10, 1995—"Battery I.D. chip from Dallas Semiconductor monitors and reports battery pack temperature"—Business Wire.
Nov. 3, 1999—Takahashi et al., "Development of a Long-Life Three-Phase Flywheel UPS Using an Electrolytic Capacitorless Converter/lnverter"—Electrical Engineering in Japan, vol. 127.
Jan. 2001—Walker, Geoffrey "Evaluating MPPT Converter Topologies Using a Matlab PV Model"—"Journal of Electrical and Electronics Engineering, Australia".

Feb. 13, 2007—Roman et al., "Experimental Results of Controlled PV Module for Building Integrated PV Systems"—Solar Energy 82 (2008) 471-480.
2006—Bower et al., "Innovative PV Micro-Inverter Topology Eliminates Electrolytic Capacitors for Longer Lifetime"—IEEE 1-4244-0016-3/06/ pp. 2038-2041.
Aug. 23-27, 1993—Case et al., "A Minimum Component Photovoltaic Array Maximum Power Point Tracker"—European Space Power Conference vol. 1. Power Systems, Power Electronics.
Jun. 4, 1997—Maranda et al., "Optimization of the Master-Slave Inverter System for Grid-Connected Photovoltaic Plants"—Energy Convers. Mgmt. vol. 39, No. 12 pp. 1239-1246.
2005—Kang et al., "Photovoltaic Power Interface Circuit Incorporated with a Buck-Boost Converter and a Full-Bridge Inverter"—Applied Energy 82, pp. 266-283.
Nov. 21, 1997—Feuermann et al., "Reversable Low Soalr Heat Gain Windows for Energy Savings"—Solar Energy vol. 62, No. 3 pp. 169-175.
May 16, 2005—Enrique et al., "Theoretical assessment of the maximum power point tracking efficiency of photovoltaic facilities with different converter topologies"—Solar Energy 81 (2007) p. 31-38.
Dehbonei, Hooman "Power Conditioning for Distrbuted Renewable Energy Generation"—Curtin University of Technology, School of Electrical and Computer Engineering, 2003 568 pages Dissertation: Thesis. Abstract, 1 page—retrieved on Nov. 13, 2017 on https://books.google.com/books/about/Power_Conditioning_for_Distributed_Renew.html?id=3wVXuAAACAAJ.
Korean Patent Application No. 102005-7008700, filed May 13, 2015. Applicant: Exar Corporation.
Jan. 23, 2018—EP Search Report, EP App No. 17187230.2.
Apr. 16, 2018—EP Examination Report 12707899.6.
Aug. 9, 2010—Hong, Wei, et al., "Charge Equalization of Battery POwer Modules in Series" The 2010 International Power Electronics Conference, IEEE, p. 1568-1572.
Jun. 6, 2018—EP Search Report EP App No. 18151594.1.
Jun. 29, 2018—EP Search Report—EP App No. 18175980.4.
2000; Bascope, G.V.T. Barbi, I; "Generation of Family of Non-isolated DC-DC PWM Converters Using New Three-state Switching Cells"; 2000 IEEE 31st Annual Power Electronics Specialists Conference in Galway, Ireland; vol. 2.
2004—Nobuyoshi, M. et al., "A Controlling Method for Charging Photovoltaic Generation Power Obtained by a MPPT Control Method to Series Connected Ultra-Electric Double Layer Capacitors"—Industry Application Conference, 2004. 39th IAS Annual Meeting. Conference Record of the 2004 IEEE.
Ciobotaru, et al., Control of single-stage single-phase PV inverter, Aug. 7, 2006.
International Search Report and Written Opinion for PCT/IB2007/004591 dated Jul. 5, 2010.
European Communication for EP07873361.5 dated Jul. 12, 2010.
European Communication for EP07874022.2 dated Oct. 18, 2010.
European Communication for EP07875148.4 dated Oct. 18, 2010.
Chen, et al., "A New Low-Stress Buck-Boost Converter for Universal-Input PFC Applications", IEEE Applied Power Electronics Conference, Feb. 2001, Colorado Power Electronics Center Publications.
Chen, et al., "Buck-Boost PWM Converters Having Two Independently Controlled Switches", IEEE Power Electronics Specialists Conference, Jun. 2001, Colorado Power Electronics Center Publications.
Esram, et al., "Comparison of Photovoltaic Array Maximum Power Point Tracking Techniques", IEEE Transactions on Energy Conversion, vol. 22, No. 2, Jun. 2007, pp. 439-449.
Walker, et al., "Photovoltaic DC-DC Module Integrated Converter for Novel Cascaded and Bypass Grid Connection Topologies-Design and Optimisation", 37th IEEE Power Electronics Specialists Conference, Jun. 18-22, 2006, Jeju, Korea.
Geoffrey R. Walker Affidavit re: U.S. Appl. No. 11/950,271, submitted in an IDS for U.S. Appl. No. 11/950,271 on Mar. 9, 2010.
International Search Report for PCT/IB2007/004610 dated Feb. 23, 2009.
International Search Report for PCT/IB2007/004584 dated Jan. 28, 2009.

(56) References Cited

OTHER PUBLICATIONS

International Search Report for PCT/IB2007/004586 dated Mar. 5, 2009.
International Search Report for PCT/IB2007/004643 dated Jan. 30, 2009.
International Search Report for PCT/US2008/085736 dated Jan. 28, 2009.
International Search Report for PCT/US2008/085754 dated Feb. 9, 2009.
International Search Report for PCT/US2008/085755 dated Feb. 3, 2009.
Kajihara, et al., "Model of Photovoltaic Cell Circuits Under Partial Shading", 2005 IEEE, pp. 866-870.
Knaupp, et al., "Operation of a 10 KW PV Facade with 100 W AC Photovoltaic Modules", 1996 IEEE, 25th PVSC, May 13-17, 1996, pp. 1235-1238, Washington, DC.
Alonso, et al., "Cascaded H-Bridge Multilevel Converter for Grid Connected Photovoltaic Generators with Independent Maximum Power Point Tracking of Each Solar Array", 2003 IEEE 34th, Annual Power Electronics Specialists Conference, Acapulco, Mexico, Jun. 15-19, 2003, pp. 731-735, vol. 2.
Myrzik, et al., "String and Module Integrated Inverters for Single-Phase Grid Connected Photovoltaic Systems—A Review", Power Tech Conference Proceedings, 2003 IEEE Bologna, Jun. 23-26, 2003, p. 8, vol. 2.
Chen, et al., "Predictive Digital Current Programmed Control", IEEE Transactions on Power Electronics, vol. 18, Issue 1, Jan. 2003.
Wallace, et al., "DSP Controlled Buck/Boost Power Factor Correction for Telephony Rectifiers", Telecommunications Energy Conference 2001, INTELEC 2001, Twenty-Third International, Oct. 18, 2001, pp. 132-138.
Alonso, "A New Distributed Converter Interface for PV Panels", 20th European Photovoltaic Solar Energy Conference, Jun. 6-10, 2005, Barcelona, Spain, pp. 2288-2291.
Alonso, "Experimental Results of Intelligent PV Module for Grid-Connected PV Systems", 21st European Photovoltaic Solar Energy Conference, Sep. 4-8, 2006, Dresden, Germany, pp. 2297-2300.
Enslin, "Integrated Photovoltaic Maximum Power Point Tracking Converter", IEEE Transactions on Industrial Electronics, vol. 44, No. 6, Dec. 1997, pp. 769 773.
Sep. 7-9, 1999—Lindgren, "Topology for Decentralised Solar Energy Inverters with a Low Voltage AC-Bus", Chalmers University of Technology, Department of Electrical Power Engineering, EPE '99—Lausanne.
Jun. 20-25, 2004—Nikraz, "Digital Control of a Voltage Source Inverter in a Photovoltaic Applications", 2004 35th Annual IEEE Power Electronics Specialists Conference, Aachen, Germany, 2004, pp. 3266-3271.
Orduz, "Evaluation Test Results of a New Distributed MPPT Converter", 22nd European Photovoltaic Solar Energy Conference, Sep. 3-7, 2007, Milan, Italy.
Jun. 17-21, 2007—Palma, "A Modular Fuel Cell, Modular DC-DC Converter Concept for High Performance and Enhanced Reliability", IEEE 2007, pp. 2633-2638.
Sep. 16-19, 1996—Quaschning, "Cost Effectiveness of Shadow Tolerant Photovoltaic Systems", Berlin University of Technology, Institute of Eleclrical Energy Technology, Renewable Energy Section. EuroSun '96, pp. 819-824.
Roman, "Intelligent PV Module for Grid-Connected PV Systems", IEEE Transactions on Industrial Electronics, vol. 52, No. 4, Aug. 2006, pp. 1066-1073.
Roman, "Power Line Communications in Modular PV Systems", 20th European Photovoltaic Solar Energy Conference, Jun. 6-10, 2005, Barcelona, Spain, pp. 2249-2252.
Uriarte, "Energy Integrated Management System for PV Applications", 20th European Photovoltaic Solar Energy Conference, Jun. 6-10, 2005, Barcelona, Spain, pp. 2292-2295.
Walker, "Cascaded DC-DC Converter Connection of Photovoltaic Modules", IEEE Transactions on Power Electronics, vol. 19, No. 4, Jul. 2004, pp. 1130-1139.
Oct. 3-7, 1999—Matsui, et al., "A New Maximum Photovoltaic Power Tracking Control Scheme Based on Power Equilibrium at DC Link", IEEE, 1999, pp. 804-809.
Hou, et al., Application of Adaptive Algorithm of Solar Cell Battery Charger, Apr. 2004.
Sep. 15-22, 2000—Stamenic, et al., "Maximum Power Point Tracking for Building Integrated Photovoltaic Ventilation Systems".
International Preliminary Report on Patentability for PCT/IB2008/055092 dated Jun. 8, 2010.
International Search Report for PCT/IB2008/055092 dated Sep. 8, 2009.
International Search Report and Opinion of International Patent Application WO2009136358 (PCT/IB2009/051831), dated Sep. 16, 2009.
Informal Comments to the International Search Report dated Dec. 3, 2009.
PCT/IB2010/052287 International Search Report and Written Opinion dated Sep. 2, 2010.
UK Intellectual Property office, Combined Search and Examination Report for GB1100450.4 under Sections 17 and 18 (3), Jul. 14, 2011.
Jain, et al., "A Single-Stage Grid Connected Inverter Topology for Solar PV Systems with Maximum Power Point Tracking", IEEE Transactions on Power Electronics, vol. 22, No. 5, Sep. 2007, pp. 1928-1940.
Lynch, et al., "Flexible DER Utility Interface System: Final Report", Sep. 2004-May 2006, Northern Power Systems, Inc., Waitsfield, Vermont B. Kroposki, et al., National Renewable Energy Laboratory Golden, Colorado Technical Report NREL/TP-560-39876, Aug. 2006.
Schimpf, et al., "Grid Connected Converters for Photovoltaic, State of the Art, Ideas for improvement of Transformerless Inverters", NORPIE/2008, Nordic Workshop on Power and Industrial Electronics, Jun. 9-11, 2008.
Sandia Report SAND96-2797 I UC-1290 Unlimited Release, Printed Dec. 1996, "Photovoltaic Power Systems and The National Electrical Code: Suggested Practices", by John Wiles, Southwest Technology Development Institute New Mexico State University Las Cruces, NM.
United Kingdom Intellectual Property Office, Combined Search and Examination Report Under Sections 17 and 18(3), GB1020862.7, dated Jun. 16, 2011.
Jan. 29, 2019—European Search Report for EP App No. 18199117.5.
GB Combined Search and Examination Report—GB1203763.6—dated Jun. 25, 2012.
Mohammad Reza Amini et al., "Quasi Resonant DC Link Inverter with a Simple Auxiliary Circuit", Journal of Power Electronics, vol. 11, No. 1, Jan. 2011.
Khairy Fathy et al., "A Novel Quasi-Resonant Snubber-Assisted ZCS-PWM DC-DC Converter with High Frequency Link", Journal of Power Electronics, vol. 7, No. 2, Apr. 2007.
May 22, 1998—Cheng K.W.E., "New Generation of Switched Capacitor Converters", Department of Electrical Engineering, The Hong Kong Polytechnic University, Hung Hom, Hong Kong, Power Electronics Conference, PESC 98.
1999—Per Karlsson, "Quasi Resonant DC Link Converters—Analysis and Design for a Battery Charger Application", Universitetstryckeriet, Lund University, 1999, ISBN 91-88934-14-4; Added to Lund University Publications on Jun. 4, 2012.
Hsiao Sung-Hsin et al., "ZCS Switched-Capacitor Bidirectional Converters with Secondary Output Power Amplifier for Biomedical Applications", Power Electronics Conference (IPEC) Jun. 21, 2010.
Nov. 27-30, 2007—Yuang-Shung Lee et al.,"A Novel QR ZCS Switched-Capacitor Bidirectional Converter", IEEE, 2007.
Antti Tolvanen et al., "Seminar on Solar Simulation Standards and Measurement Principles", May 9, 2006 Hawaii.
J.A. Eikelboom and M.J. Jansen, "Characterisation of PV Modules of New Generations—Results of tests and simulations", Jun. 2000.
Yeong-Chau Kuo et al., "Novel Maximum-Power-Point-Tracking Controller for Photovoltaic Energy Conversion System", IEEE Transactions on Industrial Electronics, vol. 48, No. 3, Jun. 2001.

(56) References Cited

OTHER PUBLICATIONS

C. Liu et al., "Advanced Algorithm for MPPT Control of Photovoltaic Systems", Canadian Solar Buildings Conference, Montreal, Aug. 20-24, 2004.
May 22, 1998—Chihchiang Hua and Chihming Shen, "Study of Maximum Power Tracking Techniques and Control of DC/DC Converters for Photovoltaic Power System", IEEE.
Tore Skjellnes et al., "Load sharing for parallel inverters without communication", Nordic Workshop in Power and Industrial Electronics, Aug. 12-14, 2002.
Jun. 23, 2000—Giorgio Spiazzi at el., "A New Family of Zero-Current-Switching Variable Frequency dc-dc Converters", IEEE.
Nayar, C.V., M. Ashari and W.W.L Keerthiphala, "A Grid Interactive Photovoltaic Uninterruptible Power Supply System Using Battery Storage and a Back up Diesel Generator", IEEE Transactions on Energy Conversion, vol. 15, No. 3, Sep. 2000, pp. 348?353.
Ph. Strauss et al., "AC coupled PV Hybrid systems and Micro Grids-state of the art and future trends", 3rd World Conference on Photovoltaic Energy Conversion, Osaka, Japan May 11-18, 2003.
Jul. 16-20, 2000—Nayar, C.V., abstract, Power Engineering Society Summer Meeting, 2000. IEEE, 2000, pp. 1280-1282 vol. 2.
Mar. 15, 2004—D. C. Martins et al., "Analysis of Utility Interactive Photovoltaic Generation System using a Single Power Static Inverter", Asian J. Energy Environ., vol. 5, Issue 2, (2004), pp. 115-137.
Rafael C. Beltrame et al., "Decentralized Multi String PV System With Integrated ZVT Cell", Congresso Brasileiro de Automática /12 a 16-setembro-2010, Bonito-MS.
Sergio Busquets-Monge et al., "Multilevel Diode-clamped Converter for Photovoltaic Generators With Independent Voltage Control of Each Solar Array", IEEE Transactions on Industrial Electronics, vol. 55, No. 7, Jul. 2008.
Soeren Baekhoej Kjaer et al., "A Review of Single-Phase Grid-Connected Inverters for Photovoltaic Modules", IEEE Transactions on Industry Applications, vol. 41, No. 5, Sep./Oct. 2005.
Office Action—JP 2011-539491—dated Mar. 26, 2013.
Supplementary European Search Report—EP08857456—dated Dec. 6, 2013.
Extended European Search Report—EP14151651.8—dated Feb. 25, 2014.
Iyomori H et al: "Three-phase bridge power block module type auxiliary resonant AC link snubber-assisted soft switching inverter for distributed AC power supply", INTELEC2003. 25th. International Telecommunications Energy Conference. Yokohama, Japan, Oct. 19-23, 2003; Tokyo, IEICE, JP, Oct. 23, 2003 (Oct. 23, 2003), pp. 650-656, XP031895550, ISBN: 978-4-88552-196-6.
Yuqing Tang: "High Power Inverter EMI characterization and Improvement Using Auxiliary Resonant Snubber Inverter", Dec. 17, 1998 (Dec. 17, 1998), XP055055241, Blacksburg, Virginia Retrieved from the Internet: URL:http: jscholar.lib.vt.edu/theses/available/etd-012299-165108/unrestricted/THESIS. PDF, [retrieved on Mar. 5, 2013].
Yoshida M et al: "Actual efficiency and electromagnetic noises evaluations of a single inductor resonant AC link snubber-assisted three-phase soft-switching inverter", INTELEC 2003. 25th. International Telecommunications Energy Conference. Yokohama, Japan, Oct. 19-23, 2003; Tokyo, IEICE, JP, Oct. 23, 2003 (Oct. 23, 2003), pp. 721-726, XP031895560, ISBN: 978-4-88552-196-6.
Third party observation—EP07874025.5—Mailing date: Aug. 6, 2011.
Extended European Search Report—EP 13152967.9—dated Aug. 28, 2014.
Extended European Search Report—EP 14159696—dated Jun. 20, 2014.
Gow Ja A et al.: "A Modular DC-DC Converter and Maximum Power Tracking Controller for Medium to Large Scale Photovoltaic Generating Plant" 8$^{th}$ European Conference on Power Electronics and Applications. Lausaane, CH, Sep. 7-9, 1999, EPE. European Conference on Power Electronics and Applications, Brussls: EPE Association, BE, vol. Conf. 8, Sep. 7, 1999, pp. 1-8, XP000883026.

Chihchiang Hua et al.: "Comparative Study of Peak Power Tracking Techniques for Solar Storage System" Applied Power Electronics Conference and Exposition, 1998. APEC '98. Conference Proceedings 1998, Thirteenth Annual Anaheim, CA USA Feb. 15-19, 1998, New York, NY, USA, IEEE, US, Feb. 15, 1998, pp. 679-685, XP010263666.
Matsuo H et al: "Novel Solar Cell Power Supply System Using the Multiple-input DC-DC Converter" 20$^{th}$ International telecommunications Energy Conference. Intelec '98 San Francisco, CA, Oct. 4-8, 1998, Intelec International Telecommunications Energy Conference, New York, NY: IEEE, US, Oct. 4, 1998, pp. 797-802, XP000896384.
Chihchiang Hua et al: "DSP-based controller application in battery storage of photovoltaic system" Industrial Electronics, Control, and Instrumentation, 1996, Proceedings of the 1996 IEEE IECON 22$^{nd}$ International Conference on Taipei, Taiwan Aug. 5-10, 1996, New York, NY, USA, IEEE, US, Aug. 5, 1996, pp. 1705-1710, XP010203239.
Hua C et al.: "Implementation of a DSP-Controlled Photovoltaic System with Peak Power Tracking" IEEE Transactions on industrial Electronics, IEEE, Inc. New York, US, vol. 45, No. 1, Feb. 1, 1998, pp. 99-107, XP000735209.
I. Weiss et al.: "A new PV system technology—the development of a magnetic power transmission from the PV module to the power bus" 16th European Photovoltaic Solar Energy Conference, vol. III, May 1-5, 2000, pp. 2096-2099, XP002193468 Glasgow,UK cited in the application.
Basso, Tim, "IEEE Standard for Interconnecting Distributed Resources With the Electric Power System," IEEE PES Meeting, Jun. 9, 2004.
Feb. 11, 2003—Boostbuck.com, "The Four Boostbuck Topologies," located at http://www.boostbuck.com/TheFourTopologies.html.
Apr. 2002—Gautam, Nalin K. et al., "An Efficient Algorithm to Simulate the Electrical Performance of Solar Photovoltaic Arrays," Energy, vol. 27, No. 4, pp. 347-361, 2002.
Nordmann, T. et al., "Performance of PV Systems Under Real Conditions," European Workshop on Life Cycle Analysis and Recycling of Solar Modules, The "Waste" Challenge, Brussels, Belgium, Mar. 18-19, 2004.
Wiles, John, "Photovoltaic Power Systems and the National Electrical Code: Suggested Practices," Sandia National Laboratories, document No. SAND2001-0674, Mar. 2001.
Hewes, J. "Relays," located at http://web.archive.org/web/20030816010159/www.kpsec.freeuk.com/components/relay.htm, Aug. 16, 2003.
Jan. 1, 1993—Definition of "remove" from Webster's Third New International Dictionary, Unabridged, 1993.
Jan. 1, 1993—Definition of "removable" from Webster's Third New International Dictionary, Unabridged, 1993.
Advanced Energy Group, "The Basics of Solar Power Systems," located at http://web.archive.org/web/20010331044156/http://www.solar4power.com/solar-power-basics.html, Mar. 31, 2001.
International Patent Application No. PCT/AU2005/001017, International Search Report and Written Opinion, dated Aug. 18, 2005.
Baek, Ju-Won et al., "High Boost Converter using Voltage Multiplier," 2005 IEEE Conference, IECON 05, pp. 567-572, Nov. 2005.
Wikimedia Foundation, Inc., "Electric Power Transmission," located at http://web.archive.org/web/20041210095723/en.wikipedia.org/wiki/Electric-power-transmission, Nov. 17, 2004.
Jacobsen, K.S., "Synchronized Discrete Multi-Tone (SDMT) Modulation for Cable Modems: Making the Most of the Scarce Reverse Channel Bandwidth," Conference Proceedings of Wescon/97, pp. 374-380, Nov. 4, 1997.
Loyola, L. et al., "A Multi-Channel Infrastructure based on DCF Access Mechanism for Wireless LAN Mesh Networks Compliant with IEEE 802.11," 2005 Asia-Pacific Conference on Communications, pp. 497-501, Oct. 5, 2005.
Jul. 12, 2019—European Search Report—EP 19170538.3.
Aug. 6, 2019—Notice of Opposition of European Patent 2232663—Fronius International GmbH.
Sep. 5, 2019—Notice of Opposition of European Patent 2549635—Huawei Technologies Co.
Sep. 5, 2019—Notice of Opposition of European Patent 2549635—Fronius International GmbH.

(56) References Cited

OTHER PUBLICATIONS

Solide Arbeit, Heinz Neuenstein, Dec. 2007.
Spitzenwirkungsgrad mit drei Spitzen, Heinz Neuenstien and Andreas Schlumberger, Jan. 2007.
Technical Information, Temperature Derating for Sunny Boy, Sunny Mini Central, Sunny Tripower, Aug. 9, 2019.
Prinout from Energy Matters online Forum, Jul. 2011.
Wayback Machine Query for Energy Matters Online Forum Jul. 2011.
Linear Technology Specification Sheet, LTC3780—"High Efficiency Synchronous, 4-Switch Buck-Boost Controller"—2005.
2005; Edelmoser, K.H. et al.; High Efficiency DC-to-AC Power Inverter with Special DC Interface; Professional Paper, ISSN 0005-1144, Automatika 46 (2005) 3-4, 143-148, 6 pages.
Sep. 4, 2019—Extended European Search Report—EP 19181247.8.
Storfer, Lior, "Enhancing Cable Modem TCP Performance," Texas Instruments Inc. white paper, Jul. 2003.
Philips Semiconductors, Data Sheet PSMN005-55B; PSMN005-55P N-channel logic trenchMOS transistor, Oct. 1999, Product specification, pp. 1-11.
International Preliminary Report on Patentability Issued in corresponding international application No. PCT/US04/16668, filed May 27, 2004.
International Application No. PCT/US13/27965, International Preliminary Examination Report, dated Sep. 2, 2014.
International Patent Application PCT/US13/027965, International Search Report and Written Opinion, dated Jun. 2, 2013.
International Application No. PCT/US12/44045, International Preliminary Examination Report, dated Jan. 28, 2014.
International Patent Application No. PCT/US2012/044045, International Search Report and Written Opinion, dated Jan. 2, 2013.
International Patent Application No. PCT/US2009/047734, International Search Report and Written Opinion, dated May 4, 2010.
Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.
International Patent Application No. PCT/US2010/029929, International Search Report and Written Opinion, dated Oct. 27, 2010.
Lowe, Electronics Basis: What is a Latch Circuit, http://www.dummies.com/how-to/content/electronics-basics-what-is-a-latch-circuit.html, from Electronics All-in-One for Dummies, Feb. 2012, downloaded Jul. 13, 2014.
International Patent Application No. PCT/US2011/020591, International Search Report and Written Opinion, dated Aug. 8, 2011.
International Patent Application No. PCT/US2011/033544, International Search Report and Written Opinion, dated Nov. 24, 2011.
J. Keller and B. Kroposki, titled, "Understanding Fault Characteristics of Inverter-Based Distributed Energy Resources", in a Technical Report NREL/TP-550-46698, published Jan. 2010, pp. 1 through 48.
International Patent Application No. PCT/US2008/081827, International Search Report and Written Opinion, dated Jun. 24, 2009.
International Patent Application No. PCT/US2010/046274 International Search Report and Written Opinion, dated Apr. 22, 2011.
International Patent Application No. PCT/US2011/033658, International Search Report and Written Opinion, dated Jan. 13, 2012.
International Patent Application No. PCT/US2011/029392, International Search Report and Written Opinion, dated Oct. 24, 2011.
European Patent Application No. 09829487.9, Extended Search Report, dated Apr. 21, 2011.
International Patent Application No. PCT/US2009/062536, International Search Report and Written Opinion, dated Jun. 17, 2010.
International Patent Application No. PCT/US2010/022915, International Search Report and Written Opinion, dated Aug. 23, 2010.
International Patent Application No. PCT/US2010/046272, International Search Report and Written Opinion, dated Mar. 31, 2011.
Exell et al., "The Design and Development of a Solar Powered Refrigerator", [retrieved on Feb. 13, 2013], Retrieved from the Internet <URL: http://www.appropedia.org/The_Design_and_Development_of_a_Solar_Powered_Refrigerator>, pp. 1-64.
"Development of Water-Lithium Bromide Low-Temperature Absorption Refridgerating Machine", 2002 Energy & Environment on Database on Noteworthy contributions for Science and Technology (Japan), Research Data (No. 1748) [online], [retrieved on Aug. 29, ]. Retrieved from the Internet: <URL: http://dbnstl.nii.ac.jp/english/detail/1748>, pp. 1-4.
Dictionary.com, "air conditioning" [online], [retrieved on Aug. 28, 2012], Retrieved from the Internet: <URL: http://dictionary.reference.com/browse/air+conditioning?s=t>, pp. 1-3.
International Patent Application No. PCT/US2010/029936, International Search Report and Written Opinion, dated Nov. 12, 2010.
International Patent Application No. PCT/US08/75127, International Search Report and Written Opinion, dated Apr. 28, 2009.
International Patent Application No. PCT/US09/35890, International Search Report and Written Opinion, dated Oct. 1, 2009.
European Patent Application No. 08845104.2, Extended Search Report, dated Jul. 31, 2014.
European Patent Application No. 11772811.3, Extended Search Report, dated Dec. 15, 2014.
International Patent Application No. PCT/US2008/082935, International Search Report and Written Opinion, dated Jun. 25, 2009.
Bhatnagar et al., Silicon Carbide High Voltage (400 V) Shottky Barrier Diodes, IEEE Electron Device Letters, vol. 13 (10) p. 501-503 Oct. 10, 1992.
Jun. 6-10, 2004—Rodriguez, C., and G. A. J. Amaratunga. "Dynamic stability of grid-connected photovoltaic systems." Power Engineering Society General Meeting, 2004. IEEE, pp. 2194-2200.
Nov. 3-Dec. 29, 1999—Kikuchi, Naoto, et al. "Single phase amplitude modulation inverter for utility interaction photovoltaic system." Industrial Electronics Society, 1999. IECON'99 Proceedings. The 25th Annual Conference of the IEEE. vol. 1. IEEE, 1999.
Oct. 7-12, 1990—Nonaka, Sakutaro, et al. "Interconnection system with single phase IGBT PWM CSI between photovoltaic arrays and the utility line." Industry Applications Society Annual Meeting, 1990., Conference Record of the 1990 IEEE.
Jun. 23-27, 2002—Calais, Martina, et al. "Inverters for single-phase grid connected photovoltaic systems—an overview." Power Electronics Specialists Conference, 2002. pesc 02. 2002 IEEE 33rd Annual. vol. 4. IEEE, 2002.
Jul. 1999—Marra, Enes Goncalves, and José Antenor Pomilio. "Self-excited induction generator controlled by a VS-PWM bidirectional converter for rural applications" Industry Applications, IEEE Transactions on 35.4 (1999): 877-883.
Apr. 2-5, 2002—Xiaofeng Sun, Weiyang Wu, Xin Li, Qinglin Zhao: A Research on Photovoltaic Energy Controlling System with Maximum Power Point Tracking:; Proceedings of the Power Conversion Conference-Osaka 2002 (Cat. No. 02TH8579) IEEE-Piscataway, NJ, USA, ISBN 0-7803-7156-9, vol. 2, p. 822-826, XP010590259: the whole document.
International Search Report for corresponding PCT/GB2005/050198 completed Jun. 28, 2006 by C. Wirner of the EPO.
Brunello, Gustavo, et al., "Shunt Capacitor Bank Fundamentals and Protection," 2003 Conference for Protective Relay Engineers, Apr. 8-10, 2003, pp. 1-17, Texas A&M University, College Station, TX, USA.
Cordonnier, Charles-Edouard, et al., "Application Considerations for Sensefet Power Devices," PCI Proceedings, May 11, 1987, pp. 47-65.
Jun. 9-11, 2003—Kotsopoulos, Andrew, et al., "Predictive DC Voltage Control of Single-Phase PV Inverters with Small DC Link Capacitance," IEEE International Symposium, Month Unknown, 2003, pp. 793-797.
Meinhardt, Mike, et al., "Multi-String-Converter with Reduced Specific Costs and Enhanced Functionality," Solar Energy, May 21, 2001, pp. 217-227, vol. 69, Elsevier Science Ltd.
Mar. 6-10, 2005—Kimball, et al.: "Analysis and Design of Switched Capacitor Converters"; Grainger Center for Electric Machinery and Electromechanics, University of Illinois at Urbana-Champaign, 1406 W. Green St, Urbana, IL 61801 USA, © 2005 IEEE; pp. 1473-1477.

(56) References Cited

OTHER PUBLICATIONS

Martins, et al.: "Interconnection of a Photovoltaic Panels Array to a Single-Phase Utility Line From a Static Conversion System"; Power Electronics Specialists Conference, 2000. PESC 00. 2000 IEEE 31st Annual; Jun. 18, 2000-Jun. 23, 2000; ISSN: 0275-9306; pp. 1207-1211, vol. 3.
International Search Report for corresponding PCT/GB2005/050197, completed Dec. 20, 2005 by K-R Zettler of the EPO.
Kjaer, Soeren Baekhoej, et al., "Design Optimization of a Single Phase Inverter for Photovoltaic Applications," IEEE 34th Annual Power Electronics Specialist Conference, Jun. 15-19, 2003, pp. 1183-1190, vol. 3, IEEE.
Jun. 23-27, 2002—Shimizu, Toshihisa, et al., "A Flyback-type Single Phase Utility Interactive Inverter with Low-frequency Ripple Current Reduction on the DC Input for an AC Photovoltaic Module System," IEEE 33rd Annual Power Electronics Specialist Conference 2002, pp. 1483-1488, vol. 3, IEEE.
Written Opinion of PCT/GB2005/050197, dated Feb. 14, 2006, Enecsys Limited.
Jun. 17-21, 2001—Yatsuki, Satoshi, et al., "A Novel AC Photovoltaic Module System based on the Impedance-Admittance Conversion Theory," IEEE 32nd Annual Power Electronics Specialists Conference, Month Unknown, 2001, pp. 2191-2196, vol. 4, IEEE.
Nov. 2, 20197—European Search Report—3567562.
Baocheng, DC to AC Inverter with Improved One Cycle Control, 2003.
Brekken, Utility-Connected Power Converter for Maximizing Power Transfer From a Photovoltaic Source While Drawing Ripple-Free Current, 2002.
Cramer, Modulorientierter Stromrichter Geht in Serienfertigung , SPVSE, 1994.
Cramer, Modulorientierter Stromrichter, Juelich, Dec. 31, 1995.
Cramer, String-Wechselrichter Machen Solarstrom Billiger, Elektronik, Sep. 1996.
Dehbonei, A Combined Voltage Controlled and Current Controlled "Dual Converter" for a Weak Grid Connected Photovoltaic System with Battery Energy Storage, 2002.
Engler, Begleitende Untersuchungen zur Entwicklung eines Multi-String-Wechselrichters, SPVSE, Mar. 2002.
Geipel, Untersuchungen zur Entwicklung modulorientierter Stromrichter Modulorientierter Stromrichter für netzgekoppelte Photovoltaik-Anlagen, SPVSE, 1995.
Hoor, DSP-Based Stable Control Loops Design for a Single Stage Inverter, 2006.
Isoda, Battery Charging Characteristics in Small Scaled Photovoltaic System Using Resonant DC-DC Converter With Electric Isolation, 1990.
Jones, Communication Over Aircraft Power lines, Dec. 2006/ Jan. 2007.
Kalaivani, A Novel Control Strategy for the Boost DC-AC Inverter, 2006.
Lee, Powering The Dream, IET Computing & Control Engineering, Dec. 2006/ Jan. 2007.
Lee, A Novel Topology for Photovoltaic Series Connected DC/DC Converter with High Efficiency Under Wide Load Range, Jun. 2007.
Lin, LLC DC/DC Resonant Converter with PLL Control Scheme, 2007.
Niebauer, Solarenergie Optimal Nutzen, Stromversorgung, Elektronik, 1996.
Rodrigues, Experimental Study of Switched Modular Series Connected DC-DC Converters, 2001.
Sanchis, Buck-Boost DC-AC Inverter: Proposal for a New Control Strategy, 2004.
Sen, A New DC-to-AC Inverter With Dynamic Robust Performance, 1998.
Shaojun, Research on a Novel Inverter Based on DC/DC Converter Topology, 2003.
Siri, Sequentially Controlled Distributed Solar-Array Power System with Maximum Power Tracking, 2004.
Walko, Poised for Power, IEE Power Engineer, Feb./ Mar. 2005.
White, Electiical Isolation Requirements In Power-Over-Ethernet (PoE) Power Sourcing Equipment (PSE), 2006.
Yu, Power Conversion and Control Methods for Renewable Energy Sources, May 2005.
Zacharias, Modularisierung in der PV-Systemtechnik-Schnittstellen zur Standardisierung der Komponenten, Institut für Solare Energieversorgungstechnik (ISET), 1996.
Dec. 24, 2019—CN Office Action—CN Application 201610946835.5.
International Search Report for corresponding PCT/GB2004/001965, completed Aug. 16, 2004 by A. Roider.
Mar. 5-9, 1995—Naik et al., A Novel Grid Interface for Photovoltaic, Wind-Electric, and Fuel-Cell Systems With a Controllable Power Factor or Operation, IEEE, 1995, pp. 995-998.
Petkanchin, Processes following changes of phase angle between current and voltage in electric circuits, Aug. 1999, Power Engineering Review, IEEE vol. 19, Issue 8, pp. 59-60.
Mumtaz, Asim, et al., "Grid Connected PV Inverter Using a Commercially Available Power IC," PV in Europe Conference, Oct. 2002, 3 pages, Rome, Italy.
Koutroulis, Eftichios, et al., "Development of a Microcontroller-Based, Photovoltaic Maximum Power Point Tracking Control System," IEEE Transactions on Power Electronics, Jan. 2001, pp. 46-54, vol. 16, No. 1, IEEE.
European Search Report—EP App. 14159457.2—dated Jun. 12, 2015.
European Search Report and Written Opinion—EP Appl. 12150819.6—dated Jul. 6, 2015.
Alonso, O. et al. "Cascaded H-Bridge Multilevel Converter for Grid Connected Photovoltaic Generators With Independent Maximum Power Point Tracking of Each Solar Array." IEEE 34th Annual Power Electronics Specialists Conference. vol. 2, Jun. 15, 2003.
Chinese Office Action—CN Appl. 201280006369.2—dated Aug. 4, 2015.
Chinese Office Action—CN Appl. 201210253614.1—dated Aug. 18, 2015.
Extended European Search Report, EP Application 04753488.8, dated Apr. 29, 2015.
International Search Report from PCT/US04/16668, form PCT/ISA/220, filing date May 27, 2004.
Office Action U.S. Appl. No. 13/785,857, dated Jun. 6, 2013.
Partial Extended European Search Report, EP Application 04753488.8, dated Feb. 2, 2015.
The International Search Report (Form PCT /ISA/220) Issued in corresponding international application No. PCT/US04/16668, filed May 27, 2004.
International Search Report—PCT/US2004/016668, form PCT/ISA/220—filing date May 27, 2004—dated Jan. 19, 2005.
Written Opinion of the International Searching Authority—PCT/US2004/016668, form PCT/ISA/220—filing date May 27, 2004—dated Jan. 19, 2005.
Extended European Search Report—EP Appl. 04753488.8—dated Apr. 29, 2015.
Supplementary Partial European Search Report—EP Appl. 04753488.8—dated Feb. 2, 2015.
U.S. Office Action—U.S. Appl. No. 13/785,857—dated Jun. 6, 2013.
European Office Action—EP Appl. 09725443.7—dated Aug. 18, 2015.
Definition of Isomorphism by Merriam-Webster, <http://www.merriaum-webster.com/dictionary/isomorphism, dated Oct. 20, 2015.
Definition of Isomorphic by Merriam-Webster, <http://www.merriam-webster.com/dictionary/isomorphic, dated Oct. 20, 2015.
Chinese Office Action—CN Appl. 201110349734.7—dated Oct. 13, 2015.
Chinese Office Action—CN Appl. 201210007491.3—dated Nov. 23, 2015.
European Office Action—EP Appl. 12176089.6—dated Dec. 16, 2015.
Chinese Office Action—CN Appl. 201310035223.7—dated Dec. 29, 2015.
Chinese Office Action—CN Application 201210334311.2—dated Jan. 20, 2016.

(56) References Cited

OTHER PUBLICATIONS

European Search Report—EP Appl. 13800859.4—dated Feb. 15, 2016.
Chinese Office Action—CN App. 201310035221.8—dated Mar. 1, 2016.
PCT/2008/058473 International Preliminary Report, 6 pages, dated Nov. 2, 2009.
International Search Report and Written Opinion, WO 2010080672, dated Aug. 19, 2010.
PCT/US2010/045352 International Search Report and Written Opinion; 12 pages; dated Oct. 26, 2010.
International Search Report and Written Opinion dated Feb. 6, 2009,. In counteprart PCT/US2008/008451, 13 pages.
European Search Report: dated Jan. 10, 2013 in corresponding EP application No. 09838022.3, 7 pages.
D. Ton and W. Bower; Summary Report of the DOE High-Tech InverterWorkshop; Jan. 2005.
First Action Interview Pre-Interview Communication from U.S. Appl. No. 13/174,495 dated Jun. 18, 2014, 7 pgs.
Johnson et al., "Arc-fault detector algorithm evaluation method utilizing prerecorded arcing signatures", Photovoltaic Specialists Conference (PVSC), Jun. 2012.
Aug. 6, 2007—Philippe Welter, et al. "Electricity at 32 kHz," Photon International, The Photovoltaic Magazine, Http://www.photon-magazine.com/archiv/articles.aspx?criteria=4&HeftNr=0807&Title=Elec . . . printed May 27, 2011).
PCT/US2009/069582 Int. Search Report—dated Aug. 19, 2010.
Chinese Office Action—CN Appl. 201210007491.3—dated Apr. 25, 2016.
CN Office Action—CN Appl. 201310004123.8—dated May 5, 2016.
Law et al., "Design and Analysis of Switched-Capacitor-Based Step-Up Resonant Converters," IEEE Transactions on Circuits and Systems, vol. 52, No. 5, published May 2005.
CN Office Action—CN Appl. 201310066888.4—dated May 30, 2016.
European Search Report—EP Appl. 13152966.1—dated Jul. 21, 2016.
European Search Report—EP Appl. 12183811.4—dated Aug. 4, 2016.
European Notice of Opposition—EP Patent 2374190—dated Jul. 19, 2016.
"Es werde Dunkelheit. Freischaltung von Solarmodulen im Brandfall"—"Let there be Darkness: Quality control of Solar Modules in Case of Fire"; PHOTON, May 2005, 75-77, ISSN 1430-5348, English translation provided.
Chinese Office Action—CN Appl. 201380029450.7—dated Jul. 28, 2016.
Chinese Office Action—CN Appl. 201310035221.8—dated Aug. 11, 2016.
Zhou, Wilson and Theo Phillips—"Industry's First 4-Switch Buck-Boost Controller Achieves Highest Efficiency Using a Single Inducutor—Design Note 369"—Linear Technology Corporation—www.linear.com—2005.
"Micropower Synchronous Buck-Boost DC/DC Converter"—Linear Technology Corporation—www.linear.com/LTC3440—2001.
Mar. 5-9, 1995—Caricchi, F. et al.—20 kW Water-Cooled Prototype of a Buck-Boost Bidirectional DC-DC Converter Topology for Electrical Vehicle Motor Drives—University of Rome—IEEE 1995—pp. 887-892.
Roy, Arunanshu et al.—"Battery Charger using Bicycle"—EE318 Electronic Design Lab Project Report, EE Dept, IIt Bombay, Apr. 2006.
Jun. 20-25, 2004—Viswanathan, K. et al.—Dual-Mode Control of Cascade Buck-Boost PFC Converter—35th Annual IEEE Power Electronics Specialists Conference—Aachen, Germany, 2004.
Zhang, Pei et al.—"Hardware Design Experiences in ZebraNet"—Department of Electrical Engineering, Princeton University—SenSys '04, Nov. 3-5, 2004.

"High Efficiency, Synchronous, 4-Switch Buck-Boost Controller"—Linear Technology Corporation—www.linear.com/LTC3780—2005.
May 19-24, 2002—Chomsuwan, Komkrit et al. "Photovoltaic Grid-Connected Inverter Using Two-Switch Buck-Boost Converter"—Department of Electrical Engineering, King Mongkut's Institute of Technology Ladkrabang, Thailand, National Science and Technology Development Agency, Thailand—IEEE—2002.
Midya, Pallab et al.—"Buck or Boost Tracking Power Converter"—IEEE Power Electronics Letters, vol. 2, No. 4—Dec. 2004.
Chinese Office Action—CN Appl. 201510111948.9—dated Sep. 14, 2016.
Chinese Office Action—CN Appl. 201310066888.4—dated Nov. 2, 2016.
"Power-Switching Converters—the Principle, Simulation and Design of the Switching Power (the Second Edition)", Ang, Oliva, et al., translated by Xu Dehong, et al., China Machine Press, Aug. 2010, earlier publication 2005.
European Notice of Opposition—EP Patent 2092625—mailed Nov. 29, 2016.
Mar. 8, 2003—Vishay Siliconix "Si 7884DP—n-Channel 40-V (D-S) Mosfet" (2003).
Chinese Office Action—CN 201510423458.2—dated Jan. 3, 2017 (english translation provided).
Chinese Office Action—CN 201410098154.9—dated Mar. 3, 2017 (english translation provided).
European Search Report—EP Appl. 13150911.9—dated Apr. 7, 2017.
Howard et al., "Relaxation on a Mesh: a Formalism for Generalized Localization." Proceedings of the IEEE/RSJ International Conference on Intelligent Robots and Systems (IROS 2001). Wailea, Hawaii, Oct. 2001.
Chinese Office Action and Search Report—CN 201510578586.4—dated Apr. 19, 2017.
Jul. 13, 2017—Chinese Office Action—CN201210007491.3.
Jul. 31, 2014—Huimin Zhou et al.—"PV Balancers: Concept, Architectures, and Realization"—IEEE Transactions on Power Electronics, vol. 30, No. 7, pp. 3479-3487.
Sep. 15, 2012—Huimin Zhou et al.—"PV balancers: Concept, architectures, and realization"—Energy Conversion Congress and Exposition (ECCE), 2012 IEEE, IEEE pp. 3749-3755.
Jul. 17, 2017—International Search Report—PCT/US2017/031571.
Aug. 4, 2017—European Search Report—EP 17165027.
Jul. 19, 2016—Notice of Opposition—EP 2374190—EP App No. 08878650.4.
Sep. 28, 2017—European Office Action—EP 08857835.6.
Nov. 2, 2017—EP Search Report App No. 13157876.7.
Nov. 11, 2017—EP Search Report—App No. 17171489.2.
Dec. 14, 2017—EP Search Report App No. 17188362.2.
Dec. 15, 2017—EP Search Report App No. 17188365.5.
Jun. 23, 2000; Bascope, G.V.T. Barbi, I; "Generation of Family of Non-isolated DC-DC PWM Converters Using New Three-state Switching Cells"; 2000 IEEE 31st Annual Power Electronics Specialists Conference in Galway, Ireland; vol. 2.
Jan. 20, 2005; Duncan, Joseph, A Global Maximum Power Point Tracking DC-DC Converter, Massachussetts Institute of Technology, Dept. of Eleclrical Engineering and Computer Science Dissertation; 8 pages.
Dec. 19, 2005; Edelmoser, K.H. et al.; High Efficiency DC-to-AC Power Inverter with Special DC Interface Professional Paper, ISSN 0005-1144, Automatika 46 (2005) 3-4, 143-148, 6 pages.
2006; Esmaili, Gholamreza; "Application of Advanced Power Electomics in Renewable Energy Sources and Hygrid Generating Systems" Ohio State Univerty, Graduate Program in Electrical and Computer Engineering, Dissertation. 169 pages.
Nov. 13, 2007; Gomez, M; "Consulting in the Solar Power Age," IEEE-CNSV: Consultants' Network of Scilion Valley; 30 pages.
Jul. 25, 1995-Jun. 30, 1998; Kern, G; "SunSine (TM)300: Manufacture of an AC Photovoltaic Module," Final Report, Phases I & II; National Renewable Energy Laboratory, Mar. 1999; NREL-SR-520-26085; 33 pages.

(56) References Cited

OTHER PUBLICATIONS

May 1, 2000; Kroposki, H. Thomas and Witt, B & C; "Progress in Photovoltaic Components and Systems," National Renewable Energy Laboratory; NREL-CP-520-27460; 7 pages.
Jan. 22-23, 1998 Oldenkamp, H. et al.; "AC Modules: Past, Present and Future" Workshop Installing the Solar Solution Hatfield, UK; 6 pages.
Linear Technology Specification Sheet, LTC3443—"High Current Micropower 600kHz Synchronous Buck-Boost DC/DC Converter"—2004.
Jan. 1, 2005; Linear Technology Specification Sheet, LTC3780—"High Efficiency Synchronous, 4-Switch Buck-Boost Controller".
Apr. 22, 2004—MICREL—MIC2182 High Efficiency Synchronous Buck Controller.
Apr. 1972—Methods for Utilizing Maximum Power From a Solar Array—Decker, DK.
2000—Evaluating MPPT converter topologies using a MATLAB PV model—Walker, Geoffrey.
Jun. 30, 2008—Wang, Ucilia; Greentechmedia; "National Semi Casts Solarmagic"; www.greentechmedia.com; 3 pages; accessed Oct. 24, 2017.
Sep. 2004; Yuvarajan, S; Dchuan Yu; Shanguang, Xu; "A Novel Power Converter for PHotovoltaic Applications," Journal of Power Sources; vol. 135, No. 1-2, pp. 327-331.
Jun. 1998—Stem M., et al., "Development of a Low-Cost Integrated 20-kW-AC Solar Tracking Subarray for Grid-Connected PV Power System Applications—Final Technical Report"—National Renewable Energy Laboratory; 41 pages.
1997; Verhoeve, C.W.G., et al., "Recent Test Results of AC_Module inverters," Netherlands Energy Research Foundation ECN, 1997; 3 pages.
Oct. 3-7, 2004; Nobuyoshi, M. et al., "A Controlling Method for Charging Photovoltaic Generation Power Obtained by a MPPT Control Method to Series Connected Ultra-Electric Double Layer Capacitors"—Industry Application Conference, 2004. 39th IAS Annual Meeting. Conference Record of the 2004 IEEE.
Feb. 23-27, 1992—Miwa, Brett et al., "High Efficiency Power Factor Correction Using Interleaving Techniques"—Applied Power Electronics Conference and Exposition, 1992. APEC '92. Conference Proceedings 1992., Seventh Annual.
QT Technical Application Papers, "ABB Circuit-Breakers for Direct current Applications", ABB SACE S.p.A., An ABB Group Company, L.V. Breakers, Via Baioni, 35, 24123 Bergamo-Italy, Tel.: +39 035.395.111—Telefax: +39035.395.306-433, Sep. 2007.
Woyte, et al., "Mains Monitoring and Protection in a European Context", 17th European Photovoltaic Solar Energy Conference and Exhibition, Munich, Germany, Oct. 22-26, 2001, Achim, Woyte, et al., pp. 1-4.
"Implementation and testing of Anti-Islanding Algorithms for IEEE 929-2000 Compliance of Single Phase Photovoltaic Inverters", Raymond M. Hudson, Photovoltaic Specialists Conference, 2002. Conference Record of the Twenty-Ninth IEEE, May 19-24, 2002.
Fairchild Semiconductor, Application Note 9016, IGBT Basics 1, by K.S. Oh Feb. 1, 2001.
"Disconnect Switches in Photovoltaic Applications", ABB, Inc., Low Voltage Control Products & Systems, 1206 Hatton Road, Wichita Falls, TX 86302, Phone 888-385-1221, 940-397-7000, Fax: 940-397-7085, 1SXU301197B0201, Nov. 2009.
Walker, "A DC Circuit Breaker for an Electric Vehicle Battery Pack", Australasian Universities Power Engineering Conference and IEAust Electric Energy Conference, Sep. 26-29, 1999.
Combined Search and Examination Report for GB1018872.0 dated Apr. 15, 2011, 2 pages.
International Search Report and Opinion of International Patent Application PCT/2009/051221, dated Oct. 19, 2009.
International Search Report and Opinion of International Patent Application PCT/2009/051222, dated Oct. 7, 2009.
Communication in EP07874025.5 dated Aug. 17, 2011.
IPRP for PCT/IB2008/055095 dated Jun. 8, 2010, with Written Opinion.
ISR for PCT/IB2008/055095 dated Apr. 30, 2009.
ISR for PCT/IL07/01064 dated Mar. 25, 2008.
IPRP for PCT/IB2007/004584 dated Jun. 10, 2009, with Written Opinion.
IPRP for PCT/IB2007/004591 dated Jul. 13, 2010, with Written Opinion.
IPRP for PCT/IB2007/004643 dated Jun. 10, 2009, with Written Opinion.
Written Opinion for PCT/IB2008/055092 submitted with IPRP dated Jun. 8, 2010.
IPRP for PCT/US2008/085754 dated Jun. 8, 2010, with Written Opinion dated Jan. 21, 2009.
IPRP for PCT/US2008/085755 dated Jun. 8, 2010, with Written Opinion dated Jan. 20, 2009.
IPRP for PCT/IB2009/051221 dated Sep. 28, 2010, with Written Opinion.
IPRP for PCT/IB2009/051222 dated Sep. 28, 2010, with Written Opinion.
IPRP for PCT/IB2009/051831 dated Nov. 9, 2010, with Written Opinion.
IPRP for PCT/US2008/085736 dated Jun. 7, 2011, with Written Opinion.
IPRP for PCT/IB2010/052287 dated Nov. 22, 2011, with Written Opinion.
ISR for PCT/IB2010/052413 dated Sep. 7, 2010.
UK Intellectual Property Office, Application No. GB1109618.7, Patents Act 1977, Examination Report Under Section 18(3), dated Sep. 16, 2011.
UK Intellectual Property Office, Patents Act 1977: Patents Rules Notification of Grant: Patent Serial No. GB2480015, dated Nov. 29, 2011.
Walker, et al. "PV String Per-Module Maximum Power Point Enabling Converters", School of Information Technology and Electrical Engineering The University of Queensland, Sep. 28, 2003.
Walker, "Cascaded DC-DC Converter Connection of Photovoltaic Modules", 33rd Annual IEEE Power Electronics Specialists Conference. PESC 2002. Conference Proceedings. CAIRNS, Queensland, Australia, Jun. 23-27, 2002; [Annual Power Electronics Specialists Conference], New York, NY: IEEE US, vol. 1, Jun. 23, 2002, pp. 24-29, XP010596060 ISBN: 978-0-7803-7262-7, figure 1.
Baggio, "Quasi-ZVS Activity Auxiliary Commutation Circuit for Two Switches Forward Converter", 32nd Annual IEEE Power Electronics Specialists Conference. PESC 2001. Conference Proceedings. Vancouver, Canada, Jun. 17-21, 2001; [Annual Power Electronics Specialists Conference] New York, NY: IEEE, US.
Ilic, "Interleaved Zero-Current-Transition Buck Converter", IEEE Transactions on Industry Applications, IEEE Service Center, Piscataway, NJ, US, vol. 43, No. 6, Nov. 1, 2007, pp. 1619-1627, XP011197477 ISSN: 0093-9994, pp. 1619-1922.
Lee: "Novel Zero-Voltage-Transition and Zero-Current-Transition Pulse-Width-Modulation Converters", Power Electronics Specialists Conference, 1997, PESC '97, Record, 28th Annual IEEE St. Louis, MO, USA, Jun. 22-27, 1997, New York, NY, USA IEEE, US, vol. 1, Jun. 22, 1997, pp. 233-239, XP010241553, ISBN: 978-0-7803-3840-1, pp. 233-236.
Sakamoto, "Switched Snubber for High-Frequency Switching Converters", Electronics & Communications in Japan, Part 1—Communications, Wiley, Hoboken, NJ, US, vol. 76, No. 2, Feb. 1, 1993, pp. 30-38, XP000403018 ISSN: 8756-6621, pp. 30-35.
Duarte, "A Family of ZVX-PWM Active-Clamping DC-to-DC Converters: Synthesis, Analysis and Experimentation", Telecommunications Energy Conference, 1995, INTELEC '95, 17th International The Hague, Netherlands, Oct. 29-Nov. 1, 1995, New York, NY, US, IEEE, US, Oct. 29, 1995, pp. 502-509, XP010161283 ISBN: 978-0-7803-2750-4 p. 503-504.
IPRP for PCT/IL2007/001064 dated Mar. 17, 2009, with Written Opinion dated Mar. 25, 2008.
IPRP for PCT/IB2007/004586 dated Jun. 10, 2009, with Written Opinion.
Gao, et al., "Parallel-Connected Solar PV System to Address Partial and Rapidly Fluctuating Shadow Conditions", IEEE Transactions on Industrial Electronics, vol. 56, No. 5, May 2009, pp. 1548-1556.
IPRP PCT/IB2007/004610—date of issue Jun. 10, 2009.

(56) References Cited

OTHER PUBLICATIONS

Extended European Search Report—EP12176089.6—dated Nov. 8, 2012.
Gwon-Jong Yu et al: "Maximum power point tracking with temperature compensation of photovoltaic for air conditioning system with fuzzy controller", 19960513; 19960513-19960517, May 13, 1996 ( May 13, 1996), pp. 1429-1432, XP010208423.
Extended European Search Report—EP12177067.1—dated Dec. 7, 2012.
GB Combined Search and Examination Report—GB1200423.0—dated Apr. 30, 2012.
GB Combined Search and Examination Report—GB1201499.9—dated May 28, 2012.
GB Combined Search and Examination Report—GB1201506.1—dated May 22, 2012.
"Study of Energy Storage Capacitor Reduction for Single Phase PWM Rectifier", Ruxi Wang et al., Virginia Polytechnic Institute and State University, Feb. 2009.
"Multilevel Inverters: A Survey of Topologies, Controls, and Applications", José Rodriguez et al., IEEE Transactions on Industrial Electronics, vol. 49, No. 4, Aug. 2002.
Extended European Search Report—EP 08878650.4—dated Mar. 28, 2013.
Satcon Solstice—Satcon Solstice 100 kW System Solution Sheet—2010.
John Xue, "PV Module Series String Balancing Converters", University of Queensland—School of Information Technology & Electrical Engineering, Nov. 6, 2002.
Robert W. Erickson, "Future of Power Electronics for Photovoltaics", IEEE Applied Power Electronics Conference, Feb. 2009.

\* cited by examiner

1200

TESTING OF A PHOTOVOLTAIC PANEL

CROSS REFERENCE TO RELATED APPLICATIONS

The present application is a divisional of U.S. patent application Ser. No. 13/015,219, filed on Jan. 27, 2011, which is a continuation-in-part application of U.S. patent application Ser. No. 12/314,115 filed on Dec. 4, 2008, (now issued as U.S. (Pat. No. 8,324,921), which is a Non-Provisional of U.S. Provisional Application 61/039,050 filed Mar. 24, 2008 and U.S. Provisional 60/992,589 filed Dec. 5, 2007, the disclosures of which are included herein by reference.

TECHNICAL FIELD

The present invention relates to production testing of photovoltaic panels, and more specifically to testing of photovoltaic panels which include integrated circuitry.

DESCRIPTION OF RELATED ART

Current voltage (IV) characteristics of a conventional photovoltaic panel are measured using a flash tester. The flash tester measures electrical current characteristics of a photovoltaic panel during a single flash of light of duration typically within one millisecond emitted by the flash lamp. The measurement procedure is based on known properties of a reference photovoltaic panel which has been independently calibrated in an external laboratory. The external laboratory has determined accurately the short circuit current corresponding to standard test conditions (STC) using an AM1.5G spectrum. AM1.5G approximates a standard spectrum of sunlight at the Earth's surface at sea level at high noon in a clear sky as 1000 W/m2. "AM" stands for "air mass" radiation. The 'G' stands for "global" and includes both direct and diffuse radiation. The number "1.5" indicates that the length of the path of light through the atmosphere is 1.5 times that of the shorter path when the sun is directly overhead. During flash testing homogeneity of irradiance over the photovoltaic panel is obtained by a 6-meter distance between the flash lamp and the photovoltaic panel.

Reference is now made to FIG. 2 which illustrates a conventional flash testing system 7. The flash testing system 7 includes a photovoltaic panel 10, flash tester 17 and a flash lamp 16, placed inside a closed lightproof cabin 19 which is painted black inside. Alternatively, black curtains minimize the intensity of reflections towards photovoltaic panel 10 from the interior surfaces of the cabin. The homogeneity of irradiance over area of photovoltaic panel 10 is measured by placing an irradiance sensor in various positions of the measurement plane. During the flash testing procedure, a flash tester 17 is connected to the output of photovoltaic panel 10. The measurement procedure starts with a flash test of a reference photovoltaic panel. The short circuit current is measured during an irradiance corresponding to AM1.5G. The reference photovoltaic panel is then exchanged for the test photovoltaic panel. During a subsequent flash, the irradiance sensor triggers a current-voltage (IV) measurement procedure at the same irradiance as during the measurement of the reference photovoltaic panel.

Conventional photovoltaic panels are typically connected together in series to form strings and the strings are optionally connected in parallel. The combined outputs of the connected photovoltaic panels are typically input to an inverter which converts the generated direct current voltage to alternating current of the grid. Recently, photovoltaic panels have been designed or proposed with integrated circuitry.

Reference is now made to FIG. 1 which illustrates schematically a photovoltaic system 14 with a circuit or electronic module 12 integrated with a photovoltaic panel 10. The term "electronic module" as used herein refers to electronic circuitry integrated at the output of the photovoltaic panel. The "electronic module" itself may be of the prior art or not of the prior art. A representative reference (Cascade DC-DC Converter Connection of Photovoltaic Modules, G. R. Walker and P. C. Sernia, *Power Electronics Specialists Conference*, 2002. (*PESC*02), Vol. 1 IEEE, Cairns, Australia, pp. 24-29) proposes use of DC-DC converters integrated with the photovoltaic panels. The DC-DC converter integrated with the photovoltaic panel is an example of an "electronic module". Other examples of "electronic modules" include, but are not limited to, DC-AC inverters and other power conditioning electronics, as well as sensing and monitoring electronics.

Another reference of the present inventors which describes an example of photovoltaic system 14 including photovoltaic panel 10 integrated with electronic module 12 is US20080143188, entitled "Distributed Power Harvesting Systems Using DC Power Sources".

The "electronic module" herein may have electrical functionality, for instance for improving the electrical conversion efficiency of photovoltaic system 14. Alternatively, "electronic module" as used herein may have another functionality unrelated to electrical performance. For instance in a co-pending patent application entitled, "Theft detection and Prevention in a Power Generation System", the function of electronic module 12 is to protect photovoltaic system 12 from theft.

Since a standard flash test cannot typically be performed on panel 10 after integration with electronic module 12, for instance because the presence of module 12 affects the results of the standard test, it would be advantageous to have a system and method for flash testing of photovoltaic system The term "photovoltaic panel" as used herein includes any of: one or more solar cells, cells of multiple semiconductor junctions, solar cells connected in different ways (e.g. serial, parallel, serial/parallel), of thin film and/or bulk material, and/or of different materials.

BRIEF SUMMARY

According to aspects of the present invention there is provided a method for testing a photovoltaic panel connected to an electronic module. The electronic module includes an input attached to the photovoltaic panel and a power output. The method activates a bypass to the electronic module. The bypass provides a low impedance path between the input and the output of the electronic module. A current is injected into the electronic module thereby compensating for the presence of the electronic module during the testing. The current may be previously determined by measuring a circuit parameter of the electronic module. The circuit parameter may be impedance, inductance, resistance or capacitance. The electronic module is preferably permanently attached to the photovoltaic panel. The activation of the bypass may be by externally applying either an electromagnetic field or a magnetic field. The electronic module may be either a DC to DC converter, DC to AC converter or maximum power point tracking converter. The electronic module performs maximum power point tracking to maximize power at either an input or an output of the electronic module. The bypass may include a reed switch, a reed relay switch, a solid state switch or a fuse. The bypass may include a fuse 30 which has a power supply connected direct across the fuse where a current flow from the power supply, de-activates the bypass by blowing the fuse. The bypass may typically include a solid state switch. The bypass may further include a fuse and a parallel connected switch which is disposed between and connected in parallel with the photovoltaic panel and the electronic module. A power supply unit is typically connected across the outputs of the electronic module and closing the switch, provides a low impedance path across the fuse, thereby blowing the fuse. The parallel-connected switch may be a silicon controlled rectifier, reed switch, solid state switch or reed relay. Blowing the fuse typically de-activates the bypass of the electronic module. De-activating the bypass is preferably performed by communicating with the electronic module.

According to aspects of the present invention there is provided a device for testing a photovoltaic panel system including a photovoltaic panel connected to an electronic module. The electronic module includes at least one input attached to the photovoltaic panel and at least one power output. The device includes a bypass operatively attached to the electronic module. The bypass provides a low impedance path between the at least one power output and the at least one input of the electronic module. A current injector may be operatively attached to the electronic module. A circuit parameter analyzer is operatively attached to the electronic module. The circuit parameter analyzer is adapted to measure a circuit parameter of the electronic module. A processor may be operatively attached to the circuit parameter analyzer. The processor is preferably configured to program the programmable current injector based on the circuit parameter. The current may be determined by measuring a circuit parameter of the electronic module. The circuit parameter may be impedance, inductance, resistance or capacitance.

The bypass may further include a bypass component which has at least one switch and at least one fuse. The bypass component typically connects the at least one power output and the at least one input of the electronic module. The at least one switch may be a magnetically activated reed switch, an electro-magnetically activated reed relay switch or a solid state switch. The electronic module typically performs maximum power point tracking. The electronic module may perform either: DC to DC conversion or DC to AC inversion.

According to yet another aspect of the present invention there is provided a method for a device used whilst testing a photovoltaic panel system. The photovoltaic panel system includes a photovoltaic panel connected to an electronic module. The electronic module includes at least one input attached to the photovoltaic panel and at least one power output. The device typically includes a current injector operatively attached to the least one power output and to a test module; a circuit parameter analyzer operatively attached to the electronic module and a processor operatively attached to the circuit parameter analyzer. The method typically attaches a bypass to the electronic module. The bypass preferably provides a low impedance path between the at least one power output and the at least one input of the electronic module. Prior to testing the panel a circuit parameter of the least one power output is measured, followed by the current injector being programmed with a parameter based on the measuring. Injecting current and triggering the test module is typically performed simultaneously, thereby compensating for the presence of the electronic module during the triggering.

The foregoing and/or other aspects will become apparent from the following detailed description when considered in conjunction with the accompanying drawing figures.

BRIEF DESCRIPTION OF THE DRAWINGS

The invention is herein described, by way of example only, with reference to the accompanying drawings, wherein.

Figure 1:
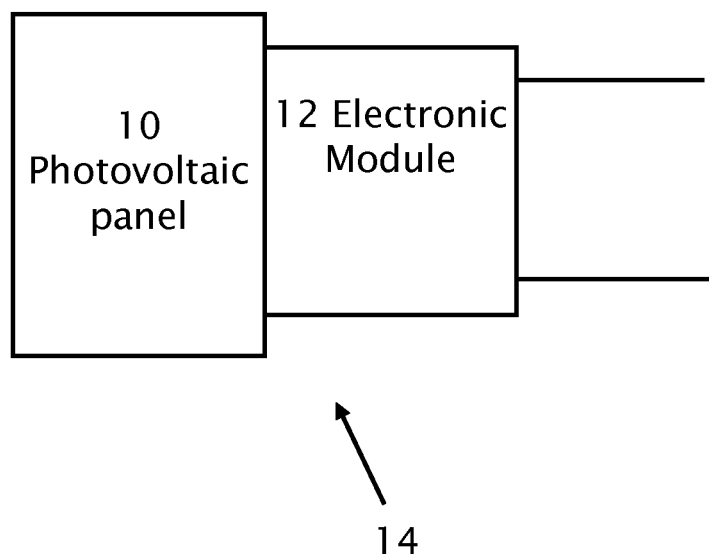
FIG. 1 illustrates an electrical power generation system including a photovoltaic panel and electronic module.
Figure 2:
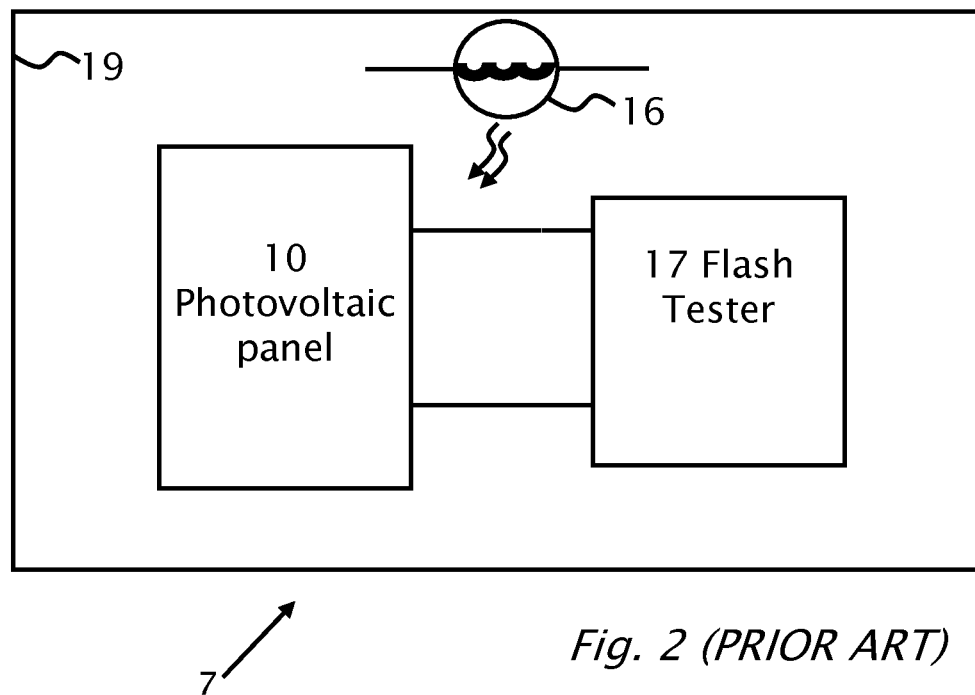
FIG. 2 illustrates a flash test module of the prior art.

The foregoing and/or other aspects will become apparent from the following detailed description when considered in conjunction with the accompanying drawing figures.

DETAILED DESCRIPTION

Reference will now be made in detail to embodiments of the present invention, examples of which are illustrated in the accompanying drawings; wherein like reference numerals refer to the like elements throughout. The embodiments are described below to explain the present invention by referring to the figures.

Reference is now made back to FIG. 1 which illustrates electrical power generation system 14, including photovoltaic panel 10 connected to electronic module 12. In some embodiments of the present invention, electronic module 12 is "permanently attached" to photovoltaic panel 10. In other embodiments of the present invention, electronic module is integrated with photovoltaic panel 10 but is not "permanently attached" to photovoltaic panel 10. The term "permanently attached" as used herein refers to a method or device for attachment such that physical removal or attempt thereof, e.g. of electronic module 12 from photovoltaic panel 10, would result in damage, e.g. to electronic module 12 and/or panel 10. Any mechanism known in the art for "permanently attaching" may be applied in different embodiments of the present invention. When electronic module 12 is permanently attached to the photovoltaic panel 10, the operation of photovoltaic panel 10 ceases or connections thereof are broken on attempting to remove electronic module 12 from photovoltaic panel 10. One such mechanism for permanently attaching uses a thermoset adhesive, e.g. epoxy based resin, and hardener.

Figure 3:
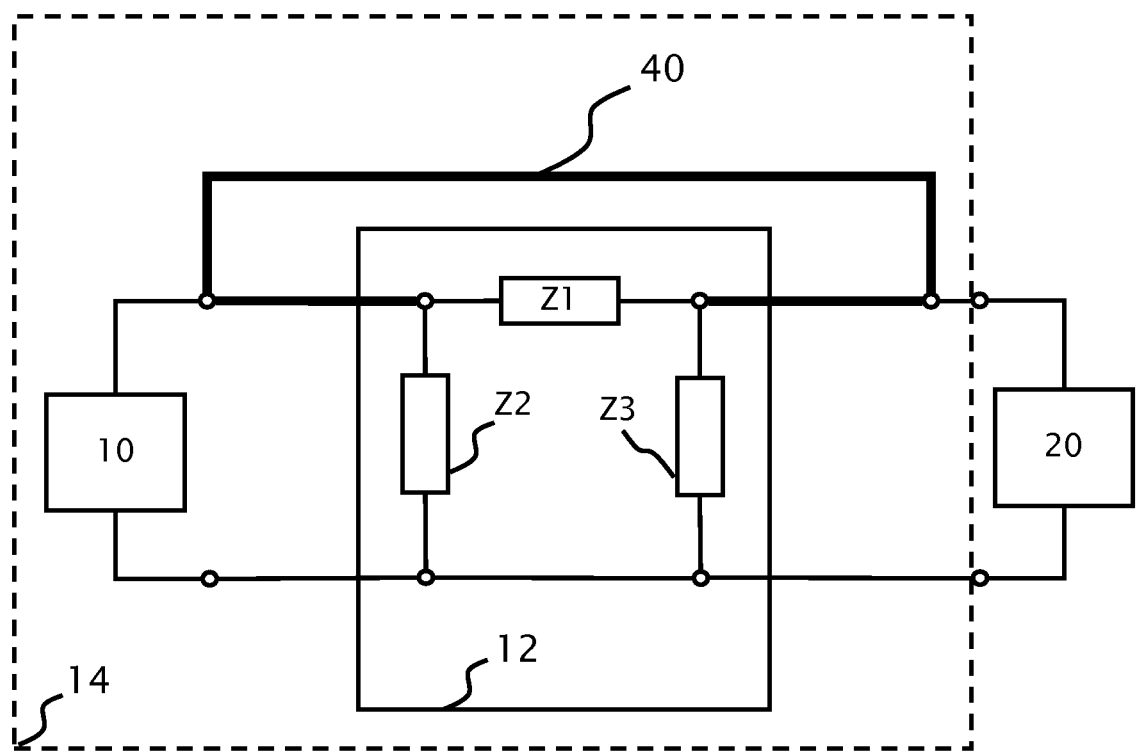
FIG. 3 illustrates a general equivalent circuit, representing the electronic module shown in FIGS. 1 and 2 with a bypass applied, according to a feature of the present invention.

Referring to FIG. 3, an example of electronic module 12 is illustrated in more detail. Electronic module 12 connects photovoltaic panel 10 and test module 20. Impedance Z1 is the series equivalent impedance of electronic module 12. Impedance Z2 is the equivalent input impedance of electronic module 12. Impedance Z3 is the equivalent output impedance of electronic module 12. Bypass link 40 when applied between the output of photovoltaic panel 10 and the input of test module 20 eliminates the effects of series equivalent impedance Z1 during a flash test. With bypass link 40 applied, impedances Z2 and Z3 are connected in parallel with resulting shunt impedance $Z_T$ given in Eq. 1.

$$Z_T = \frac{Z2 \times Z3}{Z2 + Z3} \qquad \text{Eq. 1}$$

Where impedances Z2 and Z3 are both high in value, ZT will have an insignificant effect upon a flash test of photovoltaic panel 10.

Figure 4:
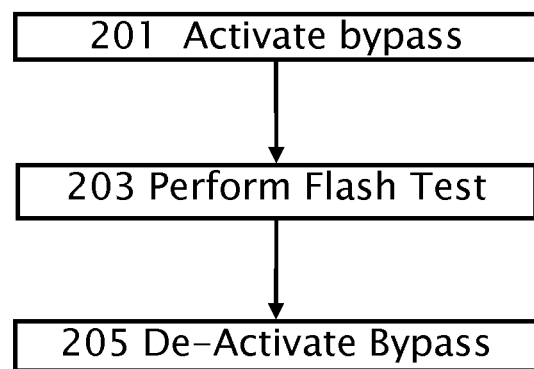
FIG. 4 shows a flow chart of a method to flash test a photovoltaic panel according to an embodiment of the present invention.
Figure 5:
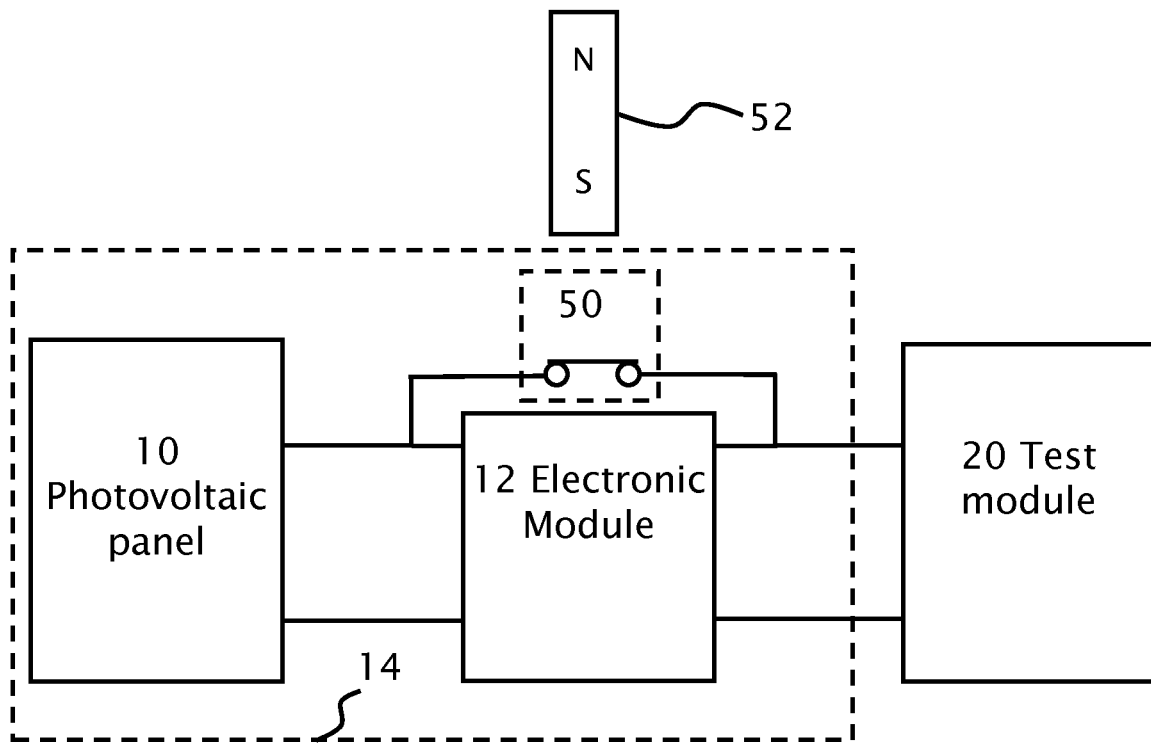
FIG. 5 is an activated bypass circuit, according to an embodiment of the present invention, of an electronic module connected to a photovoltaic panel and test module.
Figure 6:
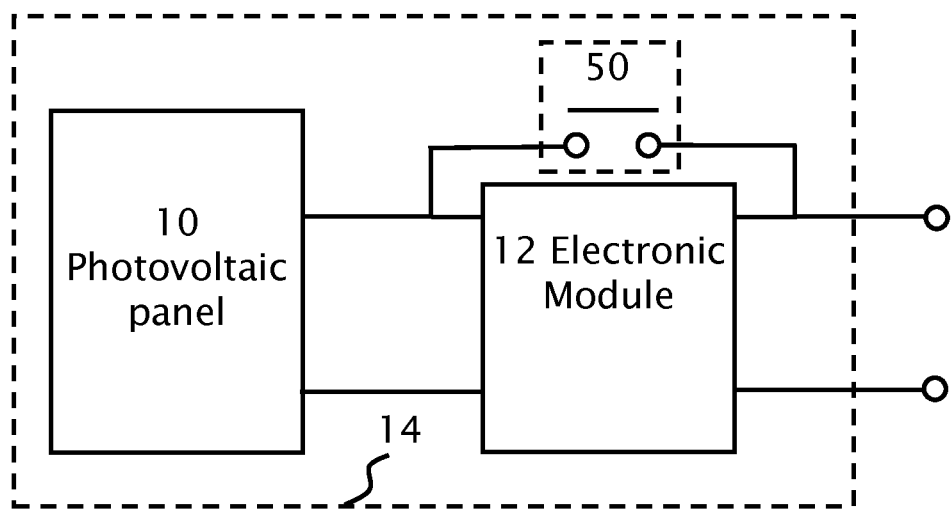
FIG. 6 is a de-activated bypass circuit, according to an embodiment of the present invention of an electronic module connected to a photovoltaic panel.

Reference is made to FIGS. 4, 5 and 6 which illustrate embodiments of the present invention. FIG. 4 illustrates a flowchart for a method for flash testing a photovoltaic panel 10 by bypassing an electronic module 12 according to embodiments of the present invention. FIGS. 5 and 6 are corresponding system drawings according to embodiments of the present invention of electrical power generation system 14. FIG. 5 illustrates bypass 40 when bypass 40 is activated. With reference to FIG. 5, a single pole single throw (SPST) switch 50 activated by magnetic field of magnet 52 connects the output of photovoltaic panel 10 and the input of test module 20 to bypass electronic module 12 during a flash test of photovoltaic panel 10. SPST switch 50 in an embodiment of the present invention is a reed switch (for example, Part no: HYR 2031-1, Aleph America Corporation NV USA) or a reed relay, or a solid state switch. Bypass 40 of electronic module 12 is activated (step 201) by applying a magnetic field 52 to SPST switch 50 causing SPST switch 50 to close as shown in FIG. 5. The flash test is performed (step 203) using flash test module 20. After the flash test of photovoltaic panel 10, bypass 40 of electronic module 12 is de-activated by the removal of magnetic field 52 to SPST switch 50 (step 205). FIG. 6 illustrates photovoltaic panel 10 connected to the input of electronic module 12, with SPST switch 50 bypass de-activated (step 205).

Figure 7:
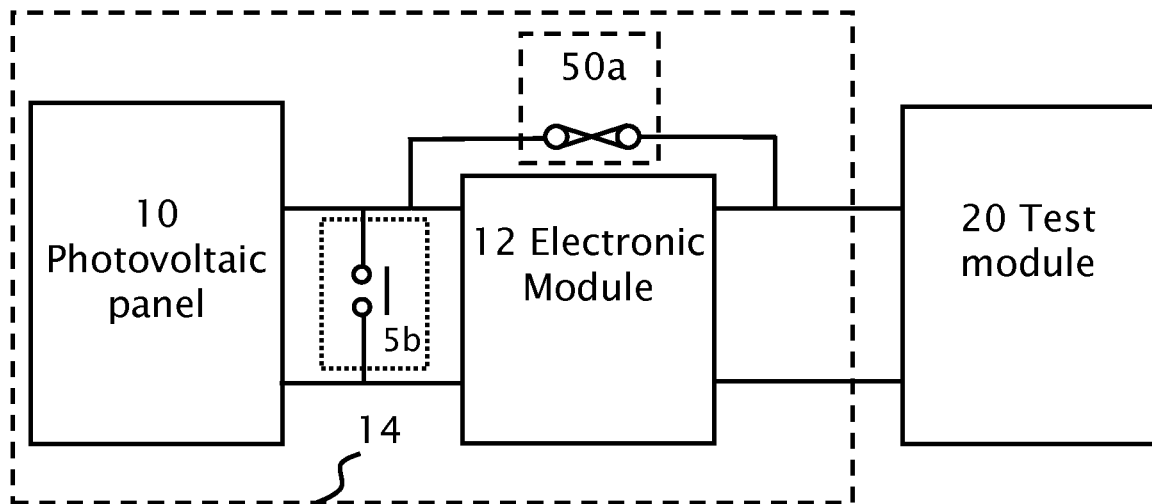
FIG. 7 is an activated bypass circuit, according to another embodiment of the present invention, of an electronic module connected to a photovoltaic panel and test module.
Figure 8:
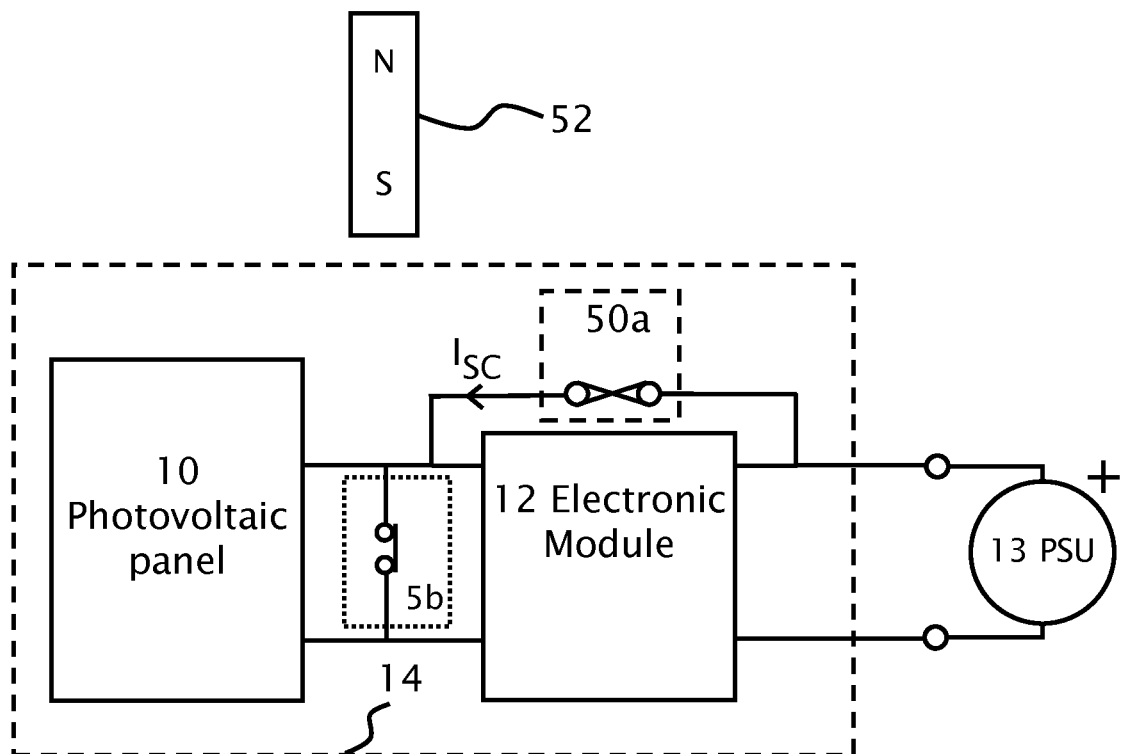
FIG. 8 is a de-activated bypass circuit, according to another embodiment of the present invention of an electronic module connected to a photovoltaic panel.

Reference is made to FIGS. 7 and 8 which illustrate another embodiment of the present invention. FIG. 7 illustrates bypass 40. With reference to FIG. 7, a fuse 50a connects the output of photovoltaic panel 10 and the input of test module 20 to bypass electronic module 12 during a flash test of photovoltaic panel 10. Referring back to FIG. 4, bypass 40 of electronic module 12 is activated (step 201) by virtue of fuse 50a being in an un-blown state as shown in FIG. 7 and SPST switch 5b being open circuit. SPST switch 5b in an embodiment of the present invention is a reed switch (for example, Part no: HYR 2031-1, Aleph America Corporation NV USA) or a reed relay, or a solid state switch. The flash test is performed (step 203) using flash test module 20. After the flash test of photovoltaic panel 10, bypass 40 of electronic module 12 is de-activated (step 205). FIG. 8 shows bypass 40 being de-activated (step 205). FIG. 8 shows photovoltaic panel 10 connected to the input of electronic module 12 and a power supply unit (PSU) 13 applied across the output of electronic module 12. SPST switch 5b is in a closed position because of the application of magnetic field 52.

Figure 11:
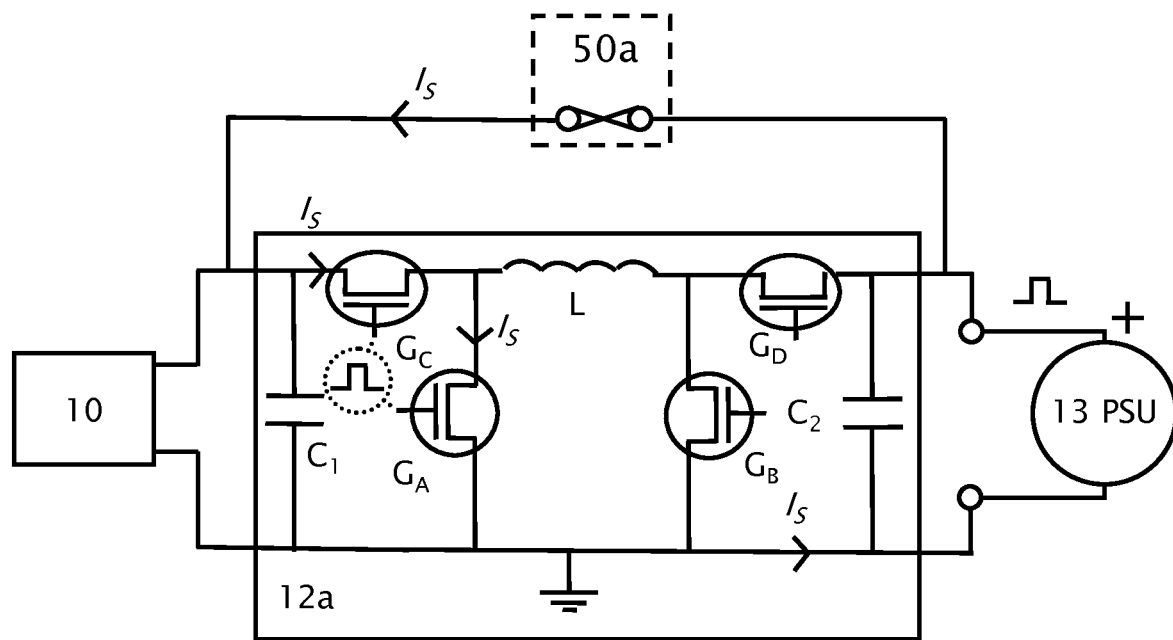
FIG. 11 illustrates yet another way in which to de-activate bypass once a flash test has been performed according to a feature of the present invention.

Reference now made to FIG. 11 which illustrates yet another way in which to deactivate bypass 40 (step 205) once a flash test has been performed (step 203) according to a feature of the present invention. Photovoltaic panel 10 is connected to the input of buck boost converter 12a. The output of buck boost converter 12a is connected to PSU 13. During deactivation of bypass 40 (step 205), a power line communication superimposed on the output of buck boost converter 12a via PSU 13, a wireless signal applied in the vicinity of buck boost converter 12a, or based on some logic circuitry—i.e. a specific supply voltage applied by PSU 13 causes MOSFETS $G_C$ and $G_A$ to turn on. MOSFETS $G_C$ and $G_A$ turned on causes a short circuit current $I_{SC}$ to flow from PSU 13 and through fuse 50a. The short circuit $I_{SC}$ current blows fuse 50a making fuse 50a open circuit and bypass 40 is de-activated (step 205).

The closure of SPST switch 5b and application of PSU 13 applied across the output of electronic module 12, causes a short circuit current $I_{SC}$ to flow from PSU 13 through fuse 50a and SPST switch 5b. The short circuit $I_{SC}$ current blows fuse 50a making fuse 50a open circuit and the removal of magnetic field 52 de-activates bypass 40 (step 205).

Figure 8A:
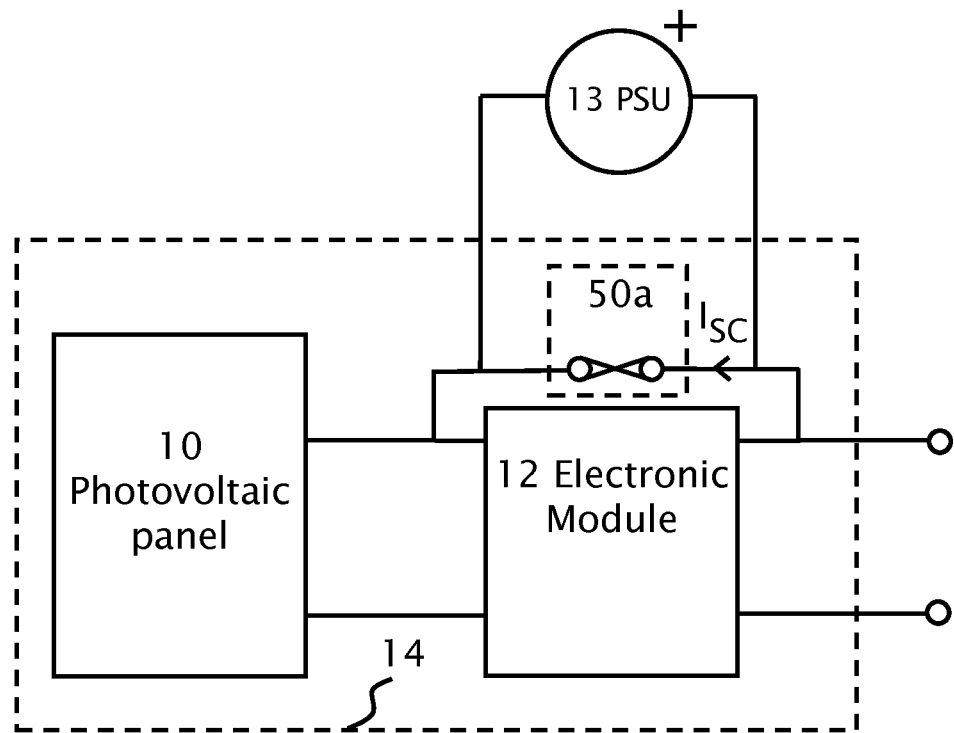
FIG. 8a is a de-activated bypass circuit using a fuse and power supply, according to another embodiment of the present invention of an electronic module connected to a photovoltaic panel.

An alternative way of de-activating bypass 40 (step 205) is shown in FIG. 8a. FIG. 8a shows photovoltaic panel 10 connected to the input of electronic module 12 and a power supply unit (PSU) 13 applied across fuse 50a. The application of PSU 13 across fuse 50a, causes a short circuit current $I_{SC}$ to flow from PSU 13 and through fuse 50a. The short circuit $I_{SC}$ current blows fuse 50a making fuse 50a open circuit and bypass 40 is de-activated (step 205).

Figure 8B:
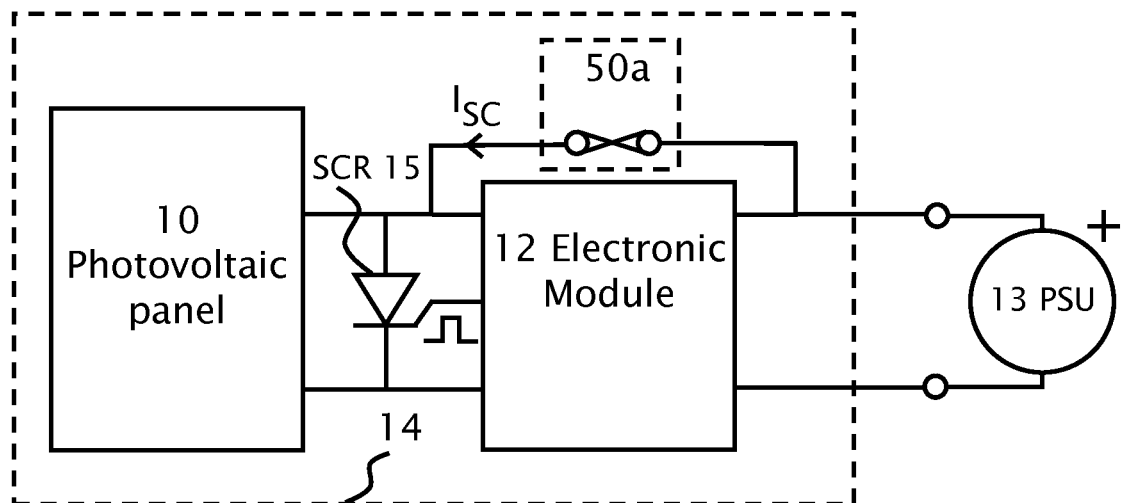
FIG. 8b is a de-activated bypass circuit using a fuse, power supply and silicone controlled rectifier (SCR), according to yet another embodiment of the present invention of an electronic module connected to a photovoltaic panel.

Another way of de-activating bypass 40 (step 205) is shown in FIG. 8b. FIG. 8b shows photovoltaic panel 10 connected to the input of electronic module 12 and a power supply unit (PSU) 13 applied across the output of electronic module 12. The anode and cathode of a silicon controlled rectifier (SCR) 15 is connected in parallel across the output of photovoltaic panel 10 and the input of electronic module 12. The gate of an SCR 15 is connected inside electronic module 12 in such a way that the application of PSU 13 across the output of electronic module 12 causes a gate signal to be applied to the gate of SCR. A gate pulse applied to SCR 15 switches SCR 15 on. Alternative ways to get a pulse to the gate of SCR 15 include, power line communication superimposed on the output of electronic module 12 via PSU 13, a wireless signal applied in the vicinity of electronic module 12, or based on some logic circuitry—i.e. a specific supply voltage applied by PSU 13 causes a gate signal to be applied to SCR 15. A gate signal applied to SCR 15 and application of PSU 13 applied across the output of electronic module 12, causes a short circuit current $I_{SC}$ to flow from PSU 13 through fuse 50a and SCR 15. The short circuit $I_{SC}$ current blows fuse 50a making fuse 50a open circuit and bypass 40 is de-activated (step 205).

Figure 9:
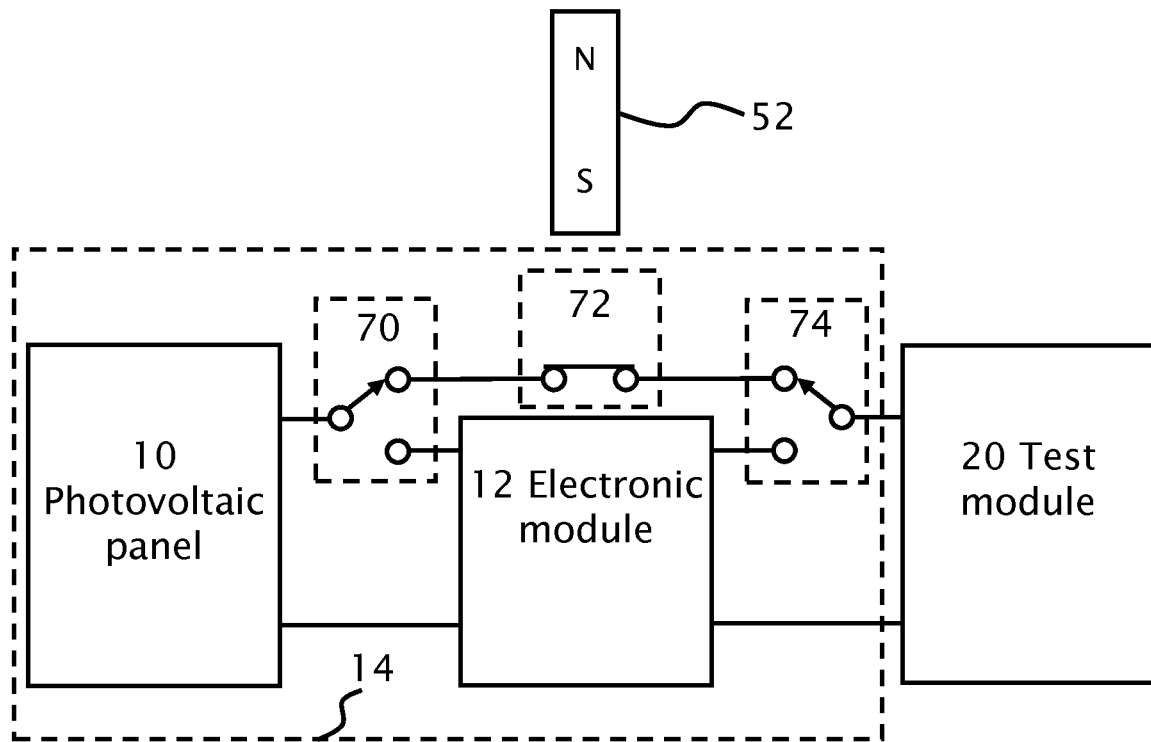
FIG. 9 is an activated bypass circuit, according to yet another embodiment of the present invention, of an electronic module connected to a photovoltaic panel and test module.
Figure 10:
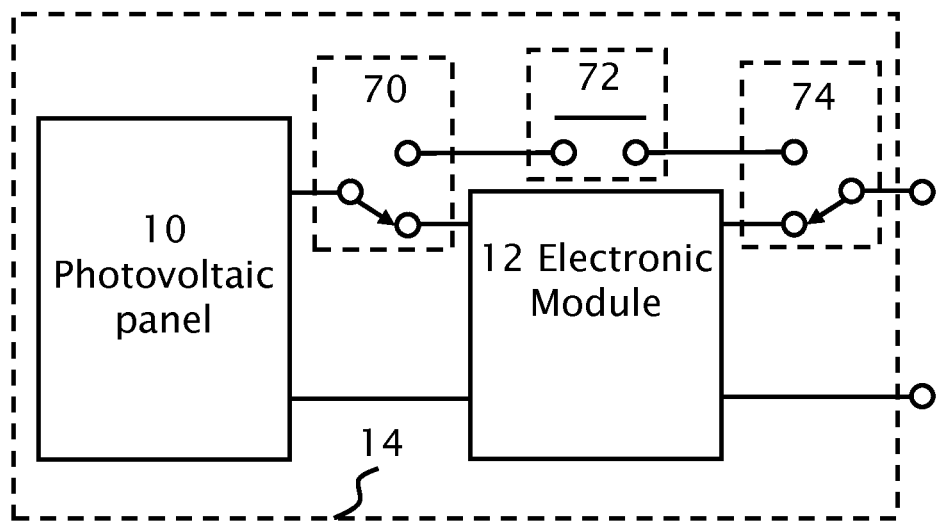
FIG. 10 is a de-activated bypass circuit, according to yet another embodiment of the present invention of an electronic module connected to a photovoltaic panel.

Reference is now made to FIGS. 4, 9 and 10 which illustrate another embodiment of the present invention of electrical power generation system 14, particularly applicable in cases when the resulting shunt impedance $Z_T$ is small enough to disrupt the results of the flash test, such as being less than 1 Mega Ohm in electronic module 12. Referring back to FIG. 4, FIG. 4 illustrates a flowchart for a method for flash testing a photovoltaic panel 10 by bypassing an electronic module 12 according to embodiments of the present invention. FIG. 4 includes step 201 of activating a bypass, step 203 performing the flash and de-activating the bypass, step 205.

FIG. 9 illustrates bypass 40 when bypass 40 is activated. With reference to FIG. 9, a single pole double throw (SPDT) switch 70, SPST switch 72 and SPDT switch 74, activated by magnetic field of magnet 52, connects the output of photovoltaic panel 10 and the input of test module 20 to perform the function of bypassing electronic module 12 during a flash test of photovoltaic panel 10. SPDT switches 70 and 74 in an embodiment of the present invention is a reed switch (for example, Part no: HYR-1555-form-C, Aleph America Corporation Reno, Nev. USA) or a reed relay, or a solid state switch. SPDT switches 70 and 74 when activated by magnetic field 52 provide open circuit impedance in place of shunt impedance $Z_T$ when electronic module 12 is being bypassed during a flash test of photovoltaic panel 10. The bypass 40 of electronic module 12 is activated (step 201) by applying a magnetic field 52 to SPST switch 72 and SPDT switches 70 and 74 causing switch positions shown in FIG. 9. Next the flash test is performed (step 203) using flash test module 20. After the flash test of photovoltaic panel 10, the bypass of electronic module 12 is de-activated by the removal of magnetic field 52 to SPST switch 50 and SPDT switches 70 and 74 (step 205). FIG. 10 shows photovoltaic panel 10 connected to electronic module 12 with SPST switch 50 and SPDT switches 70 and 74 de-activated (step 205).

During operation of electrical power generation system 14, DC power is produced by photovoltaic panel 10 and transferred to the input of electronic module 12. Electronic module 12 is typically a buck-boost converter circuit to perform DC to DC conversion or an inverter converting DC to AC or a circuit performing maximum power point tracking (MPPT).

Figure 12A:
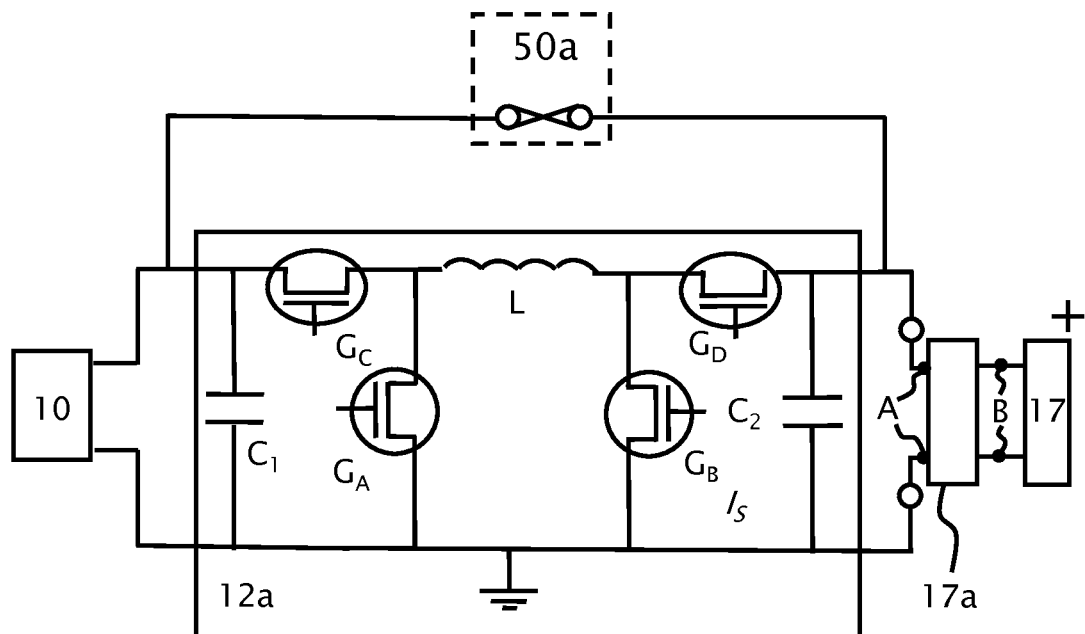
FIG. 12a shows a module connected to a compensation unit according to a feature of the present invention.

Reference is now made to FIG. 12a which shows a module 12a connected to compensation unit 17a according to a feature of the present invention. Photovoltaic panel 10 is connected to the input of buck boost converter 12a. The output of buck boost converter 12a is connected to compensation unit 17a at terminals A and the other terminals B of unit 17a is connected to conventional flash tester 17. Fuse 50a provides a low impedance serial path between panel 10 and conventional flash tester 17/compensation unit 17a. With bypass link 50a applied (i.e. fuse link 50a is not blown), the shunt impedance ($Z_T$) of circuit 12a connected to conventional flash tester 17/compensation unit 17a comes from capacitors C1 and C2 now connected in parallel in circuit 12a via link 50a. If the total value of capacitance (C1+C2) is large (typically around 50 micro-farads), the low shunt impedance $Z_T$ may have a significant effect on the result of a flash test performed by tester 17 on panels 10.

Figure 12B:
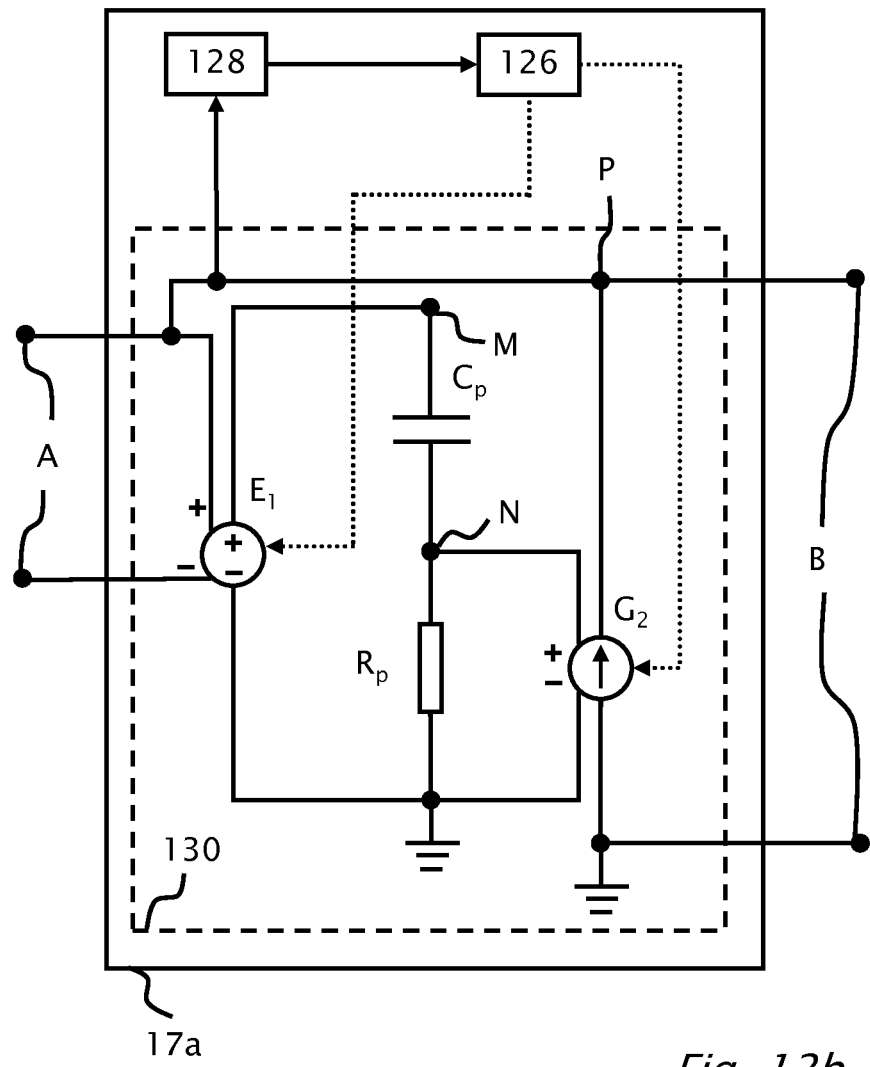
FIG. 12b shows further details of the compensation unit shown in FIG. 12a, according to a feature of the present invention.

Reference now made to FIG. 12b which shows further details of compensation unit 17a according to a feature of the present invention. Compensation unit 17a has a programmable current injector 130, circuit analyzer 128 and processor 126.

Programmable current injector 130 has a voltage source E1 which may be connected to an electronic module 12/12a using terminals A. A first positive terminal of voltage source E1 and a first negative terminal of voltage source E1 provides terminals A. The first positive terminal of voltage source E1 is connected to node P. A second positive terminal and a second negative terminal of voltage source E1 is connected across a series connection of capacitor $C_p$ and resistance $R_p$ at node M and ground. One end of capacitor $C_p$ connects to node M and the other end of capacitor $C_p$ connects to one end of resistor $R_p$ at node N. The other end of resistor $R_p$ connects to ground. A first positive terminal of current source $G_2$ connects to node P and a first negative terminal of current source G2 connects to ground. Terminals B are provided from connecting to node P and ground. A second positive terminal of current source $G_2$ connects to node N and a second negative terminal of current source $G_2$ connects to ground.

The input to circuit analyzer 128 is derived from node P. The output of circuit analyzer 128 goes into the input of processor 126. Processor 126 has two outputs (shown by dotted lines) which program/control current source G2 and voltage source E1. Circuit analyzer 128 measures a circuit parameter of electronic module 12/12a. The circuit parameter measured by circuit analyzer 128 is preferably the shunt impedance of electronic module 12/12a. Processor 126 is preferably configured to program/control current injector 130 using the circuit parameter measured by circuit analyzer 128.

Figure 12C:
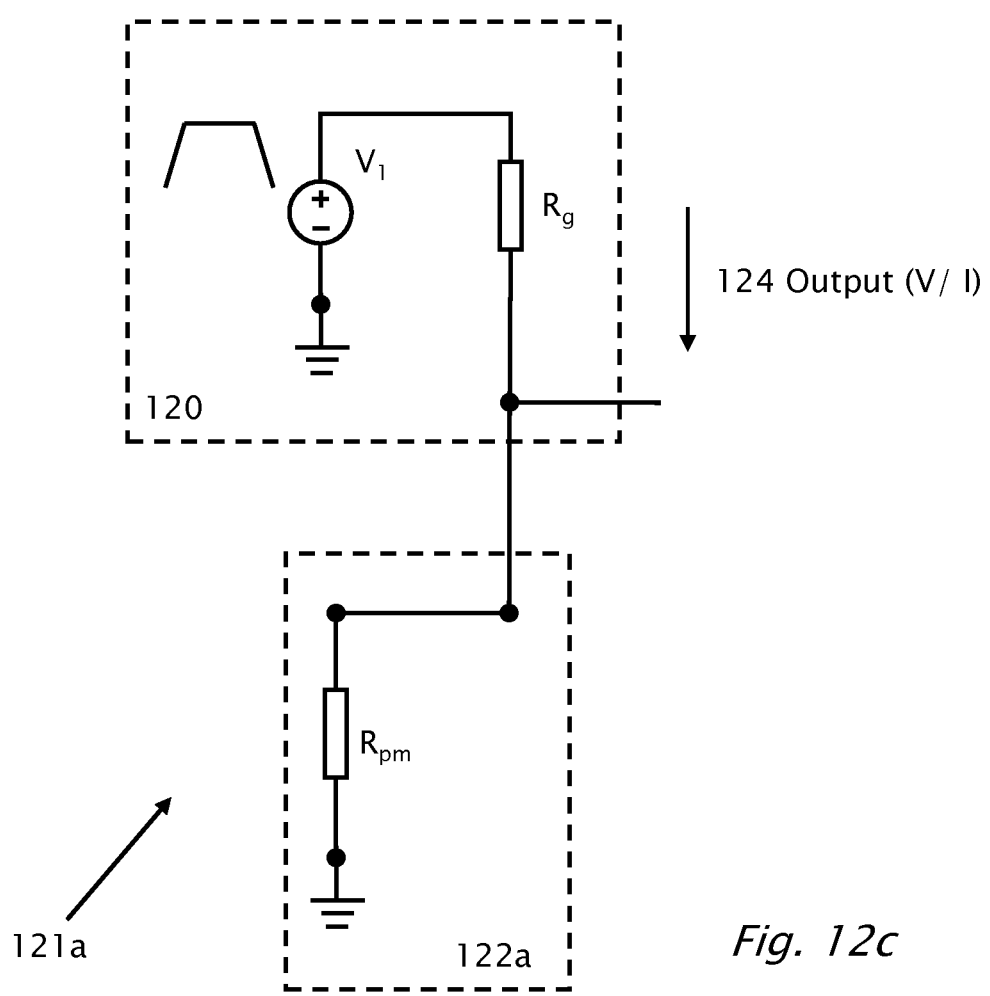
FIG. 12c shows a simulation circuit, according to a feature of the present invention.
Figure 12D:
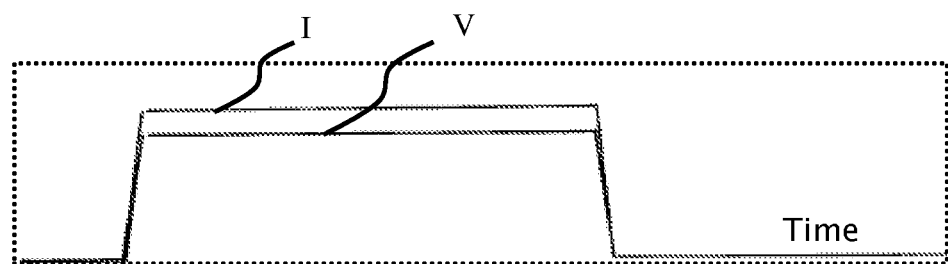
FIG. 12d shows simulation results of a test circuit shown in FIG. 12c, according to a feature of the present invention.

Reference is now made to FIG. 12c and to FIG. 12d according to a feature of the present invention. FIG. 12c shows a simulation circuit 121a which has a pulse generator 120 with an output voltage and current 124 connected to a test circuit 122a. Simulation circuit 121 is an equivalent circuit representation of a flash testing system. Pulse generator 120 is the equivalent circuit representation of a flash lamp 16 used to irradiate a photovoltaic panel 10 and test circuit 122a being the equivalent circuit representation of a photovoltaic panel 10. Pulse generator 120 has a voltage V1 which is a pulse of typically 33 volts peak, rise and fall time of 0.01 milliseconds and pulse duration of 0.54 milliseconds. The pulse from voltage V1 is applied to test circuit 122a via resistor $R_g$ which is connected in series between voltage V1 and test circuit 122a. Test circuit 122a has a resistance Rpm which is connected in series between the output of pulse generator 120 and ground. FIG. 12d shows the simulation results of test circuit 122a as output voltage and current 124 as a result of pulse V1 being applied to test circuit 122a. Output voltage and current 124 has a peak voltage of 27V and current of 5.4 A which are in phase.

Figure 12E:
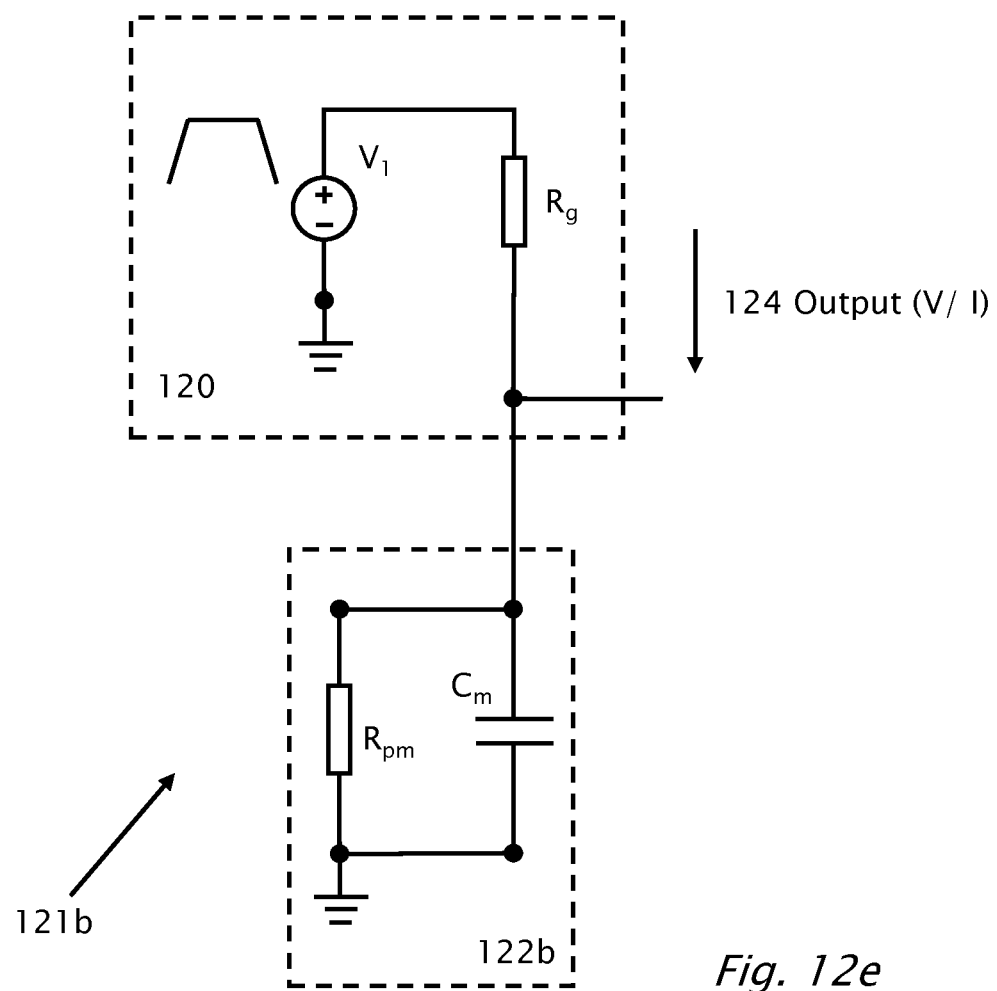
FIG. 12e shows another simulation circuit, according to a feature of the present invention.
Figure 12F:
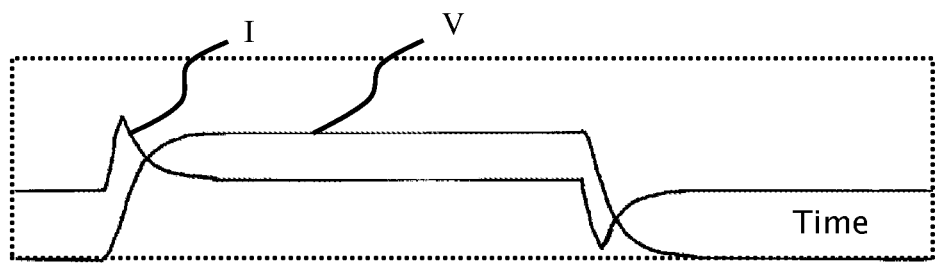
FIG. 12f shows the simulation results a test circuit shown in FIG. 12e, according to a feature of the present invention.

Reference is now made to FIG. 12e and to FIG. 12f according to a feature of the present invention. FIG. 12e shows a simulation circuit 121b which has a pulse generator 120 with an output voltage and current 124 connected to a test circuit 122b. Simulation circuit 121b has the same elements as shown in FIG. 12b but with the addition of a capacitor $C_m$ connected in parallel with resistor $R_{pm}$ in test circuit 122b. Capacitor $C_m$ in test circuit 122b represents the total shunt capacitance for example of module 12a connected to panel 10. FIG. 12f shows the simulation results of test circuit 122a as output voltage and current 124 of test circuit 122b as a result of pulse V1 (33 volts peak, rise and fall time of 0.01 milliseconds and pulse duration of 0.54 milliseconds) being applied to test circuit 122b. Output voltage and current 124 are now not in phase with voltage (27V) lagging and current peaks which reach 40 A.

Figure 12G:
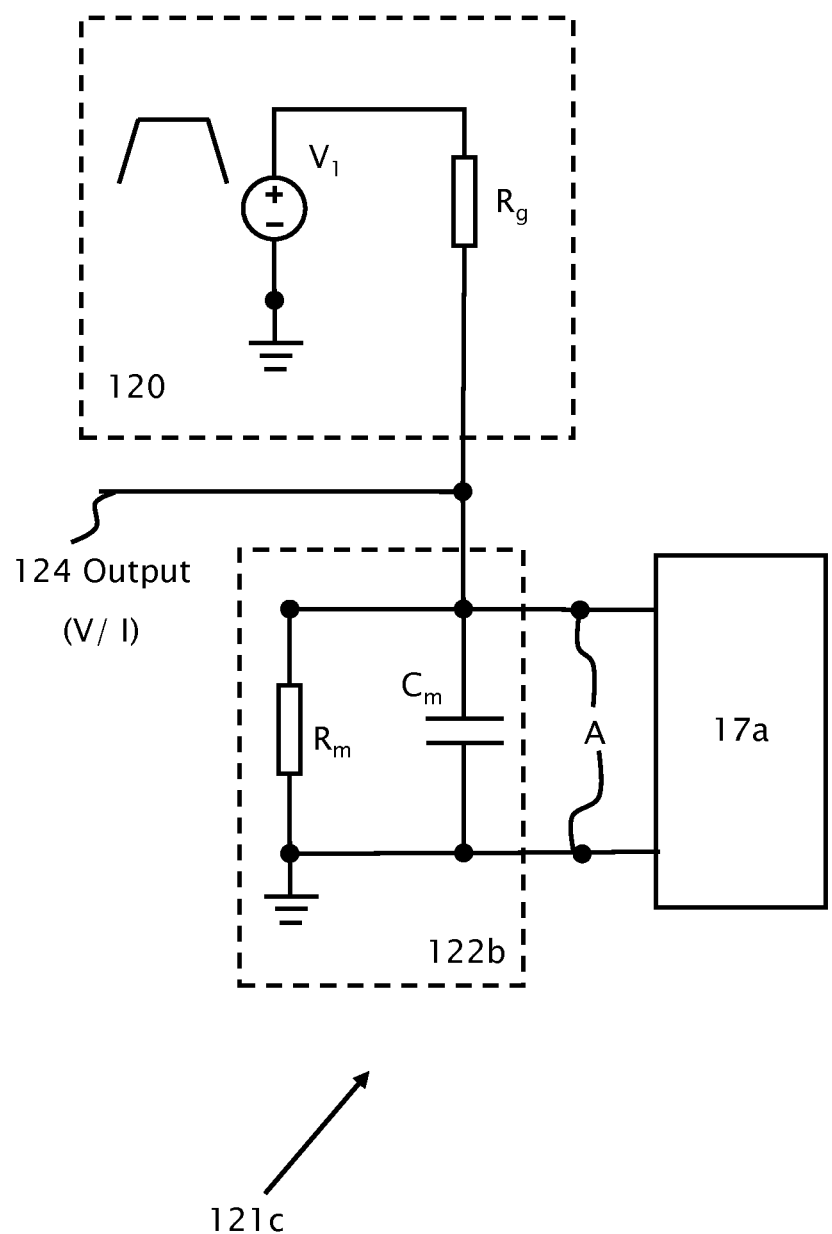
FIG. 12g shows a simulation circuit, according to a feature of the present invention.
Figure 12H:
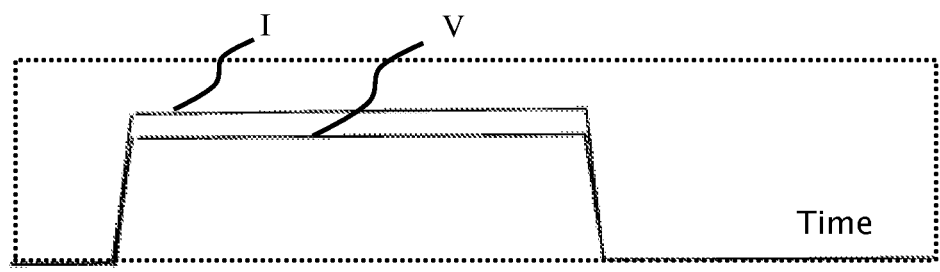
FIG. 12h shows the compensated simulation results of a test circuit, according to a feature of the present invention.
Figure 12I:
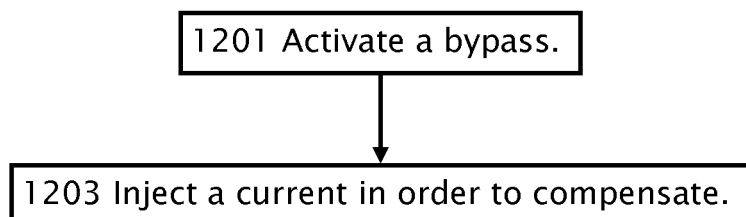
FIG. 12i which shows a method, according to a feature of the present invention.
Figure 12I:
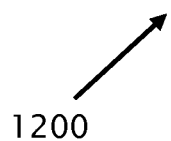

Reference is now made to FIG. 12g, FIG. 12h and FIG. 12i according to a feature of the present invention. FIG. 12g shows a simulation circuit 121c which has a pulse generator 120 with an output voltage and current 124 connected to a test circuit 122b. Simulation circuit 121c has the same elements as shown in FIG. 12e but with the addition of compensation unit 17a connected in parallel with capacitor $C_m$ in test circuit 122b. Capacitance $C_m$ represents the total shunt capacitance for example of module 12a connected to panel 10 with bypass 50a activated as an un-blown fuse link (step 1201). In compensation unit 17a, circuit analyzer 128 measures a circuit parameter of test module 122b. The circuit parameter measured by circuit analyzer 128 is preferably the shunt impedance of test module 122b or the shunt capacitance of test module 122b. Processor 126 is preferably configured to program/control current injector 130 using the circuit parameter measured by circuit analyzer 128. Compensation unit 17a can inject a current into test module 122b in order to compensate for the shunt capacitance of test module 122b (step 1203) when performing a flash test. FIG. 12h shows the compensated output voltage and current 124 of test circuit 122b as a result of pulse V1 (33 volts peak, rise and fall time of 0.01 milliseconds and pulse duration of 0.54 milliseconds) being applied to test circuit 122b. Output voltage and current 124 are now in phase and output voltage and current 124 represents the current/voltage characteristics of resistance Rpm in test circuit 122b.

Figure 12J:
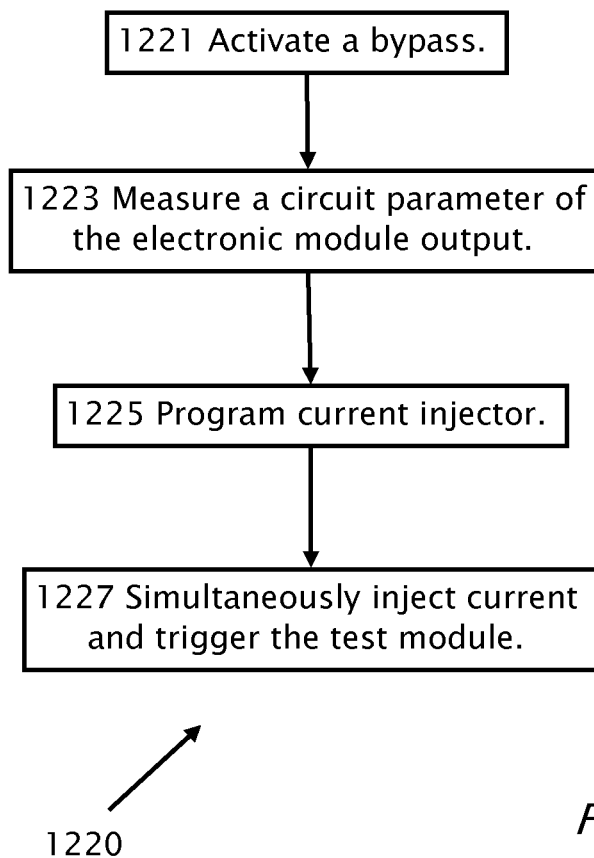
FIG. 12j which shows a method, according to a feature of the present invention.

Reference is now made again to FIGS. 12a, 12b and to FIG. 12j which shows a method 1220, according to an embodiment of the present invention. With link 50a activated as an un-blown fuse link (step 1201) a low impedance path exists between the input and the output of module 12a. Prior to a flash test of panel 10 using tester 17, located in compensation unit 17a, is circuit analyzer 128 which measures (step 1223) a circuit parameter of the output of electronic module 12a with the input of module 12a connected to pane 110. The circuit parameter measured by circuit analyzer 128 with fuse link 50a connected according to step 1221 may be the impedance of capacitors C1 and C2 in parallel with panel 10 and with flash tester 17 disconnected. Alternatively, the value of shunt impedance for module 12a may be measured (to provide a noted value) prior to attachment to panel 10. Processor 126 is preferably configured to program (step 1225) and/or control current injector 130 using the circuit parameter measured by circuit analyzer 128 or from the noted value. With flash tester 17 operatively attached to compensation unit 17a, module 12a and panel 10, a flash test is performed where the current injection by compensation unit 17a simultaneously triggers (step 1227) a flash test of a panel using tester 17.

The definite articles "a", "an" is used herein, such as "a converter", "a switch" have the meaning of "one or more" that is "one or more converters" or "one or more switches".

Although selected embodiments of the present invention have been shown and described, it is to be understood the present invention is not limited to the described embodiments. Instead, it is to be appreciated that changes may be made to these embodiments without departing from the principles and spirit of the invention, the scope of which is defined by the claims and the equivalents thereof.

The invention claimed is:

1. A system comprising:
a photovoltaic (PV) panel comprising a PV positive output terminal and a PV negative output terminal;
a buck boost converter comprising a positive input terminal, a negative input terminal, a positive output terminal, and a negative output terminal, wherein the PV positive output terminal and the PV negative output terminal are respectively connected to the positive input terminal of the buck boost converter and the negative input terminal of the buck boost converter; and
a bypass link directly connected between the positive input terminal of the buck boost converter and the positive output terminal of the buck boost converter, the bypass link comprising a first switch,
wherein the first switch comprises an activated state and a deactivated state, and
wherein, when the first switch is in the activated state, the bypass link provides a low impedance path between the PV positive output terminal and the postive output terminal of the buck boost converter.

2. The system of claim 1 wherein the first switch is a solid state switch.

3. The system of claim 1 wherein the buck boost converter is configured to convert power received from the positive PV output terminal and the negative PV output terminal of the PV panel.

4. The system of claim 1 wherein the first switch is configured to be activated based on a malfunction in the buck boost converter.

5. The system of claim 1 wherein the bypass link further comprises one or more switches serially connected to the first switch.

6. The system of claim 1 wherein the first switch is activated by applying an electromagnetic signal.

7. The system of claim 1 wherein the bypass link is activated in response to a communication signal.

8. An apparatus comprising:
a buck boost converter comprising a positive input terminal a negative input terminal, a positive output terminal, and a negative output terminal wherein the buck boost converter is configured to convert power from the positive input terminal and the negative input terminal to the positive output terminal and the negative output terminal; and
a bypass link directly coupled between the positive input terminal of the buck boost converter and the positive output terminal of the buck boost converter, the bypass link comprising a first switch, wherein the first switch comprises an activated state and a deactivated state,
wherein when the first switch is activated, the bypass link provides a low impedance path between the positive input terminal and the positive output termial.

9. The apparatus of claim 8 wherein the first switch is activated responsive to an electronic malfunction in the buck boost converter.

10. The apparatus of claim 8 wherein the buck boost converter is connected to a photovoltaic panel.

11. The apparatus of claim 8 wherein the first switch is a solid state switch.

12. The apparatus of claim 8 wherein the bypass link further comprises one or more switches serially connected to the first switch.

13. The apparatus of claim 8 wherein the bypass link is activated by applying a signal.

14. The apparatus of claim 8 wherein the bypass link is activated in response to a communication signal.

15. A method comprising:
harvesting power from a photovoltaic panel;
converting the harvested power from a positive input terminal of a buck boost converter and a negative input terminal of the buck boost converter to a positive output terminal of the buck boost converter and a negative output terminal of the buck boost converter; and
bypassing the buck boost converter by activating a switch of a bypass link, wherein the bypass link is directly coupled between the positive input terminal of the buck boost converter and the positive output terminal of the buck boost converter, and wherein the activating the switch of the bypass link provides a low impedance path between the positive input terminal of the buck boost converter and the positive output terminal of the buck boost converter.

16. The method of claim 15 wherein the switch is activated responsive to an electronic malfunction of the buck boost converter.

17. The method of claim 16 further comprising deactivating the switch.

18. The method according to claim 17 wherein the deactivating comprises communicating with the buck boost converter.

19. The method of claim 17 wherein the deactivating comprises opening the switch.

20. The method of claim 15 wherein the switch is activated responsive to a communication signal.

\* \* \* \* \*